United States Patent
Sakama et al.

(10) Patent No.: US 7,166,899 B2
(45) Date of Patent: Jan. 23, 2007

(54) SEMICONDUCTOR DEVICE, AND METHOD OF FABRICATING THE SAME

(75) Inventors: Mitsunori Sakama, Kanagawa (JP); Noriko Ishimaru, Kanagawa (JP); Taketomi Asami, Kanagawa (JP); Shunpei Yamazaki, Tokyo (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 11/181,788

(22) Filed: Jul. 15, 2005

(65) Prior Publication Data

US 2005/0263835 A1    Dec. 1, 2005

Related U.S. Application Data

(62) Division of application No. 10/337,724, filed on Jan. 8, 2003, now Pat. No. 6,919,282, which is a division of application No. 09/703,593, filed on Nov. 2, 2000, now Pat. No. 6,521,912.

(30) Foreign Application Priority Data

Nov. 5, 1999   (JP)   ................... 11-316129

(51) Int. Cl.
   *H01L 29/94*   (2006.01)
   *H01L 31/062*   (2006.01)

(52) U.S. Cl. ................ 257/411; 257/639; 257/E21.267

(58) Field of Classification Search ................ 257/411, 257/469, E21.267
See application file for complete search history.

(56) References Cited

U.S. PATENT DOCUMENTS 3,765,935 A   10/1973   Rand et al.
5,274,602 A   12/1993   Glenn (Continued)

FOREIGN PATENT DOCUMENTS

JP   04-369271   12/1992

(Continued)

OTHER PUBLICATIONS

Jiun-Lin Yeh et al., "Structural and optical properties of amorphous silicon oxynitride," J. Appl. Phys. vol. 79, No. 2, Jan. 15, 1996, pp. 656-663.

(Continued)

*Primary Examiner*—W. David Coleman
(74) *Attorney, Agent, or Firm*—Eric J. Robinson; Robinson Intellectual Property Law Office, P.C.

(57) ABSTRACT

A silicon oxynitride film is manufactured using $SiH_4$, $N_2O$ and $H_2$ by plasma CVD, and it is applied to the gate insulating film (1004 in FIG. 1A) of a TFT. The characteristics of the silicon oxynitride film are controlled chiefly by changing the flow rates of $N_2O$ and $H_2$. A hydrogen concentration and a nitrogen concentration in the film can be increased by the increase of the flow rate of $H_2$. Besides, the hydrogen concentration and the nitrogen concentration in the film can be decreased, to heighten an oxygen concentration by the increase of the flow rate of $N_2O$. The gate insulating film ensures the stability and reliability of the characteristics of the TFT, such as the threshold voltage ($V_{th}$) and sub-threshold constant (S value) thereof.

18 Claims, 29 Drawing Sheets

U.S. PATENT DOCUMENTS

| | | | |
|---|---|---|---|
| 5,323,042 A | | 6/1994 | Matsumoto |
| 5,407,870 A | * | 4/1995 | Okada et al. ............... 438/591 |
| 5,504,020 A | | 4/1996 | Aomori et al. |
| 5,594,569 A | | 1/1997 | Konuma et al. |
| 5,640,067 A | | 6/1997 | Yamauchi et al. |
| 5,643,826 A | | 7/1997 | Ohtani et al. |
| 5,897,328 A | | 4/1999 | Yamauchi et al. |
| 5,923,962 A | | 7/1999 | Ohtani et al. |
| 5,969,397 A | * | 10/1999 | Grider et al. ............... 257/410 |
| 5,970,384 A | | 10/1999 | Yamazaki et al. |
| 5,972,437 A | | 10/1999 | Ohori et al. |
| 6,166,414 A | | 12/2000 | Miyazaki et al. |
| 6,174,816 B1 | | 1/2001 | Yin et al. |
| 6,198,133 B1 | | 3/2001 | Yamazaki et al. |
| 6,281,552 B1 | | 8/2001 | Kawasaki et al. |
| 6,285,042 B1 | | 9/2001 | Ohtani et al. |
| 6,291,363 B1 | | 9/2001 | Yin et al. |
| 6,306,694 B1 | | 10/2001 | Yamazaki et al. |
| 6,323,528 B1 | | 11/2001 | Yamazaki et al. |
| 6,335,541 B1 | | 1/2002 | Ohtani et al. |
| 6,348,420 B1 | | 2/2002 | Raaijmakers et al. |
| 6,399,988 B1 | | 6/2002 | Yamazaki |
| 6,429,483 B1 | | 8/2002 | Teramoto |
| 6,461,899 B1 | | 10/2002 | Kitakado et al. |
| 6,524,895 B1 | | 2/2003 | Yamazaki et al. |
| 6,531,713 B1 | | 3/2003 | Yamazaki |
| 6,534,826 B1 | | 3/2003 | Yamazaki |
| 6,573,195 B1 | | 6/2003 | Yamazaki et al. |
| 2001/0011725 A1 | | 8/2001 | Sakama et al. |
| 2004/0238820 A1 | | 12/2004 | Sakama |

FOREIGN PATENT DOCUMENTS

| | | |
|---|---|---|
| JP | 05-102483 | 4/1993 |
| JP | 07-130652 | 5/1995 |
| JP | 07-335900 | 12/1995 |
| JP | 08-055846 | 2/1996 |
| JP | 08-055847 | 2/1996 |
| JP | 08-055848 | 2/1996 |
| JP | 08-078329 | 3/1996 |
| JP | 10-135468 | 5/1998 |
| JP | 10-135469 | 5/1998 |
| JP | 10-247735 | 9/1998 |

OTHER PUBLICATIONS

V. J. Kapoor, "Review of Thin Oxynitride Dielectrics For Memory Device Technology,"°May 5-10, 1991, Electrochem. Soc.

Rabiller, P., et al., "Electrical Properties of PECVD $SiO_xN_{y:H}$ Prepared by Microwave Plasma," Conference Record of the 1988 IEEE International Symposium on Electrical Insulation, Boston, MA, Jun. 5-8, 1988, pp. 149-152.

V. J. Kapoor, *Review of Thin Oxynitride Dielectrics For Memory Device Technology*, J. Electrochem. Soc., vol. 138, No. 3, May 5-10, 1991, pp. 657-666.

* cited by examiner

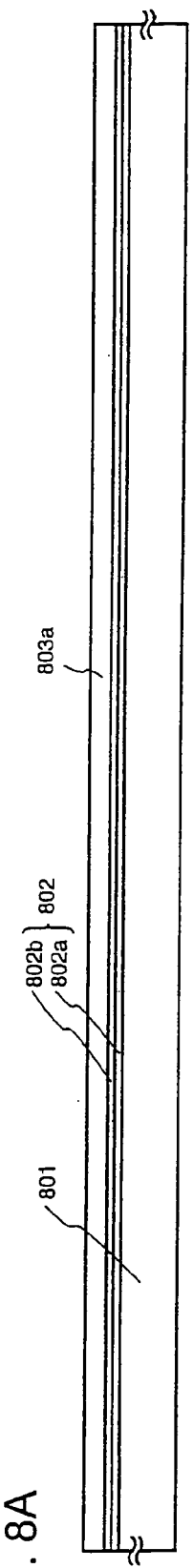
Fig. 8A
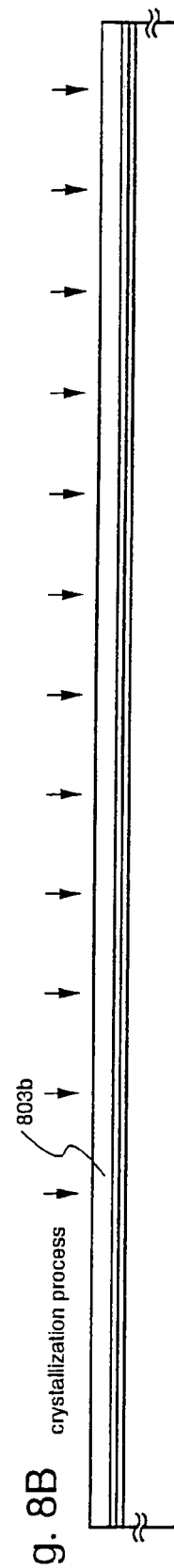
Fig. 8B crystallization process
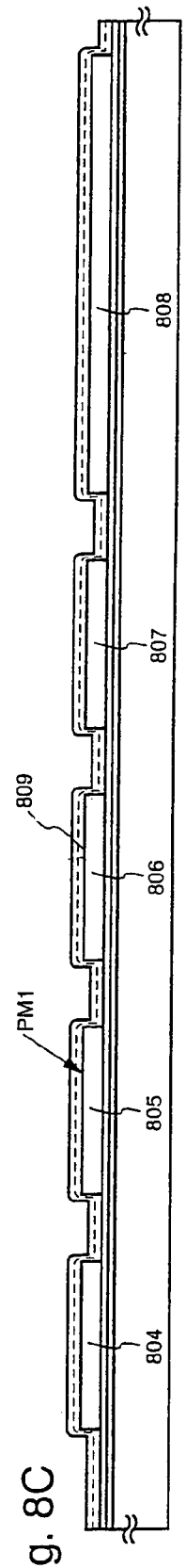
Fig. 8C
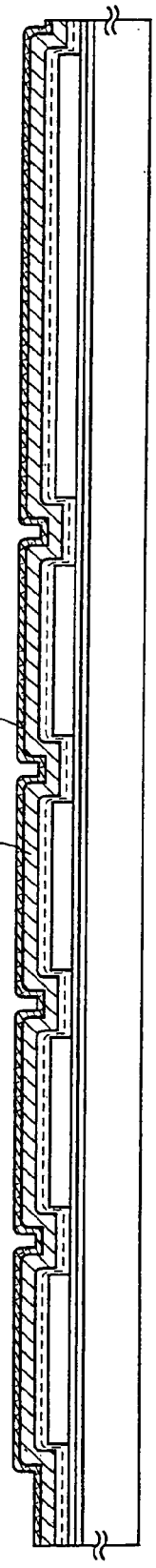
Fig. 8D

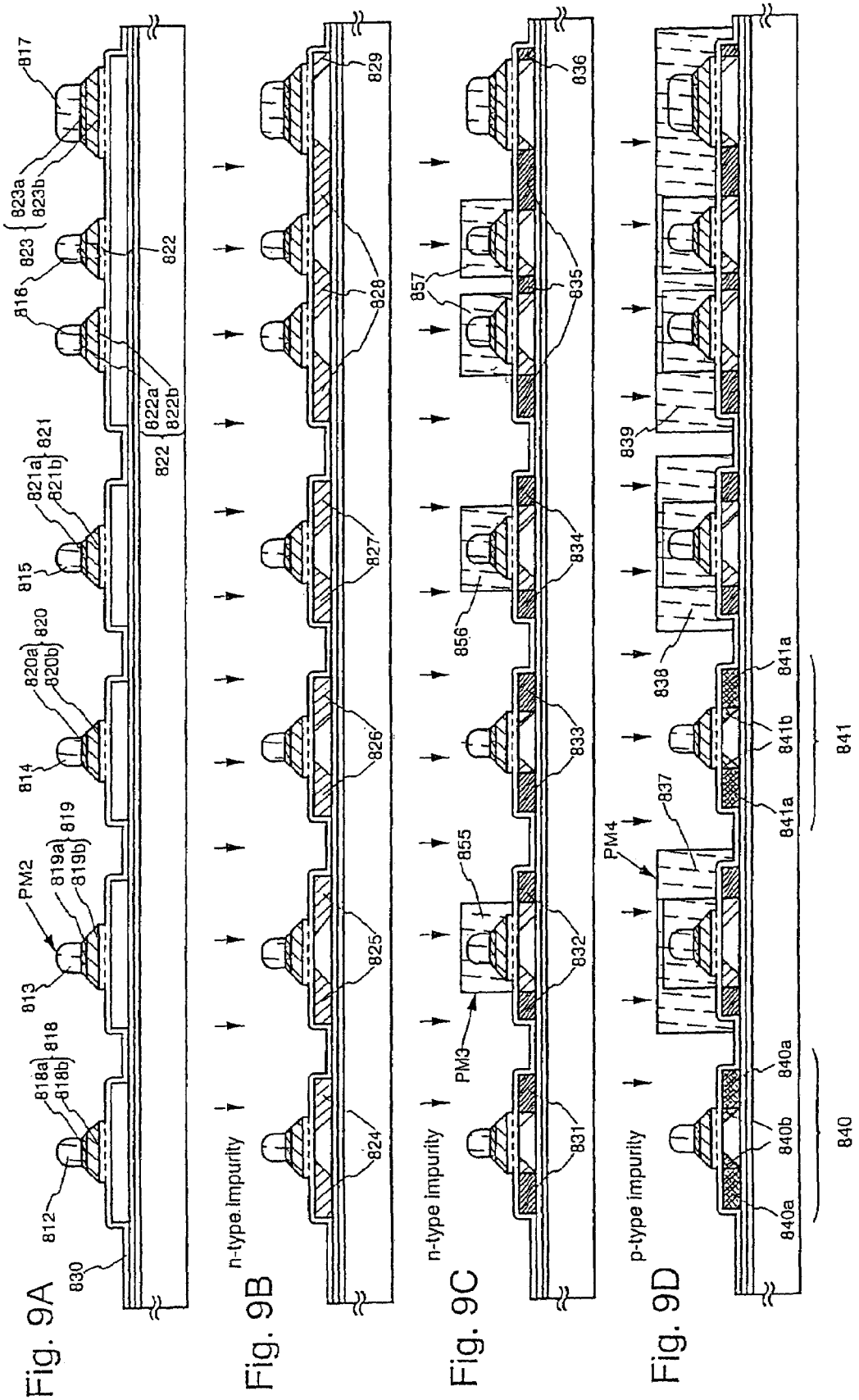

activation process

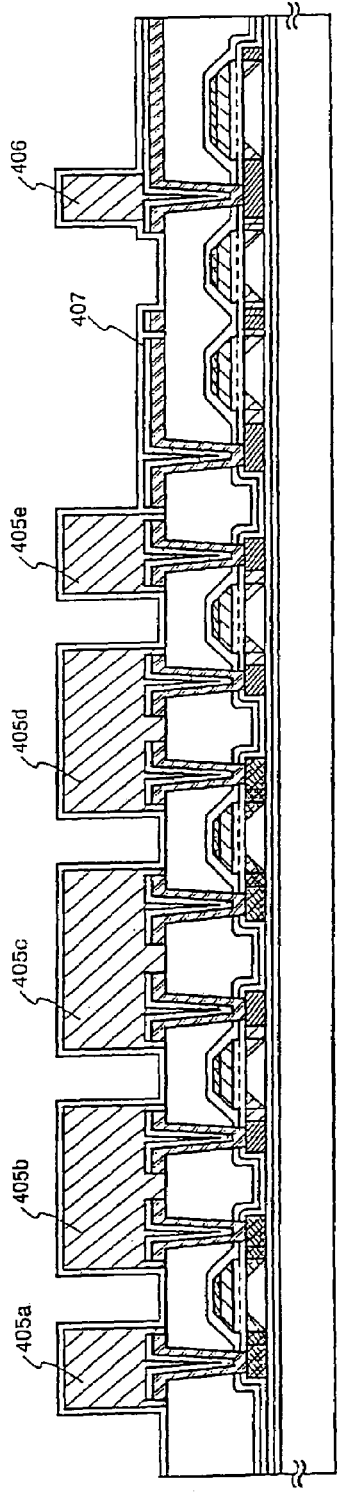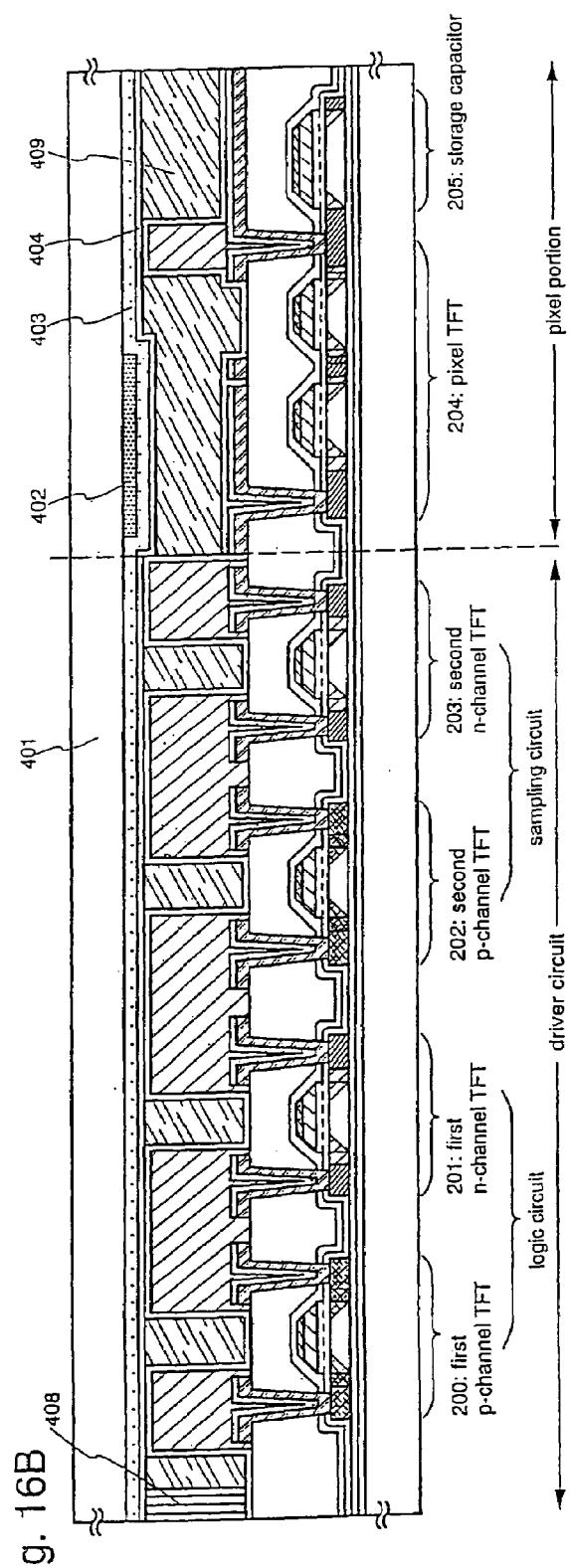
Fig. 16A
Fig. 16B

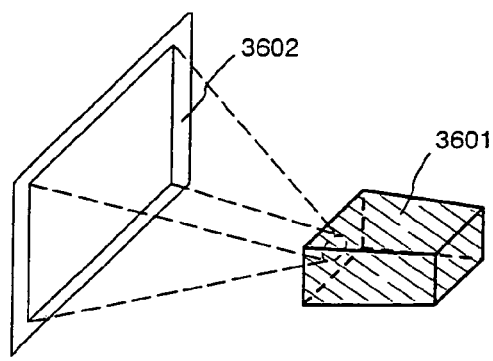
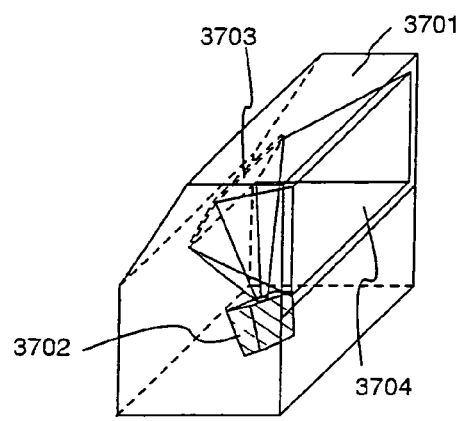
Fig. 26A    Fig. 26B
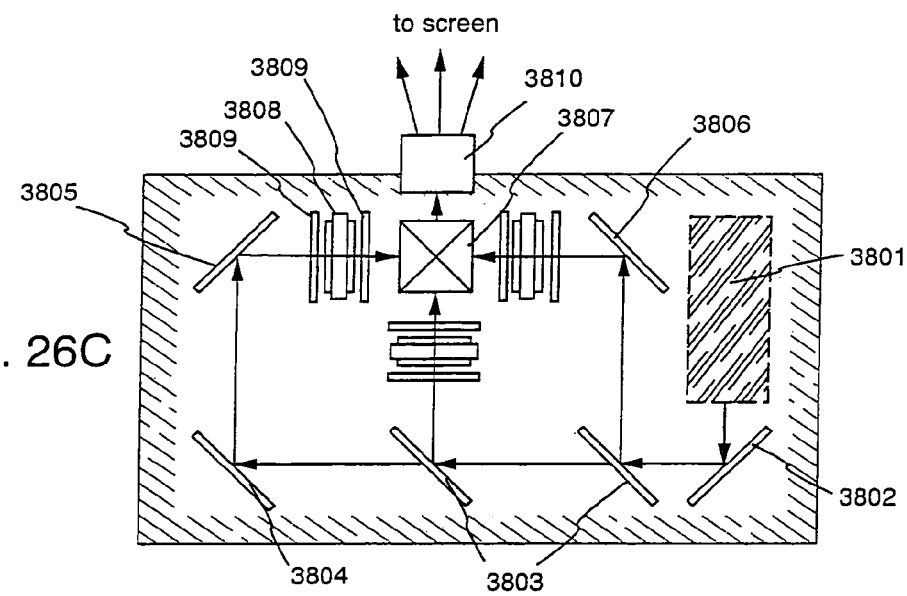
Fig. 26C
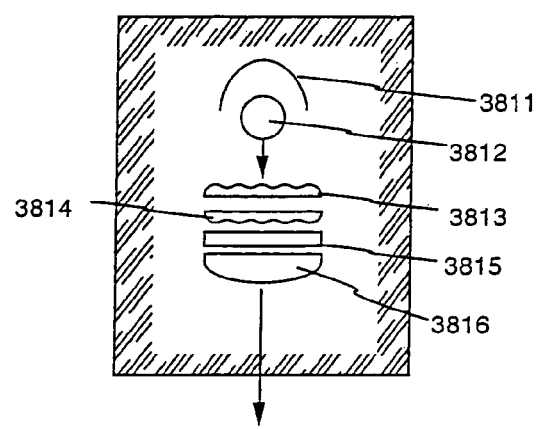
Fig. 26D

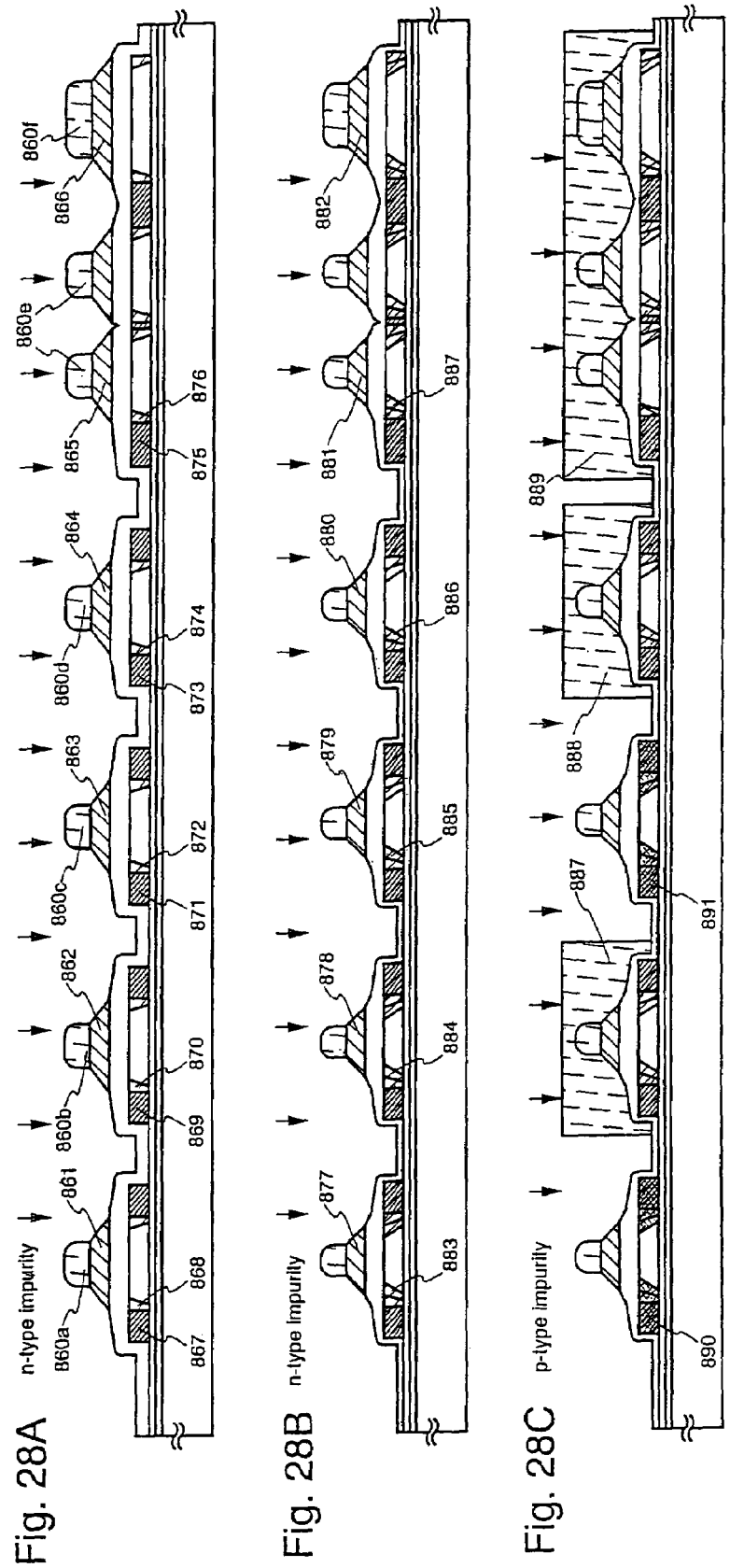

SEMICONDUCTOR DEVICE, AND METHOD OF FABRICATING THE SAME

Divisional of application Ser. No. 10/337,724 filed Jan. 8, 2003 now U.S. Pat. No. 6,919,282 which is a divisional of prior application Ser. No. 09/703,593 filed Nov. 2, 2000, now issued as U.S. Pat. No. 6,521,912.

BACKGROUND OF THE INVENTION

1. Field of the Invention

The present invention relates to the material of an insulating film necessary for fabricating a thin film transistor (TFT), and a method of manufacturing the insulating film material. More particularly, the present invention is well suited for application to an electro-optical device which is typified by a liquid crystal display panel or an electroluminescence (EL) display device of active matrix type wherein pixel units and driver circuits are disposed on an identical substrate, and to an electronic equipment in which such an electro-optical device is installed. Incidentally, here in this specification, an expression "semiconductor device" is intended to signify general devices which can function by utilizing semiconductor properties, and it shall cover within its category, an electro-optical device which is typified by a liquid crystal display device of active matrix type fabricated using thin film transistors, and an electronic equipment in which such an electro-optical device is installed as a component.

2. Prior Art

There has been developed a thin-film transistor (hereafter referred to as a TFT), having an active layer made from a crystalline semiconductor film, which is crystallized by a method such as laser annealing or thermal annealing from an amorphous semiconductor film, formed on an insulating substrate having light transparency characteristics, such as a glass. The substrate mainly used in the manufacture of the TFT is a glass substrate such as a barium-borosilicate glass or alumino-borosilicate glass. This type of glass substrate has inferior resistance to heat when compared with a quartz substrate, but has the advantages of a low market price, and the fact that a large surface area substrate can be easily manufactured.

The structure of the TFT can be roughly divided into a top gate type and a bottom gate type, with respect to the arrangement of a gate electrode. In the top gate type, an active layer is formed on an insulating substrate such as a glass substrate, and a gate insulating film and a gate electrode are formed in order on the active layer. Furthermore, there are many cases in which a base film is formed between the substrate and the active layer. On the other hand, a gate electrode is formed on a similar substrate in the bottom gate type, and a gate insulating film and an active layer are formed in order on the gate electrode. In addition, a protective insulating film or an interlayer insulating film is formed on the active layer.

The gate insulating film of the TFT is manufactured from a film such as a silicon oxide film, a silicon nitride film, or a silicon oxynitride film. The reason that these types of materials are used is because in order to form a good interface with respect to an amorphous silicon film or a crystalline silicon film forming the active layer, it is preferable to form the insulating films from a material having silicon as one of the principal constituents.

It is considered as preferable to manufacture the above insulating films by plasma CVD or low pressure CVD. Plasma CVD is a technique of decomposing a raw material gas in a glow discharge, forming a radical (meaning here a chemically activated one) by being made into a plasma, and depositing this on the substrate. In plasma CVD, it is possible to deposit a film at a low temperature of normally 400° C. or less. However, ions also exist within the plasma, and therefore it is necessary to skillfully control the damage to the substrate due to ions accelerated by an electric field occurring in a sheath region. On the other hand, low pressure CVD is a method of thermally decomposing a raw material gas and depositing a film on the substrate. There is no damage to the substrate due to ions, as with plasma CVD, but low pressure CVD has the disadvantage of slow deposition speed, so it cannot always be applied to manufacturing process in view of circumstances.

It is required of a gate insulating film to sufficiently lower an interface state density and a defect level density (bulk defect density) in the film. It is also required to consider an internal stress and the magnitude of change thereof attributed to a heat treatment. It is important for forming the gate insulating film of good quality to prevent the introduction of interfaces and defects into the film in the course of the deposition of the film, and to prepare a composition adapted to lower the defect level density of the formed film. Expedients each of which employs a starting gas exhibiting a high efficiency of decomposition, have been thought out for that purpose. By way of example, a silicon oxide film which is manufactured by plasma CVD with a mixed gas consisting of TEOS (Tetraethyl Ortho Silicate whose chemical formula is $Si(OC_2H_5)_4$) and oxygen ($O_2$) is the insulating film of good quality. It has been known that, when a MOS structure is fabricated using the silicon oxide film and is subjected to a BT (Bias Temperature) test, the fluctuation of a flat-band voltage (hereinbelow, expressed by "Vfb") can be diminished to a practicable degree.

Since, however, water ($H_2O$) is liable to be produced and is easily entered into the film in the course of decomposing the TEOS by glow discharge, thermal annealing needs to be performed at 400° C.–600° C. after the formation of the film in order to obtain the good quality film as stated above. Unfavorably it becomes a factor for the increase of a fabrication cost to incorporate such a high-temperature annealing step into the fabricating process of a TFT.

On the other hand, a silicon nitride film which is manufactured from, for example, $SiH_4$, $NH_3$ and $N_2$ by plasma CVD can offer a dense and hard film. Since, however, the silicon nitride film has a high defect level density and a high internal stress, it gives rise to a distortion at its interface defined with an active layer. Accordingly, it exerts the bad influences of shifting a threshold voltage (hereinbelow, expressed by "Vth") and enlarging a sub-threshold constant (hereinbelow, shortly termed "S value"), on the characteristics of a TFT.

Further, a silicon oxynitride film which is manufactured by plasma CVD with a mixed gas consisting of $SiH_4$ and $N_2O$ can offer a film of high density in such a way that several—several tens atomic % of nitrogen is contained in the film. Under some manufactural conditions, however, defect levels due to Si—N bonds appear, and the value of a voltage Vfb fluctuates greatly in a BT test. Even when the film is stable in the BT test, it lacks in a thermal stability, and the voltage Vfb is caused to fluctuate by a heat treatment at 300° C.–550° C. Such fluctuations in the characteristics can be conjectured ascribable to the change of the composition of the silicon oxynitride film.

Meanwhile, there has been known a technique wherein a silicon oxynitride film is manufactured by plasma CVD with a mixed gas consisting of $SiH_4$, $N_2O$ and $H_2$. By way of example, a thesis "Structural and optical properties of amorphous silicon oxynitride", Jiun-Lin Yeh and Si-Chen Lee, Journal of Applied Physics, vol. 79, No. 2, pp.656–663, 1996, discloses hydrogenated silicon oxynitride films which were manufactured by plasma CVD in which a decomposing temperature was set at 250° C., the mixing ratio of hydrogen ($H_2$) to $SiH_4+N_2O$ was held constant at 0.9 to 1.0, and the mixing ratio of $SiH_4$ and $N_2O$ as expressed by $X_g=[N_2O]/([SiH_4]+[N_2O])$ was changed from 0.05 to 0.975 inclusive. With Fourier-transform infrared spectrometry (FT-IR), however, it was clearly observed that $HSi-O_3$ bonds and $H_2Si-O_2$ bonds existed in the hydrogenated silicon oxynitride films manufactured here. Such bonds are conjectured, not only to exhibit inferior thermal stabilities, but also to form defect levels around the bonds due to the fluctuations of coordination numbers. In such a case, despite the silicon oxynitride film, unless the composition thereof or the constituents thereof including impurity elements is/are examined in detail, the film cannot be easily used for a gate insulating film which exerts serious influences on the characteristics of a TFT.

SUMMARY OF THE INVENTION

The present invention consists in techniques for solving the problems as stated above, and it has for its object to provide a gate insulating film which is suitable for insulated gate type transistors typified by a TFT, and a method of manufacturing the gate insulating film. Another object of the invention is to ensure the stability and reliability of the characteristics of a TFT, such as the threshold voltage (Vth) and sub-threshold constant (S value) thereof, by employing such a gate insulating film.

In order to solve the problems, according to the invention, a silicon oxynitride film is manufactured using $SiH_4$, $N_2O$ and $H_2$ by plasma CVD, and this film is applied to the gate insulating film of a TFT. The characteristics of the silicon oxynitride film to be manufactured are controlled chiefly by changing the flow rates of $N_2O$ and $H_2$. A hydrogen concentration and a nitrogen concentration in the film can be increased within the above range by the increase of the flow rate of $H_2$. Besides, the hydrogen concentration and the nitrogen concentration in the film can be decreased to heighten an oxygen concentration by the increase of the flow rate of $N_2O$. On the other hand, a silicon concentration is hardly changed even when only the ratio between the gas flow rates of $H_2$ and $N_2O$ is changed.

Concretely, a silicon oxynitride film is formed within the ranges of $X_h=0.5-5$ ($X_h=H_2/(SiH_4+N_2O)$) and $X_g=0.94-0.97$ ($X_g=N_2O/(SiH_4+N_2O)$) in terms of the ratios among the flow rates of $SiH_4$, $N_2O$ and $H_2$, while a silicon oxynitride film is formed within the ranges of $X_h=0$ ($X_h=H_2/(SiH_4+N_2O)$) and $X_g=0.97-0.99$ ($X_g=N_2O/(SiH_4+N_2O)$). These silicon oxynitride films are properly used.

When the silicon oxynitride film is to be manufactured by the plasma CVD, $H_2$ is added to a mixed gas consisting of $SiH_4$ and $N_2O$, whereby radicals produced from $SiH_4$ by decomposition can be prevented from polymerizing in a vapor phase (in a reaction space), to nullify the production of particles. Moreover, in the growing surface of the film, it is possible to prevent excessive hydrogen from being introduced into the film, owing to the reaction of pulling out surface adsorption hydrogen as based on hydrogen radicals. Such an action correlates closely with the temperature of a substrate during the deposition of the film, and it can be attained by holding the substrate temperature at 300° C.–450° C., preferably 400° C. As a result, a dense film of low defect density can be formed, and a slight amount of hydrogen contained in the film acts effectively to relieve a lattice distortion. In order to heighten the generation density of hydrogen radicals by decomposing hydrogen molecules, the frequency of a high-frequency power source for generating glow discharge is set within a range of 13.56 MHz–120 MHz, preferably 27 MHz–60 MHz, and the discharge power density thereof is set at 0.1–1 $W/cm^2$.

Owing to the adoption of the manufactural conditions mentioned above, the silicon oxynitride film according to the present invention is endowed with a composition in which a nitrogen concentration is at least 0.1 atomic % and less than 15 atomic %, a hydrogen concentration is at least 0.1 atomic % and less than 5 atomic %, and an oxygen concentration is at least 50 atomic % and less than 70 atomic %.

The feature of the invention consists, in a case where the gate insulating film of a TFT is formed of a silicon oxynitride film, the composition of the silicon oxynitride film is made different on, at least, the active layer side and gate electrode side of the gate insulating film so as to become high in the nitrogen concentration and hydrogen concentration of the film and low in the oxygen concentration thereof relatively on the active layer side.

By way of example, that first layer of the gate insulating film which lies in touch with an active layer is formed of a silicon oxynitride film which has a nitrogen concentration of 2–15 atomic %, a hydrogen concentration of 1.5–5 atomic % and an oxygen concentration of 50–60 atomic %, and that second layer of the gate insulating film which lies in touch with a gate electrode is formed of a silicon oxynitride film which has a nitrogen concentration of 0.1–2 atomic %, a hydrogen concentration of 0.1–2 atomic % and an oxygen concentration of 60–65 atomic %, thereby to establish a stepped concentration gradient. Alternatively, the composition may well be continuously changed without the definite distinction between the first and second layers as stated above.

The gate insulating film of such a construction is applicable to either a TFT of top gate type or a TFT of bottom gate type (or inverse stagger type).

The silicon oxynitride film according to the present invention is manufactured by plasma CVD with a starting gas which consists of $SiH_4$, $N_2O$ and $H_2$. Here will be explained capacitance—voltage characteristics (hereinbelow, abbreviated to "C-V characteristics") which are attained when samples of MOS structures are manufactured using the silicon oxynitride film.

A plasma equipment which has a construction of capacitance-coupled parallel plate scheme is employed for the manufacture of the silicon oxynitride film. Otherwise, it is allowed to employ a plasma CVD equipment which is of inductive coupling type or which conjointly uses the energy of a magnetic field as in an electron cyclotron resonance. The silicon oxynitride film can have its composition changed by employing $SiH_4$ and $N_2O$ gases and further adding $H_2$ thereto. During the plasma manufacture, a pressure is set at 10 Pa–133 Pa (preferably, 20 Pa–40 Pa), a high-frequency power density at 0.2 $W/cm^2$–1 $W/cm^2$ (preferably, 0.3 $W/cm^2$–0.5 $W/cm^2$), a substrate temperature at 200° C.–450° C. (preferably, 300° C.–400° C.), and the oscillation frequency of a high-frequency power source at 10 MHz–120 MHz (preferably, 27 MHz–60 MHz).

Three kinds of manufactural conditions are listed in Table 1. Conditions #210 are the manufactural conditions of a silicon oxynitride film which is formed from $SiH_4$ and $N_2O$. On the other hand, conditions #211 and #212 are the manufactural conditions in the case where $H_2$ is added to the $SiH_4$ and $N_2O$ gases, and where the flow rate of the additional $H_2$ is changed. Here, in this specification, the silicon oxynitride film manufactured from $SiH_4$ and $N_2O$ shall be expressed as "silicon oxynitride film (A)", and the silicon oxynitride film manufactured from $SiH_4$ and $N_2O$ with $H_2$ added thereto shall be expressed as "silicon oxynitride film (B)". More specifically, the silicon oxynitride film (A) is formed within the ranges of $X_h=0$ ($X_h=H_2/(SiH_4+N_2O)$) and $X_g=0.97-0.99$ ($X_g=N_2/(SiH_4+N_2O)$) in terms of the ratios among the flow rates of $SiH_4$, $N_2O$ and $H_2$, while the silicon oxynitride film (B) is formed within the ranges of $X_h=0.5-5$ ($X_h=H_2/(SiH_4+N_2O)$) and $X_g=0.94-0.97$ ($X_g=N_2O/(SiH_4+N_2O)$) in terms of the ratios among the flow rates of $SiH_4$, $N_2O$ and $H_2$.

Also, the conditions of preprocessing which is performed before the formation of the silicon oxynitride film are listed in Table 1. Although the preprocessing is not indispensable, it is useful for enhancing the reproducibility of the characteristics of the silicon oxynitride film itself and that of these characteristics in the case of the application to the TFT.

TABLE 1

| Conditions/Sample No. | | | #210 | #211 | #212 |
|---|---|---|---|---|---|
| Plasma cleaning | Gases (sccm) | $H_2$ | 100 | 200 | 200 |
| | | $O_2$ | 100 | 0 | 0 |
| | Pressure (Pa) | | 20 | 20 | 20 |
| | High-frequency power (W/cm$^2$) | | 0.2 | 0.2 | 0.2 |
| | Processing time (minutes) | | 2 | 2 | 2 |
| Film formation | Gases (sccm) | $SiH_4$ | 4 | 5 | 5 |
| | | $N_2O$ | 400 | 120 | 120 |
| | | $H_2$ | 0 | 500 | 125 |
| | Pressure (Pa) | | 20 | 20 | 20 |
| | High-frequency power (W/cm$^2$) | | 0.4 | 0.4 | 0.4 |
| | Substrate temperature (° C.) | | 400 | 400 | 400 |

Referring to Table 1, the preprocessing is performed for 2 minutes by generating a plasma under the conditions of a hydrogen introducing flow rate of 200 SCCM, a pressure of 20 Pa and a high-frequency power density of 0.2 W/cm$^2$. Alternatively, the preprocessing may well be performed in such a way that a plasma is similarly generated by introducing hydrogen at 100 SCCM and oxygen at 100 SCCM. Further, although not indicated in the table, the preprocessing may well be performed for several minutes under the conditions of a pressure of 10 Pa–70 Pa and a high-frequency power density of 0.1 W/cm$^2$14 0.5 W/cm$^2$ by introducing $N_2O$ and hydrogen. During such preprocessing, the temperature of a substrate may be held at 300° C.–450° C., preferably 400° C. The preprocessing has the function of cleaning the surface of the substrate for deposition, and the function of adsorbing hydrogen on the substrate surface for deposition so as to temporarily inactivate this surface, thereby to stabilize the interface properties of a hydrogenated silicon oxynitride film which is to be deposited later.

Besides, when oxygen and $N_2O$ are simultaneously introduced, such a favorable function is fulfilled that the outermost part of the substrate surface for deposition and the vicinity thereof are oxidized to lower an interface state density.

Concretely, the sample of the hydrogenated silicon oxynitride film (B) was manufactured under the film forming conditions #211; an $SiH_4$ flow rate of 5 SCCM, an $N_2O$ flow rate of 120 SCCM and a hydrogen flow rate of 500 SCCM, a reaction pressure of 20 Pa, a high-frequency power density of 0.4 W/cm$^2$, and a substrate temperature of 400° C. A high-frequency power source frequency may be 10 MHz–120 MHz, preferably 27 MHz–60 MHz, and it was set at 60 MHz here. Besides, the other sample was manufactured under the conditions #212 in which the flow rate of hydrogen was changed to 125 SCCM from the conditions #211. Regarding the flow rates of the individual gases, their absolute values are not restricted, but their ratios are significant. Letting $X_h$ denote $[H_2]/([SiH_4]+[N_2O])$, this ratio $X_h$ may be set within a range of 0.1–7. Also, letting $X_g$ denote $[N_2O]/([SiH_4]+[N_2O])$ as stated before, this ratio $X_g$ may be set within a range of 0.90–0.996. Besides, the film forming conditions of the silicon oxynitride film (A) are the conditions #210.

The typical characteristics of the silicon oxynitride films manufactured under such conditions are listed in Table 2. This table indicates the compositions, hydrogen (H), nitrogen (N), oxygen (O) and silicon (Si) of the films as measured by Rutherford Backscattering Spectrometry (which shall be abbreviated to "RBS" below, and which used a system "3S-R10", an accelerator. "NEC3SDH pelletron" and an end station "CE&A RBS-400"), the densities of the films, and the initial values of the internal stresses of the films and the values of the internal stresses after thermal annealing (obtained with a measuring instrument "Model-30114" manufactured by Ionic System Inc.). In mentioning the internal stresses, the sign (+) denotes a tensile stress (a stress by which the film is deformed inside), and the sign (−) denotes a compressive stress (a stress by which the film is deformed outside).

TABLE 2

| | | Sample No. | | |
|---|---|---|---|---|
| | | #210 | #211 | #212 |
| Contents (atomic %) | H | 1.6 ± 0.5 | 3.0 ± 0.5 | 2.0 ± 0.5 |
| | N | 1.5 ± 4 | 9.6 ± 4 | 7.9 ± 4 |
| | O | 63.5 ± 2 | 53.8 ± 2 | 56.4 ± 2 |
| | Si | 33.4 ± 2 | 33.6 ± 2 | 33.7 ± 2 |
| Composition ratios | O/Si | 1.9 | 1.6 | 1.67 |
| | N/Si | 0.04 | 0.18 | 0.14 |
| Density (atoms/cm$^3$) | | $6.53 \times 10^{22}$ | $7.16 \times 10^{22}$ | $7.11 \times 10^{22}$ |

The results of Table 2 reveal that the concentration of hydrogen contained in the film is increased by adding $H_2$ during the film formation. Consequently, the contents of oxygen and nitrogen are changed. In the silicon oxynitride film (A), the ratio of O to Si is 1.9 (1.7–2 as an allowable range), and the ratio of N to Si is 0.04 (0.02–0.06 as an allowable range). In contrast, in the silicon oxynitride film (B) whose composition changes depending upon the flow rate of $H_2$ added during the film formation, the ratio of O to Si is about 1.6 (1.4–1.8 as an allowable range), and the ratio of N to Si is 0.14–0.18 (0.05–0.5 as an allowable range), whereby the proportion of O decreases relative to Si, and that of N increases.

The increase of the nitrogen content corresponds to increase in the density of the film, and the nitrogen content of 6.5 atoms/cm$^3$ in the silicon oxynitride film (A) increases to the nitrogen content of 7.1 atoms/cm$^3$ in the silicon oxynitride film (B), so that the film (B) is densified. Such a change in the density is demonstrated in terms of the etching rates of a mixed solution (trade name "LAL500" produced by Stella-Chemifa Co.), which contains 7.13% of ammonium hydrofluoride ($NH_4HF_2$) and 15.4% of ammonium fluoride ($NH_4F$), at 20° C. That is, as indicated in Table 1, the etching rate is 120 nm/min in the silicon oxynitride film (A), whereas it is 63 nm/min–105 nm/min in the silicon oxynitride film (B). Thus, the film (B) is densified.

Further, in terms of the internal stresses, regarding the silicon oxynitride film (A), a compressive stress of $-4.26 \times 10^8$ Pa is greatly changed to $-7.29 \times 10^6$ Pa by a heat treatment (at 500° C. for 1 hour+at 550° C. for 4 hours: equivalent to processing conditions at the step of crystallization). On the other hand, regarding the silicon oxynitride film (B), a tensile stress of $+2.31 \times 10^8$ Pa is exhibited, and it is hardly changed even by the heat treatment. The phenomenon that the internal stress is changed by the heat treatment, can be considered in association with the structural change and compositional change of the film, and it signifies that the thermal stability to the stress of the silicon oxynitride film (A) is inferior.

The samples of an MOS structure were fabricated using the silicon oxynitride films manufactured on the basis of the conditions of Table 1, and the C-V (capacitance versus voltage) characteristics of the samples and the fluctuations of the flat-band voltages $V_{fb}$ of the samples as attributed to BT (Bias Temperature) tests were investigated. It is the most desirable that the voltage $V_{fb}$ becomes 0 V in the C-V characteristics, and that it is not fluctuated even by the BT test. The shift of the $V_{fb}$ value from 0 V signifies that a defect level density is high at the interface of the film or within the film. Each of the samples was fabricated as stated below. The silicon oxynitride film was formed on a single-crystal silicon substrate (of CZ-N type having a crystal face of <100> and a resistivity of 3–7 [Ω cm]) to a thickness of 100 nm–150 nm under the conditions indicated in Table 1. Aluminum (Al) for an electrode was deposited to a thickness of 400 nm by sputtering, and an electrode area was set at 78.5 $mm^2$. Besides, an Al electrode was formed on the back surface of the single-crystal silicon substrate at the same thickness. The resulting substrate structure was sintered by performing a heat treatment at 350° C. for 30 minutes in a hydrogen atmosphere. Each of the BT tests was such that the resulting structure was let stand at 150° C. for 1 hour in a state where a voltage of +1.7 MV (or −1.7 MV) was applied to the electrode overlying the silicon oxynitride film. Here in this specification, for the sake of convenience, the case of applying a minus voltage shall be expressed as "−BT test", and the case of applying a plus voltage as "+BT test".

First, the C-V characteristics of the respective silicon oxynitride films (A) and (B) were evaluated. Each sample had the silicon oxynitride film (A) or (B) of 130 nm which was formed on the single-crystal silicon substrate under the manufactural conditions of Table 1. The measurement of the C-V characteristics was such that the initial value after the fabrication of the sample was found, and that the subsequent values were found after the −BT test and the +BT test, and after the further heat treatment (at 500° C. for 1 hour+at 550° C. for 4 hours). Table 3 lists the results of the measurement in terms of the values of the flat-band voltages $V_{fb}$. Incidentally, the manufactural conditions of the samples mentioned in Table 3 correspond to those in Table 1. A model "YHP-4192A" fabricated by Yokogawa Hewlett-Packard Company was employed for the measurement of the C—V characteristics.

TABLE 3

| Sample No. | | ① Vfb(V) initial | ② Vfb(V) − BT | ③ Vfb(V) + BT | ΔVfb ② − ① | ΔVfb ③ − ② |
|---|---|---|---|---|---|---|
| #210 | Before Heat treatment | −1.6 | −3.3 | −2.6 | −1.7 | 0.7 |
| | After Heat treatment | −1.8 | −3.4 | −2.6 | −1.6 | 0.8 |
| #212 | Before Heat treatment | −0.4 | −0.7 | −0.7 | −0.3 | 0.0 |
| | After Heat treatment | −1.9 | −3.7 | −3.1 | −1.8 | 0.6 |
| #211 | Before Heat treatment | −3.2 | — | −3.9 | 3.2 | −3.9 |
| | After Heat treatment | −1.0 | 0.6 | −1.6 | 1.6 | −2.2 |

Heat treatment: 500° C., 1 hour + 550° C., 4 hours

The sample #210 is the silicon oxynitride film (A). Whereas the initial value of the voltage $V_{fb}$ is −1.6 V, the subsequent values are fluctuated down to −3.3 V by the BT tests. However, the $V_{fb}$ values are hardly changed by the heat treatment of the specified conditions. Whereas the $V_{fb}$ values of the samples #211 and #212 are hardly changed by the BT tests, they are fluctuated in the plus direction by the heat treatment. Besides, when the initial values of the voltage $V_{fb}$ are compared, the initial value of the sample #212 being the silicon oxynitride film (B) is the closest to 0 V, and hence, this sample is suitable.

It can be judged from the results of Table 3 that, on the basis of the initial $V_{fb}$ value, the sample #212 of the silicon oxynitride film (B) is suitable for forming the interface with a semiconductor. The change of the voltage $V_{fb}$ of this sample due to the heat treatment will be caused by the emission of hydrogen from the film, etc. On the other hand, considering a thermal stability, the silicon oxynitride film (A) can be judged suitable.

Next, there were fabricated and evaluated samples each of which had a two-layer structure consisting of the silicon oxynitride film (A) and the silicon oxynitride film (B) and in which the order of stacking the films from the side of a semiconductor surface was changed. Concretely, the samples each of which had the structure of a single-crystal silicon substrate \ the silicon oxynitride film (A) \ the silicon oxynitride film (B) were classified as "samples-A", while the samples each of which had the structure of the single-crystal silicon substrate \ the silicon oxynitride film (B) \ the silicon oxynitride film (A) were classified as "samples-B". The samples of each class having different film thicknesses were fabricated. Incidentally, the conditions #212 were adopted for the silicon oxynitride film (B). Table 4 lists the evaluated sample structures and the evaluated results. FIG. 27 is a graph showing the $V_{fb}$ values of the samples. By the way, numerals affixed to the samples-A are for distinguishing the differences of the thicknesses of the stacked films.

The same holds true of the samples-B.

TABLE 4

| Sample No. | Thickness (nm) | ① Vfb(V) initial | ② Vfb(V) − BT | ③ Vfb(V) + BT | ΔVfb ② − ① | ΔVfb ③ − ② |
|---|---|---|---|---|---|---|
| A-1 | (A):30 nm\(B)90 nm | −0.4 | −0.8 | −0.5 | −0.4 | 0.3 |
| A-2 | (A): 90 nm\(B)30 nm | −0.9 | −1.6 | −1.0 | −0.7 | 0.6 |
| B-1 | (B): 60 nm\(A)60 nm | 0.3 | 0.1 | 0.4 | −0.2 | 0.3 |
| B-2 | (B): 30 nm\(A)90 nm | 0.0 | −0.3 | 0.0 | −0.3 | 0.3 |
| B-3 | (B): 90 nm\(A)30 nm | 0.2 | 0.1 | 0.5 | −0.1 | 0.4 |

(A): Silicon oxynitride film (A)
(B): Silicon oxynitride film (B)

The results in Table 4 and FIG. 27 reveal that, whereas the samples-A exhibit initial $V_{fb}$ values of −0.4 V–−0.9 V, the samples-B exhibit initial $V_{fb}$ values of 0 V–0.3 V which are favorable. Besides, after a BT test (after the application of a voltage of −1.7 MV to an electrode overlying the silicon oxynitride film), whereas the samples-A exhibit $V_{fb}$ values of −0.8 V–−1.6 V, the samples-B exhibit $V_{fb}$ values of −0.1 V–−0.3 V which indicate a smaller fluctuating width and a higher stability.

In this manner, the clear differences are noted in the C—V characteristics of the samples having the structures listed in Table 4, and they indicate the existence of a structure which can make small both the initial value of the voltage $V_{fb}$ and the fluctuated value thereof after the BT test. That is, they indicate that the structure in which the silicon oxynitride film (B) is first deposited on the single-crystal silicon substrate and is overlaid with the silicon oxynitride film (A) is good.

In the above, the typical examples have been mentioned on the characteristics of the silicon oxynitride films. Of course, the silicon oxynitride films which are insulating films employable in the present invention are not restricted to those mentioned in Tables 1–4 and FIG. 27. The composition of the silicon oxynitride film (A), which is a gate insulating film suitable for a semiconductor device typified by a TFT, is set at a nitrogen concentration of 0.1–2 atomic %, a hydrogen concentration of 0.1–2 atomic % and an oxygen concentration of 60–65 atomic %. On the other hand, the composition of the silicon oxynitride film (B) is set at a nitrogen concentration of 2–15 atomic %, a hydrogen concentration of 1.5–5 atomic % and an oxygen concentration of 50–60 atomic %. Further, the density of the silicon oxynitride film (A) is set to be at least $6 \times 10^{22}$ and less than $7 \times 10^{22}$ atoms/cm$^3$, while the density of the silicon oxynitride film (B) is set to be at least $7 \times 10^{22}$ and less than $8 \times 10^{22}$ atoms/cm$^3$. The aforementioned etching rate with the mixed solution which contains ammonium hydrofluoride (NH$_4$HF$_2$) and ammonium fluoride (NH$_4$F), is set at 110–130 nm/min for the silicon oxynitride film (A) and at 60–110 nm/min for the silicon oxynitride film (B).

BRIEF DESCRIPTION OF THE DRAWINGS

FIGS. 8A to 8D are sectional views showing a process for fabricating a pixel TFT and the TFTs of a driver circuit;

FIGS. 9A to 9D are sectional views showing the subsequent steps of the process for fabricating the pixel TFT and the TFTs of the driver circuit;

FIG. 16A and 16B are sectional views showing a process for fabricating an active matrix type liquid-crystal display device;

FIGS. 26A to 26D are diagrams showing the construction of a liquid crystal display device of projection type;

FIGS. 28A to 28C are sectional views showing a process for fabricating a pixel TFT and the TFTs of a driver circuit.

DETAILED DESCRIPTION OF THE INVENTION

Figure 1A:
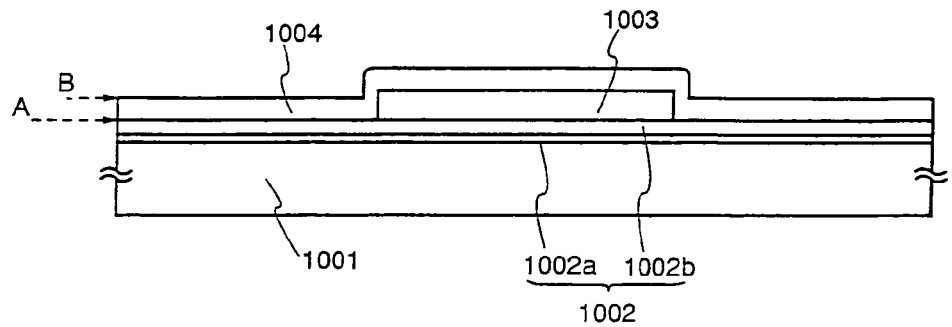
FIGS. 1A to 1C are diagrams for elucidating the constructions of gate insulating films according to the present invention.

There will be described an example in which a silicon oxynitride film (A) and a silicon oxynitride film (B) are applied to the gate insulating film of a TFT. FIG. 1A illustrates a case where the TFT is of top gate type. A base film (also termed "blocking layer") 1002 is formed on a substrate 1001, and is overlaid with an insular semiconductor layer 1003. The insular semiconductor layer 1003 may be made of either material of an amorphous semiconductor and a crystalline semiconductor. The gate insulating film 1004 is formed in touch with the upper surface and end surfaces of the insular semiconductor layer 1003.

Figure 1B:
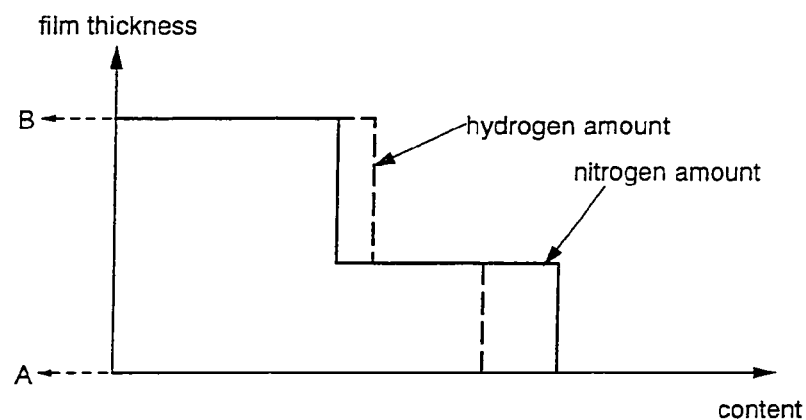
Figure 1C:
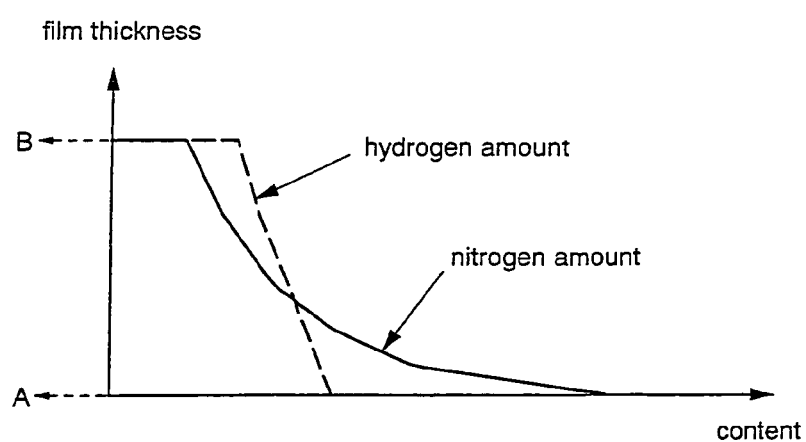

The gate insulating film 1004 is constructed having a composition which changes continuously or stepwise from the silicon oxynitride film (A) toward the silicon oxynitride film (B) in the direction of the thickness of this film 1004 as viewed from the insular semiconductor layer (1003) side. FIGS. 1B and 1C are graphs each showing the contents of hydrogen and nitrogen in the silicon oxynitride film. In one example of the construction, as shown in FIG. 1B, the silicon oxynitride film (B) is formed in touch with the insular semiconductor layer (1003) and is overlaid with the silicon oxynitride film (A). Alternatively, as shown in FIG. 1C, the composition may well be continuously changed from the silicon oxynitride film (B) to the silicon oxynitride film (A) as viewed from the insular semiconductor layer (1003) side.

The silicon oxynitride film (A) and the silicon oxynitride film (B) are stacked or have their compositions changed continuously, whereby the characteristics of the TFT can be stabilized. Concretely, it is possible to prevent the shift of the threshold voltage $V_{th}$ of the TFT, to ensure the thermal stability of the voltage $V_{th}$, and to prevent the fluctuation of the voltage $V_{th}$ attributed to a bias stress.

Figure 2A:
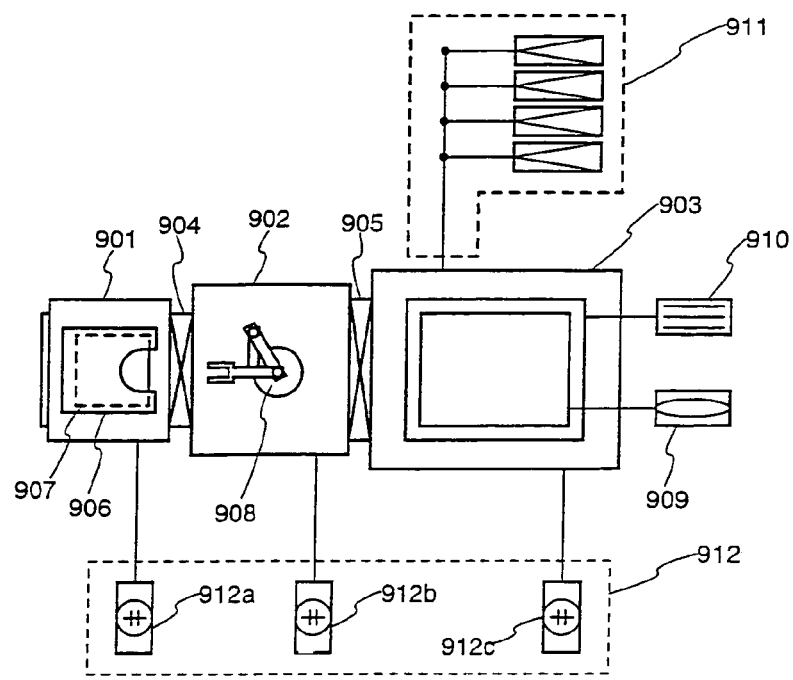
FIGS. 2A and 2B are plan views each exemplifying the construction of a plasma CVD equipment which is employed for the invention.
Figure 2B:
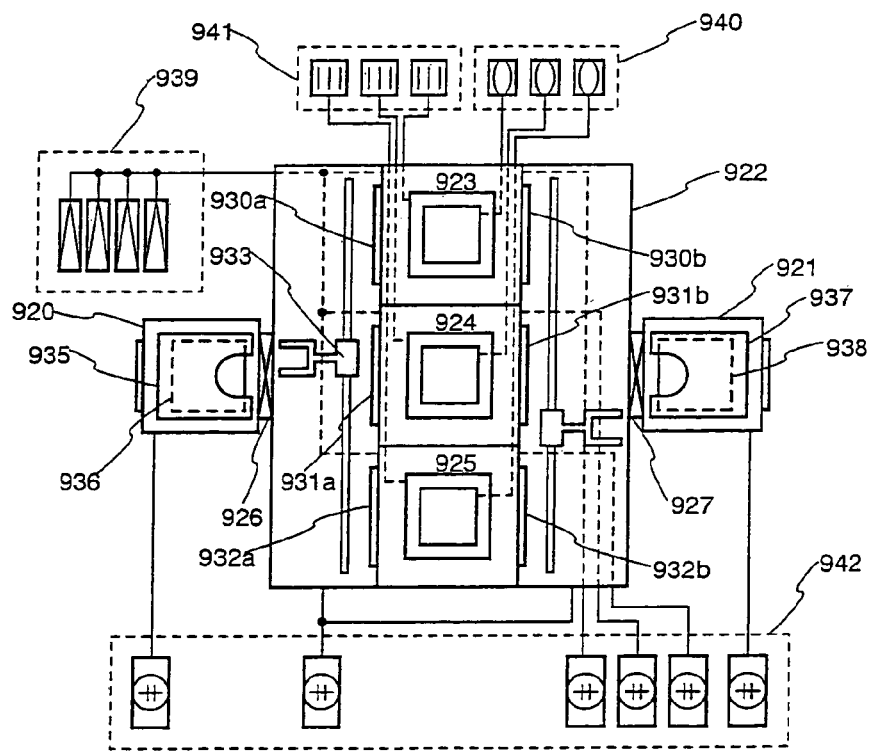

FIGS. 2A and 2B are plan views each showing an example of an equipment which is suited to attain the construction of the invention by forming the silicon oxynitride films (A) and (B). The plasma CVD equipment shown in FIG. 2A includes a load/unload chamber 901, a transport chamber 902 and a film forming chamber 903. The respectively adjacent chambers are separated by partition valves 904 and 905. Pressure lowering means 912a–912c each including a vacuum pump etc. are respectively connected to the chambers. A substrate 907, and a cassette 906 for holding this substrate are disposed in the load/unload chamber 901, and they are transferred into the reaction chamber 903 by transport means 908 provided in the transport chamber 902. The reaction chamber 903 is furnished with plasma generation means 909, substrate heating means 910 and gas supplying means 911, and the film is formed in this chamber by utilizing a glow discharge plasma. The gas supplying means 911 is adapted to supply such gases as $SiH_4$, $N_2O$, $H_2$ and $O_2$ with their flow rates controlled.

Although the equipment is constructed having only one reaction chamber, the silicon oxynitride films (A) and (B) can be successively formed in the identical reaction chamber because the quantities of supplying of the gases $SiH_4$, $N_2O$ and $H_2$, high-frequency power and reaction pressures can be controlled. Rather, in a case where the size of the substrate is large, a floor area for installing the equipment can be decreased, and the equipment contributes to saving a space.

The equipment shown in FIG. 2B is so constructed that a load chamber 920, an unload chamber 921 and a common chamber 922 are provided, and that reaction chambers 923–925 are disposed in the common chamber 922. The load chamber 920 and the unload chamber 921 include substrates 936 and 938 and cassettes 935 and 937 for holding the corresponding substrates, and they are separated from the common chamber 922 by partition valves 926 and 927, respectively. The substrate 936 carried out of the load chamber 920 by transport means 933 can be set in any of the reaction chambers 923–925.

The reaction chambers 923–925 are furnished with plasma generation means 940, substrate heating means 941 and gas supplying means 939, and the film is formed in each chamber by utilizing a glow discharge plasma. The respective chambers are furnished with partition valves 930a–932a and 930b–932b, and the internal pressures of the chambers can be individually controlled by pressure lowering means 942 provided with vacuum pumps etc. It is accordingly possible to deposit the films with their film forming conditions controlled respectively and individually. Alternatively, it is possible to form the films simultaneously or in parallel in the respective reaction chambers, whereby a productivity can be enhanced.

The silicon oxynitride films (A) and (B) can be successively formed in the identical reaction chamber because the quantities of supplying of the gases $SiH_4$, $N_2O$ and $H_2$, high-frequency power and reaction pressures can be controlled. The two-layer structure of the films (A) and (B) may be formed, or the composition of the silicon oxynitride film may well be continuously changed by changing the quantities of supplying of the gases with the lapse of a film forming time. Anyway, the construction of the equipment shown in FIG. 2B contributes to the enhancement of the productivity.

[Embodiment 1]

A method of manufacturing an n-channel TFT and a p-channel TFT, which is necessary for forming a CMOS circuit, on the same substrate is explained in Embodiment 1 in accordance with the process steps using FIGS. 3A to 4D.

Figure 3A:
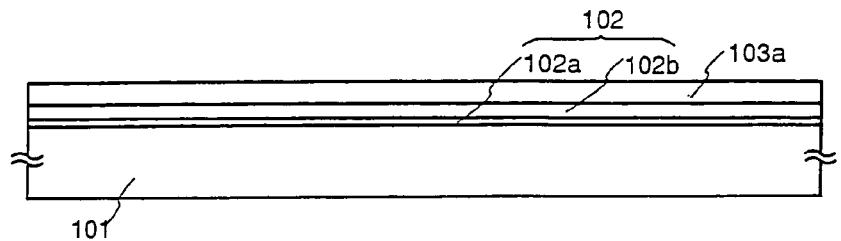
FIGS. 3A to 3F are sectional views showing a process for fabricating TFTs of top gate type.

A substrate such as a barium borosilicate glass substrate or alumino borosilicate glass substrate, typically Corning Corp. #7059 glass or #1737 glass substrate, is used for a substrate 101 in FIG. 3A. Alkaline metal elements such as sodium are contained in this type of glass substrate, although at trace amounts. This type of glass substrate shrinks by approximately several ppm to several tens of ppm due to the temperature during heat treatment, and therefore heat treatment may be performed in advance at a temperature on the order of 10 to 20° C. lower than the distortion point of the glass. A base film 102 is formed on the surface of the substrate 101 on which the TFT will be formed, in order to prevent contamination by alkaline metal elements and other impurities from the substrate 101. The base film 102 is formed of a silicon oxynitride film (C) 102a manufactured from $SiH_4$, $NH_3$, and $N_2O$, and of a silicon oxynitride film 102b manufactured from $SiH_4$, $N_2O$. The silicon oxynitride film (C) 102a is formed with a thickness of 10 to 100 nm (preferably between 20 and 60 nm), and the silicon oxynitride film (A) 102b is formed with a thickness of 10 to 200 nm (preferably between 20 and 100 nm).

These films are formed by using a parallel plate type plasma CVD. A numeral 102a references a silicon oxynitride film (C) which is an insulating film manufactured from $SiH_4$, $N_2O$ and $NH_3$. To prepare the silicon oxynitride film (C) 102a, $SiH_4$ is introduced into the reaction chamber at 10 SCCM, $NH_3$ at 100 SCCM, and $N_2O$ at 20 SCCM, the substrate temperature is set to 325° C., the reaction pressure to 40 Pa, the high-frequency power density to 0.41 $W/cm^2$, and the oscillation frequency to 60 MHz. On the other hand, to prepare the hydrogenated silicon oxynitride film (A) 102b, $SiH_4$ is introduced into the reaction chamber at 5 SCCM, $N_2O$ at 120 SCCM, and $H_2$ at 125 SCCM, the substrate temperature is set to 400° C., the reaction pressure to 20 Pa, the high-frequency power density to 0.41 $W/cm^2$, and the oscillation frequency to 60 MHz. These films can be formed in succession by only changing the substrate temperature and changing the reaction gasses.

The silicon oxynitride film (C) 102a formed here has a density of $9.28 \times 10^{22}/cm^3$, and it is a dense, hard film with an etching speed at 20° C. in a mixed solution containing 7.13% ammonium hydrogen fluoride ($NH_4HF_2$), and 15.4% ammonium fluoride ($NH_4F$) (STELLA CHEMIFA Corp; product name LAL500) which is slow at 63 nm/min. If this type of film is used for the base film, then it is effective in preventing diffusion of alkaline metal elements from the glass substrate into a semiconductor layer formed on the base film.

A semiconductor layer 103a having an amorphous structure is formed next to a thickness of 25 to 80 nm (preferably between 30 and 60 nm) by a known method such as plasma CVD or sputtering. A 55 nm thick amorphous silicon film is formed by plasma CVD in Embodiment 1. Amorphous semiconductor films and microcrystalline semiconductor films exist as semiconductor films having an amorphous structure, and compound semiconductor films having an amorphous structure, such as an amorphous silicon germanium film, may also be applied. Furthermore, both the base film 102 and the amorphous semiconductor layer 103a may be formed in succession. For example, after successively depositing the silicon oxynitride film (C) 102a and the silicon oxynitride film (A) 102b by plasma CVD as stated above, if the reaction gasses are changed from $SiH_4$, $N_2O$ and $H_2$ to $SiH_4$ and $H_2$, or to $SiH_4$, then the films can be formed successively without once being exposed to the atmosphere. As a result, it becomes possible to prevent contamination of the surface of the hydrogenated silicon oxynitride film (A) 102b, and fluctuation in the characteristics of the manufactured TFTs, and change in the threshold voltage thereof, can be reduced.

Figure 3B:
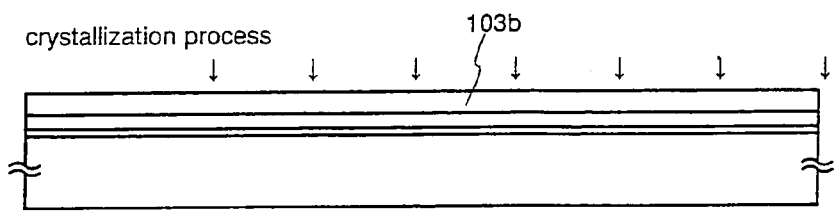
Figure 3C:
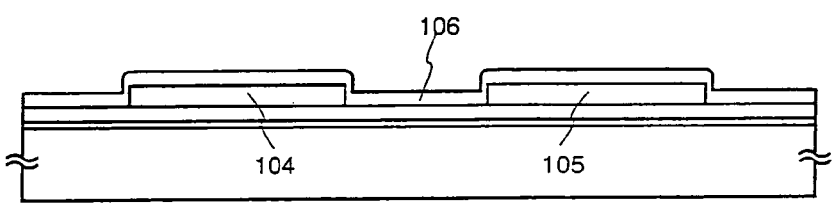
Figure 3D:
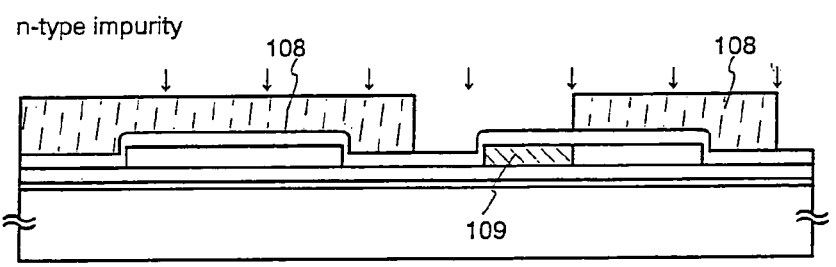

Then crystallization of the amorphous semiconductor layer 103a step is carried out as shown in FIG. 3B. For example, laser annealing and thermal annealing (solid phase growth methods), and rapid thermal annealing (RTA) are applicable. In the RTA method, a lamp such as an infrared lamp, a halogen lamp, a metal halide lamp, or a xenon lamp is used as a light source. Alternatively, the crystalline semiconductor layer 103b can be formed by a crystallization method using a catalytic element, in accordance with the technique disclosed in Japanese Patent Application Laid-open No. Hei 7-130652. It is essential to drive out the hydrogen contained in the amorphous semiconductor layer, and therefore it is desirable to first perform heat treatment for approximately one hour at between 400 and 500° C., reducing the amount of hydrogen contained in the amorphous semiconductor layer to 5 atomic % or less, and then performing crystallization.

When performing crystallization by laser annealing, a pulse oscillation type, or a continuous light emitting type, excimer laser, YAG laser or argon laser is used as the light source. The laser beam is condensed and used by an optical light system, for an example, laser annealing is performed after forming the laser light into a linear shape. The laser annealing conditions may be suitably chosen by the operator, but for example, are set as follows: a laser pulse oscillation frequency of 30 Hz, and a laser energy density of between 100 and 500 $mJ/cm^2$ (typically from 300 to 400 $mJ/cm^2$). The linear shape beam is then irradiated over the entire face of the substrate, and irradiation is performed so that the overlap ratio of the linear shape beam is between 80 and 98% per one shot. The crystalline semiconductor layer can thus be formed.

For the case of thermal annealing, annealing is performed in a nitrogen atmosphere at a temperature about 600 to 660° C. using an annealing furnace. Whichever method is used, realignment of atoms occurs during crystallization of the amorphous semiconductor layer, making it fine and minute, and the thickness of the crystalline semiconductor layer manufactured is reduced about between 1 and 15% from the thickness of the original amorphous semiconductor layer (55 nm in this embodiment).

After forming the crystalline semiconductor layer 103b, the fixed resist mask is then formed, and the crystalline semiconductor layer is partitioned into island-shapes by dry etching, forming island-like semiconductor layers 104 and 105. A mixed gas of $CF_4$ and $O_2$ is used in dry etching of semiconductor layers.

A mask layer 106 is then formed from a silicon oxide film with a thickness of 50 to 100 nm formed by plasma CVD, low pressure CVD, or sputtering. For example, if plasma CVD is used, TEOS and $O_2$ are mixed, the reaction pressure is set to 40 Pa, and the substrate temperature is set between 300 and 400° C., and electric discharge is conducted at a high frequency (13.56 MHz) power density of 0.5 to 0.8 $W/cm^2$, forming a thickness of 100 to 150 nm, typically 130 nm.

In order to form an LDD region of the n-channel TFT, an impurity element that imparts n-type conductivity is selectively doping into the island-like semiconductor layer 105. Group 15 elements in periodic table such as phosphorus (P), arsenic (As), and antimony (Sb) are known as impurity elements that impart n-type conductivity to a semiconductor. A photoresist mask 108 is formed, and ion doping using phosphine ($PH_3$) is applied here for adding phosphorus (P). The concentration of phosphorus (P) in an impurity region 109 formed is in the range of $2 \times 10^{16}$ to $5 \times 10^{19}$ $atoms/cm^3$. The concentration of the impurity element for imparting n-type conductivity contained in the impurity region 109 is referred to as n throughout this specification.

The mask layer 106 is next removed by using an etching solution such as hydrofluoric acid diluted by pure water. A step of activating the impurity elements doped into the island-like semiconductor layer 105b is then performed. Activation can be performed by a method such as thermal annealing in a nitrogen atmosphere for 1 to 4 hours at between 500 and 600° C., or by laser annealing. Further, both methods may be performed together. A laser activation method is used in this embodiment using KrF excimer laser light (248 nm wavelength) is performed. The laser light is formed into a linear shape beam, the oscillation frequency is set to between 5 and 50 Hz, and the energy density is set from 100 to 500 mJ/cm². The linear shape beam is scanned with an overlap ratio of between 80 and 98%, processing the entire surface of the substrate on which the island-like semiconductor layers are formed. Note that the irradiation conditions of the laser light are not limited to these conditions, and that the operator may set them appropriately.

Figure 3E:
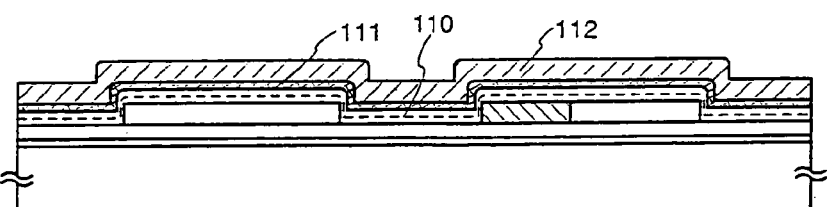
Figure 27:
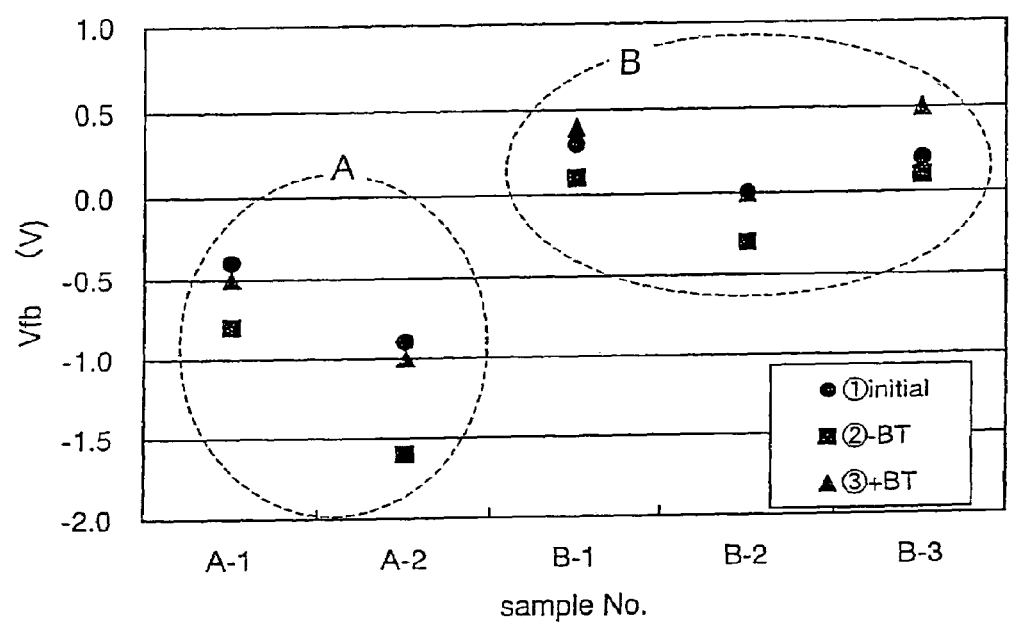
FIG. 27 is a graph showing the fluctuations of flat-band voltages $V_{fb}$ attributed to the difference of the stacking conditions of silicon oxynitride films (A) and (B)

And as shown in FIG. 3E, the gate insulating film 110 is formed. Considering the effects of Table 4 or FIG. 27, an interface of an island-like semiconductor side is formed by silicon oxynitride film (B), and the flow rates of SiH$_4$, N$_2$O and H$_2$ gasses are controlled the flow by a mass flow controller to change the composition to silicon oxynitride composition from previous composition. Above mentioned process is performed to prevent the shift of the threshold voltage Vth of the TFT, to ensure the thermal stability of the voltage Vth, and to prevent the fluctuation of the voltage Vth attributed to a bias stress. In FIG. 3E, broken line shows the medium value of the composition. The portion may be at the center portion, close to semiconductor layer or close to gate electrode. Concretely, a SiH$_4$ flows rate of 5 SCCM, an N$_2$O flows rate of 125 SCCM, Xh denotes 1 and Xg denotes 0.96. A reaction pressure is controlled to 20 Pa and a high-frequency power is making at 27 MHz with a high frequency power density 0.4 W/cm² to start a film forming. After that, considering the film forming speed, the N$_2$O flow rates gasses is increased to 500 SCCM on occasion at the end of the film forming and Xh is decreased to 0 and Xg decreased to 0.99, as the flow rate of H$_2$ gasses 0 SCCM. The flow rate of SiH$_4$ is controlled 5 SCCM to 4 SCCM, the broken line shows the section thereof. According to this, the gate insulating film is formed 120 nm thickness. Of course, the thickness of the gate insulating film is not limited to 120 nm thickness, the gate insulating film can be formed to 50 to 200 nm (preferably 80 to 150 nm), and can be made its structure to laminate silicon oxynitride film (A) and (B). The film forming condition is an example, if a composition shown in FIG. 2 can be obtained, it is not necessary to be limited by the film forming condition.

A plasma cleaning process is effective performing before depositing the gate insulating film. The plasma cleaning process is performed for 2 minutes by introducing hydrogen at 200 SCCM, and then generating a plasma by setting the pressure to 20 Pa and the high frequency power to 0.2 W/cm². Alternatively, H$_2$ may be introduced at 100 SCCM, oxygen at 100 SCCM, and a plasma may similarly be generated at a pressure of 40 Pa. The substrate temperature is set from 300 to 450° C., preferably at 400° C. By performing the plasma cleaning process on the surfaces of the island-like semiconductor layers 104 and 105b at this stage, contaminating matter such as adsorbed boron or phosphorus, or organic matter, can be removed.

A conductive layer is formed on the gate insulating film 110 in order to form a gate electrode. A single layer may be formed for this conductive layer, but a laminate structure of two layers or three layers can also be formed when necessary. In this embodiment, a conductive layer (A) 111 made from a conductive metallic nitride film and a conductive layer (B) 112 made from a metallic film are laminated. The conductive layer (B) 112 may be formed from an element selected from the group consisting of tantalum (Ta), titanium (Ti), molybdenum (Mo), and tungsten (W), or from an alloy having one of these element as its principal constituent, or from an alloy film of a combination of these elements (typically a Mo—W alloy film or a Mo—Ta alloy film). The conductive layer (A) 111 is formed from tantalum nitride (TaN), tungsten nitride (WN), titanium nitride (TiN), or molybdenum nitride (MoN). Further, tungsten silicide, titanium silicide, or molybdenum silicide may be applied for the conductive layer (A) 111. The concentration of contained impurities may be reduced in order to be able to make the resistance of the conductive layer (B) 112 lower, and in particular, it is good to reduce the oxygen concentration to 30 ppm or less. For example, by reducing the oxygen concentration of tungsten (W) to 30 ppm or less, a resistivity value of 20μ Ω cm or less can be realized with tungsten (W).

The conductive layer (A) 111 may be from 10 to 50 nm (preferably 20 to 30 nm) in thickness, and the conductive layer (B) 112 may be from 200 to 400 nm (preferably 250 to 350 nm) in thickness. In this embodiment, a TaN film of 30 nm thickness is used for the conductive layer (A) 111, and Ta film of 350 nm thickness is used for the conductive layer (B) 112, and both are formed by sputtering. The TaN film is formed using Ta as a target and a mixed gas of Ar and nitrogen as a sputtering gas. Ta is formed using Ar as the sputtering gas. Further, if a suitable amount of Xe or Kr is added to these sputtering gases, then the internal stresses in the films formed can be relieved, and peeling can be prevented. The resistivity of an α-phase Ta film is about 20μ Ω cm and it can be suitably used in the gate electrode, but a β-phase Ta film has a resistivity of about 180μ Ω cm and it is unsuitable for the gate electrode. A TaN film possesses a crystal structure which is close to the α-phase, and therefore the α-phase Ta film is easily obtained provide that a Ta film is formed on the TaN film. Note that although not shown in the figures, it is effective to form a silicon film doped by phosphorus (P), with a thickness of about 2 to 20 nm, below the conductive film (A). 111. By doing so, along with improving the adhesiveness of the conductive film formed on the silicon film and preventing oxidation, microscopic amounts of alkaline metal elements contained in the conductive layer (A) or in the conductive layer (B) can be prevented from diffusing into the gate insulating film 110. Whichever is done, it is preferable that the resistively of the conductive layer (B) be in the range of 10 to 500μ Ω cm.

Figure 3F:
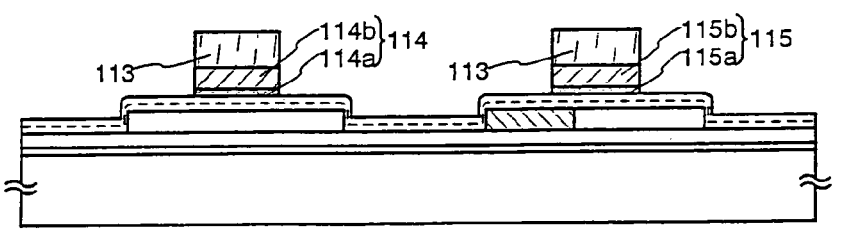

Next, as shown in FIG. 3F, a photoresist mask 113 is formed, and the conductive layer (A) 111 and the conductive layer (B) 112 are etched together, forming gate electrodes 114 and 115. In order to etch the heat-resistant electrically conductive material such as the W or the Ta at a high speed and with a high accuracy and to taper the end portion of the material, the dry etching method using the high-density plasma is proper. In order to obtain the high-density plasma, an etching device using micro-waves or inductively coupled plasma (ICP) is proper. In particular, the ICP etching device is easy in the control of plasma and can be adapted to the large area of the substrate to be processed. For example, etching can be performed by dry etching using a mixed gas of CF$_4$ and O$_2$, or using CF$_4$ and Cl$_2$ gas, at a reaction pressure between 1 and 20 Pa.

The gate electrodes 114 and 115 are formed from conductive layers 114a and 115a, made from the conductive layer (A), and from conductive layers 114b and 115b, made from the conductive layer (B), respectively. The gate electrode 115 of the n-channel TFT overlaps a portion of the impurity region 109 through the gate insulating film 110. Further, it is possible to form the gate electrode from only the conductive layer (B).

Figure 4A:
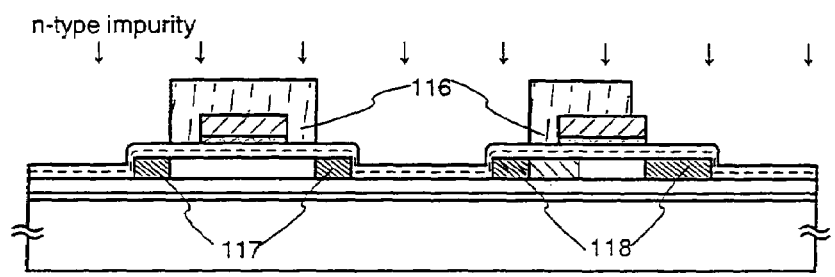
FIGS. 4A to 4D are sectional views showing the subsequent steps of the process for fabricating the top gate type TFTs.

Next, as shown in FIG. 4A, a resist mask 116 is formed, and an impurity element that imparts n-type conductivity is doped to the island like semiconductor layers 104 and 105.

Using the impurity elements that imparts n-type conductivity using phosphorus (P), the ionized impurity elements is injected by an ion doping method and the concentration is set to between $1\times10^{20}$ and $1\times10^{21}$ atoms/cm$^3$ in this region. Then, the impurity region 117 and 118 are formed.

Figure 4B:
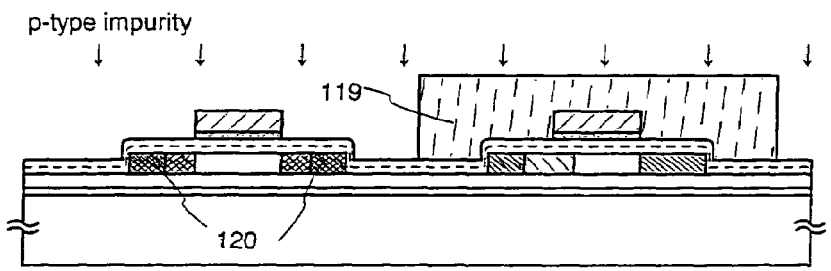
Figure 4C:
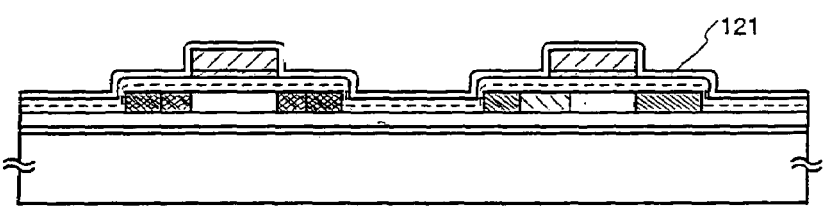
Figure 4D:
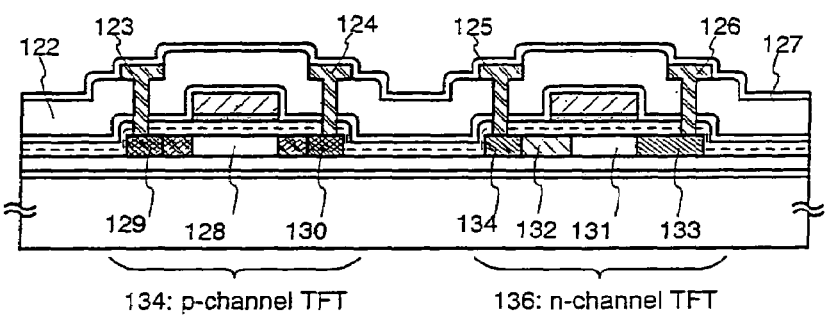

Next, as shown in FIG. 4B, a resist mask 119 is formed, and an impurity region 120 is formed as an source region and a drain region of the p-channel type TFT. Here, an impurity element that imparts p-type conductivity is added with the gate electrode 114 as a mask, and the impurity region is formed in a self-aligning manner. The impurity region 120 is then formed by above mentioned phosphorus (P) doping using diborane (B$_2$H$_6$). The boron (B) concentration of the impurity region 120 is made to be from $3\times10^{20}$ to $3\times10^{21}$ atoms/cm$^3$. The concentration of the impurity element for imparting p-type conductivity contained in the impurity region 120 is referred to as (p$^+$) throughout this specification. Phosphorus (P) is already added to the impurity region 120, the concentration of boron (B) added to the impurity region 120 is about 1.5 to 3 times as much as that of phosphorus (P), and therefore the p-type conductivity is ensured and no influence is imparted to the TFT characteristics.

Thereafter, a step of activating the impurity elements which impart n-type or p-type conductivity and have been added at the respective concentrations is performed by thermal annealing. An annealing furnace may be used at this step. In addition, laser annealing or rapid thermal annealing (RTA) can also be employed. The annealing process is performed at 400 to 700° C., typically 500 to 600° C. in a nitrogen atmosphere which has an oxygen concentration of 1 ppm or less, preferably 0.1 ppm or less. Heat treatment is performed for 4 hours at 550° C. in this embodiment. Further, it is appropriate to form a protective insulating film 121 of 50 to 200 nm thickness from a silicon oxynitride film or a silicon oxide film before annealing for preventing oxygenation of the gate electrode forming material.

After the activation step, additional heat treatment is performed for 1 to 12 hours at 300 to 500° C. in an atmosphere containing hydrogen of between 3 and 100%, hydrogenating the island-like semiconductor layers. This step is for terminating dangling bonds in the semiconductor layers by thermally excited hydrogen. Plasma hydrogenation (using hydrogen excited by a plasma) may be performed as another means of hydrogenation.

The silicon oxynitride film (B) is formed on the protective insulating film as an interlayer insulating film 122. The silicon oxynitride film (B) is formed with a thickness of 500 to 1500 nm (preferably between 600 and 800 nm) in Embodiment 1 by introducing SiH$_4$ at 5 SCCM, N$_2$O at 120 SCCM, and H$_2$ at 500 SCCM, setting the reaction pressure to 40 Pa, the substrate temperature to 400° C., and the electric discharge power density to 0.4 W/cm$^2$.

Contact holes are then formed in the interlayer insulating layer 122 and the protective insulating layer 121, reaching the source region or the drain region of the TFT. Thus, source wirings 123 and 126, and drain wirings 124 and 125 are formed. Although not shown in the figures, in this embodiment, these electrodes are laminate films with a three layer structure of a 100 nm Ti film, a 300 nm aluminum film containing Ti, and a 150 nm Ti film formed in succession by sputtering.

Next, a silicon nitride film or a silicon oxynitride film is formed with a thickness of between 50 and 500 nm (typically from 100 to 300 nm) as a passivation film 127. If hydrogenation processing is performed in this state, then a desirable result of making the TFT characteristics better can be obtained. For example, it is appropriate to perform heat treatment for between 1 and 12 hours at 300 to 500° C. in an atmosphere containing 3 to 100% hydrogen. If the passivation film 127 is formed of a dense silicon nitride film and heat treatment is performed in this temperature range, then the hydrogen contained in the hydrogenated silicon oxynitride film forming the interlayer insulating film 122 is released, and the diffusion of hydrogen is prevented on the upper layer side by its being capped by the dense silicon nitride film. Therefore the released hydrogen preferentially diffuses to the lower layer side. Hydrogenation of the island-like semiconductor layers 104 and 105 can thus be performed by the hydrogen released from the hydrogenated silicon oxynitride film. Hydrogen is similarly released from the hydrogenated silicon oxynitride film used for the base film, and therefore the island-like semiconductor layers 104 and 105 are hydrogenated from both the lower and upper sides. Further, a similar result can be obtained by using plasma hydrogenation for the hydrogenation process.

An n-channel TFT 136 and a p-channel TFT 134 are thus completed on the substrate 101. The p-channel TFT 134 has a channel forming region 128, a source region 129, and a drain region 130 in the island-like semiconductor layer 104. The n-channel TFT 136 has a channel forming region 131, an LDD region 132 overlapping the gate electrode 115 (this type of LDD region is hereafter referred to as an Lov region), a source region 133, and a drain region 134 in an island-like semiconductor layer 105. The length of the Lov region in the channel length direction is set between 0.5 and 3.0 μm (preferably from 1.0 to 1.5 μm) for a channel length of 3 to 8 μm. Single gate structures are taken for the respective TFTs in FIGS. 4A to 4F, but double gate structures may also be used, and multi-gate structures in which a plural number of gate electrodes are formed may also be used without hindrance. In the completed TFT by stated above means, the S value can be made from 0.10 to 0.30 V/dec and V$_{th}$ can be made from 0.5 to 2.5 V in the n-channel TFT. In the p-channel TFT, the S value can be made from 0.10 to 0.30 V/dec and V$_{th}$ can be made in the range of −2.5 to −0.5 V.

[Embodiment 2]

Figure 5A:
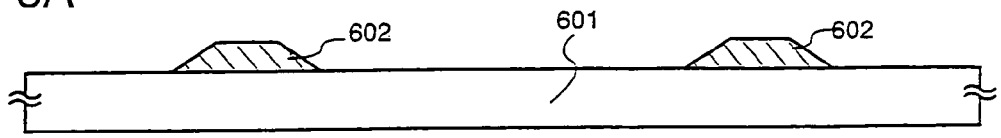
FIGS. 5A to 5E are sectional views showing a process for fabricating TFTs of inverse stagger type.

This embodiment will be described with reference to FIG. 5A–FIG. 7D. A glass substrate (for example, substrate #1737 manufactured by Corning Incorporated) is employed as a substrate 601. First, gate electrodes 602 are formed on the substrate 601. In an example here, a tantalum (Ta) film was formed to a thickness of 200 nm by sputtering. Alternatively, each of the gate electrodes 602 may well be formed as a two-layer structure which consists of a tantalum nitride (TaN) film (50 nm thick) and a Ta film (250 nm thick). The Ta film is formed by sputtering with Ar gas and by employing Ta as a target. In this regard, when sputtering is performed with a mixed gas in which Xe gas is added to the Ar gas, the absolute value of an internal stress can be made $2\times10^8$ Pa or less (FIG. 5A).

Figure 5B:
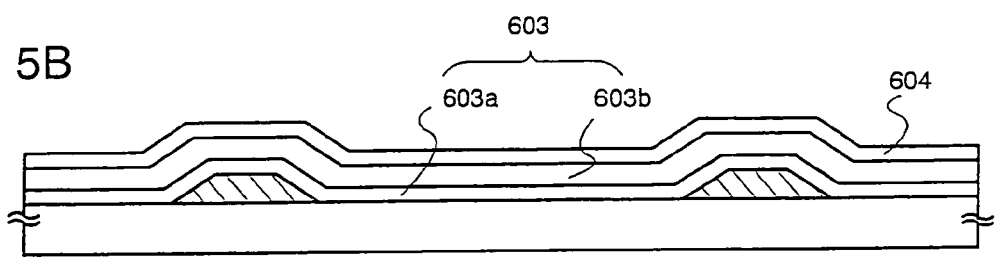

Subsequently, a gate insulating film 603 is formed. The gate insulating film 603 is endowed with a multi-layer structure which consists of a silicon oxynitride film (A) and a silicon oxynitride film (B) as viewed from the gate electrode (602) side. Film forming conditions conform to the conditions listed in Table 1, and the silicon oxynitride film (A) is formed under the conditions #210, while the silicon oxynitride film (B) is formed under the conditions #212. In FIG. 5B, a gate insulating film 603a is the silicon oxynitride film (A) which is formed to a thickness of 25 nm, while a gate insulating film 603b is the silicon oxynitride film (B)

which is formed to a thickness of 125 nm. These films can be easily stacked merely by changing-over the flow rates of gases $SiH_4$, $N_2O$ and $H_2$, and they can be formed by the plasma CVD equipment shown in FIG. 2A or 2B.

Further, an amorphous semiconductor layer 604 can be successively formed in the same reaction chamber as the chamber having formed the silicon oxynitride films. The amorphous semiconductor layer 604 is also formed using $SiH_4$, $H_2$, etc. by plasma CVD, and merely the reaction gases may be changed-over. The thickness of the amorphous semiconductor layer 604 is set at 20 nm–100 nm, preferably 40 nm–75 nm. When the gate insulating film and the amorphous semiconductor layer are successively formed in this manner, the contaminations (contaminations with organic matters and with B, P etc.) of interfaces attributed to exposure to the air can be prevented to relieve the discrepancy of the characteristics of TFTs to-be-fabricated (FIG. 5B).

Figure 5C:
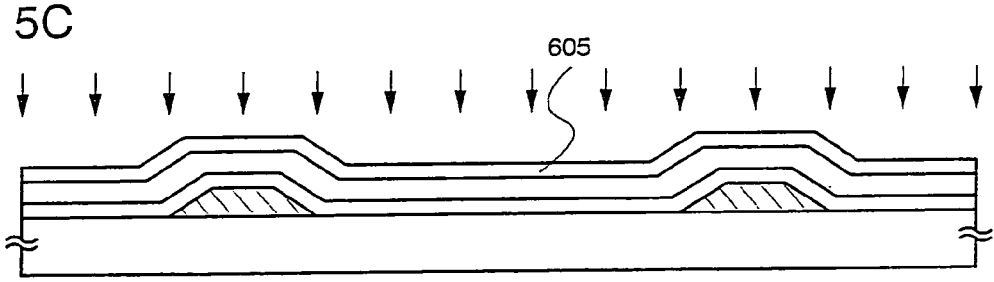

Subsequently, the resulting substrate structure is heat-treated at 450° C.–550° C. for 1 hour by employing an annealing furnace, whereby hydrogen is emitted from the amorphous semiconductor layer 604 until the quantity of remaining hydrogen becomes 5 atomic % or less. Thereafter, laser annealing or thermal annealing may be employed. In the case of the laser annealing, the emergent beam of, for example, a KrF excimer laser (at a wavelength of 248 nm) is defined into a rectilinear beam, and the surface of the substrate structure is irradiated with the rectilinear beam under the conditions of a lasing pulse frequency of 30 Hz, a laser energy density of 100–500 mJ/cm² and a scanning-beam overlap proportion of 96%, whereby the amorphous semiconductor layer is crystallized (FIG. 5C).

Figure 5D:
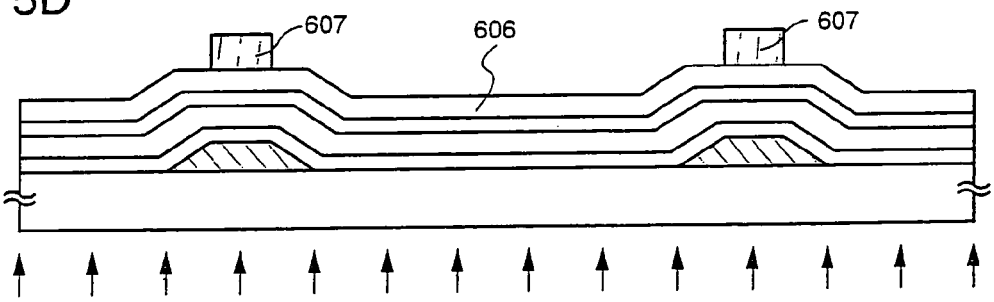

A silicon oxynitride film 606 to serve as channel protective films is formed in close touch with a crystalline semiconductor layer 605 thus formed. The silicon oxynitride film 606 may be formed in conformity with either of the conditions #211 and #212 mentioned in Table 1, and it is set at a thickness of 200 nm. In a case where the plasma cleaning treatment mentioned in Table 1 is performed in the reaction chamber of the plasma CVD equipment before the formation of the silicon oxynitride film 606, so as to process the surface of the crystalline semiconductor layer 605, the discrepancy of threshold voltages $V_{th}$ being the characteristics of the TFTs can be relieved. Thereafter, resist masks 607 are formed on the silicon oxynitride film 606 in self-alignment manner in accordance with patterning based on light exposure from the back side of the resulting substrate structure and by employing the gate electrodes 602 as masks. In the example, since light propagated round, the width of the resist mask 607 became slightly smaller than that of the gate electrode (FIG. 5D).

Figure 5E:
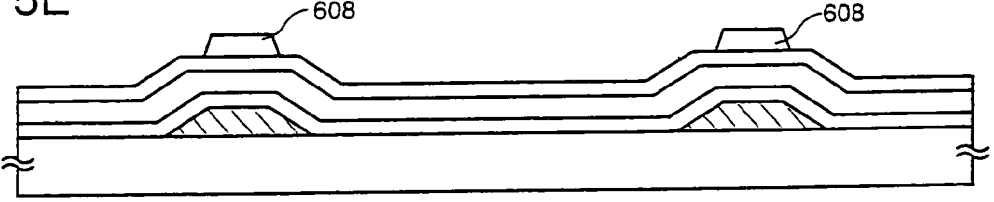

The silicon oxynitride film 606 is etched using the resist masks 607, thereby to form the channel protective films 608, whereupon the resist masks 607 are removed. Owing to this step, the surface parts of the crystalline semiconductor layer 605 except the areas thereof lying in touch with the channel protective films 608 are denuded. The channel protective films 608 function to prevent impurities from being introduced into channel regions at later steps of impurity doping, and they are also effective to lower the interface state density of the crystalline semiconductor layer 605 (FIG. 5E).

Next, resist masks 609 which cover a part of the n-channel TFT and the entire area of the p-channel TFT, respectively, are formed by patterning with a photo-mask, and the step of doping the denuded surface regions of the crystalline semiconductor layer 605 with an impurity element bestowing the n-conductivity type is carried out to form n⁺ regions 610a.

Figure 6A:
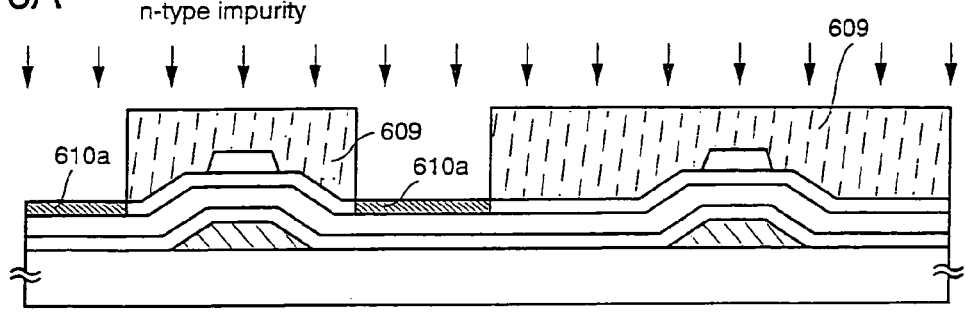
FIGS. 6A to 6E are sectional views showing the subsequent steps of the process for fabricating the inverse stagger type TFTs.

In the example here, the denuded surface regions were doped with phosphorus (P) by employing phosphine ($PH_3$) and under the conditions of a dose of $5 \times 10^{14}$ atoms/cm² and an acceleration voltage of 10 kV in accordance with ion doping. Besides, a person in charge sets the patterns of the resist masks 609 properly, whereby the widths of the n⁺ regions 610a are determined, so that n⁻-type regions and the channel forming regions having desired widths can be formed (FIG. 6A).

Figure 6B:
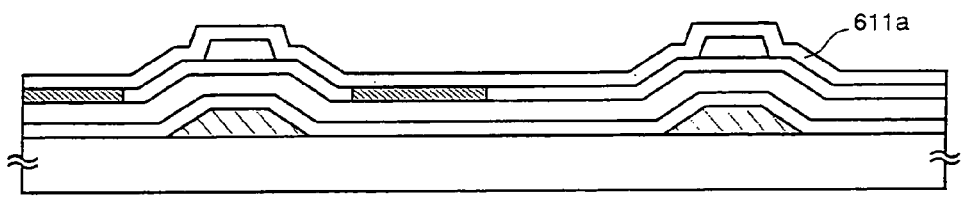

After the resist masks 609 have been removed, a protective insulating film 611a is formed. This film is also a silicon oxynitride film manufactured under the conditions #211 or #212 mentioned in Table 1, and it is formed to a thickness of 50 nm (FIG. 6B).

Figure 6C:
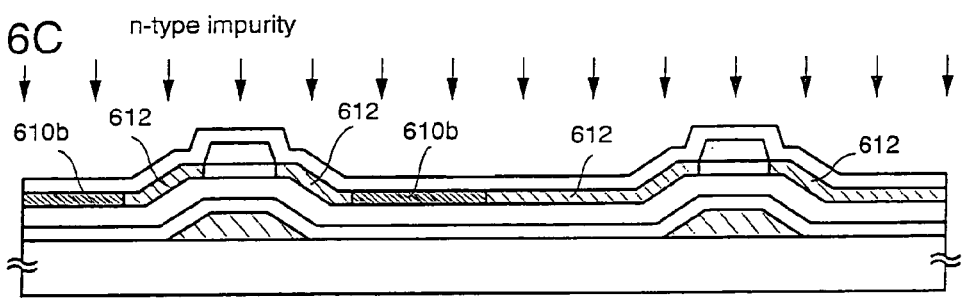

Subsequently, the step of doping the crystalline semiconductor layer 605 whose surface is provided with the protective insulating film 611a, with an impurity element bestowing the n-conductivity type is carried out to form the n⁻-type regions 612. Since the crystalline semiconductor layer 605 is doped with the impurity through the protective insulating film 611a overlying it, conditions need to be properly set in consideration of the thickness of the protective insulating film 611a. In the example here, the conditions may be set at a dose of $3 \times 10^{13}$ atoms/cm² and an acceleration voltage of 60 kV. The n⁻-type regions 612 which are between source and drain regions 610b function as LDD regions (FIG. 6C).

Figure 6D:
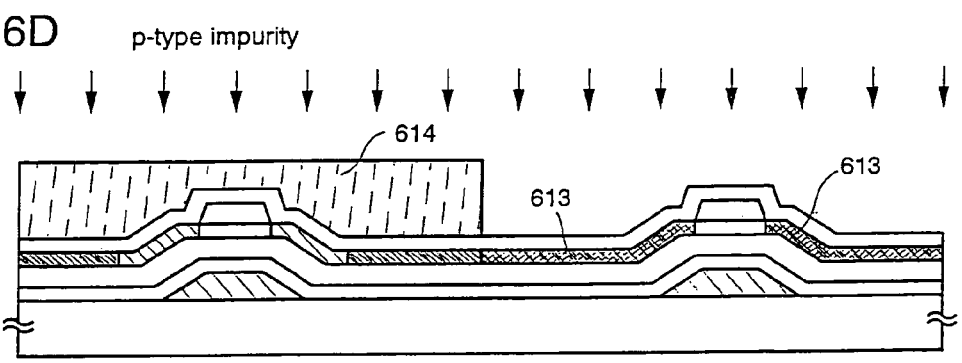
Figure 6E:
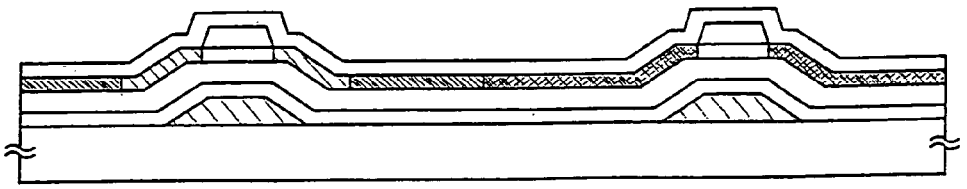
Figure 7A:
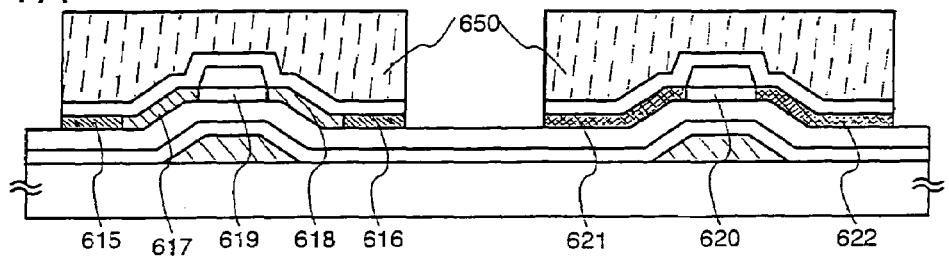
FIGS. 7A to 7D are sectional views showing the still subsequent steps of the process for fabricating the inverse stagger type TFTs.

Subsequently, a resist mask 614 which covers the n-channel TFT is formed, and the step of doping a domain where the p-channel TFT is to be formed, with an impurity element bestowing the p-conductivity type is carried out. Here, the domain is doped with boron (B) by employing diborane $B_2H_6$) and in accordance with ion doping. Thus, p⁺ regions 613 are formed under the conditions of a dose of $4 \times 10^{15}$ atoms/cm² and an acceleration voltage of 30 kV (FIG. 6D). Further, the step of activating the impurity elements is performed by laser annealing or thermal annealing (FIG. 6E). Thereafter, the crystalline semiconductor layer is etched into desired shapes by known patterning techniques using resist masks 650 so that the channel protective films 608 and the protective insulating film 611a may be left as they are (FIG. 7A).

Figure 7B:
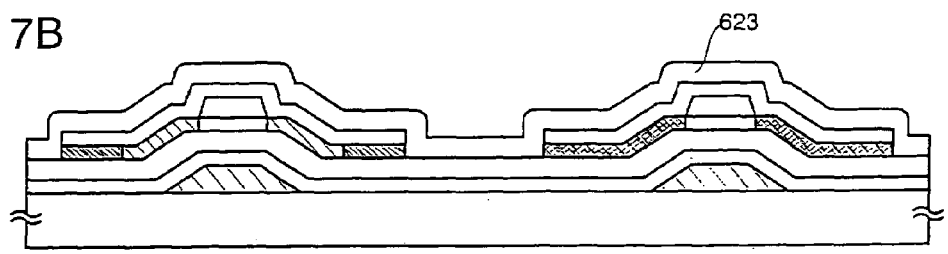
Figure 7C:
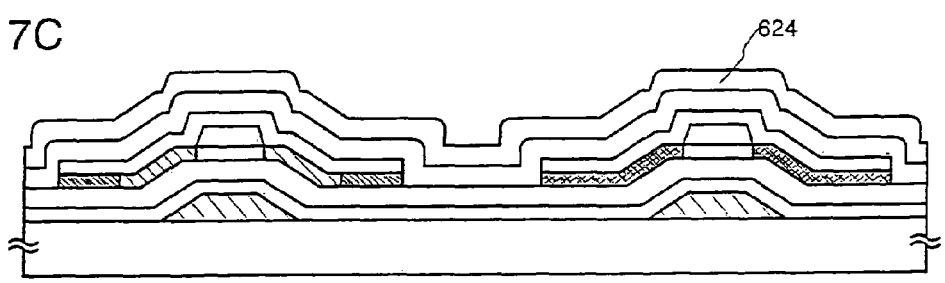

Via the above steps, the source region 615, drain region 616, LDD regions 617, 618 and channel forming region 619 of the n-channel TFT are formed, and the source region 621, drain region 622 and channel forming region 620 of the p-channel TFT are formed. At the next step, a first interlayer insulating film 623 is formed covering the n-channel TFT and the p-channel TFT. The first interlayer insulating film 623 is made of a silicon oxynitride film manufactured under the conditions #211 or #212 mentioned in Table 1, and it is formed to a thickness of 100 nm–500 nm (FIG. 7B). Besides, a second interlayer insulating film 624 is similarly formed of a silicon oxynitride film manufactured under the conditions #211 mentioned in Table 1, to a thickness of 100 nm–500 nm (FIG. 7C).

In this state, the step of first hydrogenation is carried out. This step may be, for example, a heat treatment which is performed at 300° C.–550° C., preferably 350° C.–500° C., for 1–12 hours in an atmosphere containing 3–100% of hydrogen. Alternatively, a treatment may well be performed at similar temperatures for 10–60 minutes in a hydrogen-containing atmosphere turned into a plasma. Hydrogen contained in the first interlayer insulating film 623, and hydrogen supplied into the second interlayer insulating film 624 from within the vapor phase on account of the heat-treating atmosphere are diffused by the heat treatment, and some of the diffused hydrogen atoms arrive at the semiconductor layer 605, so that the hydrogenation of the crystalline semiconductor layer 605 can be effectively done.

Figure 7D:
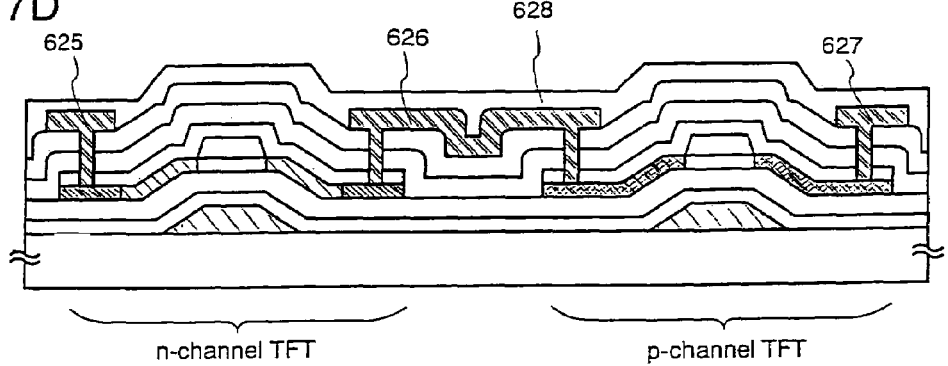

The first interlayer insulating film 623 and second interlayer insulating film 624 are thereafter formed with predetermined resist masks, and provided with contact holes reaching the source regions and drain regions of the respective TFTs by an etching process. Besides, source lines 625, 627 and a drain line 626 are formed. Although no illustration is made, each of the wiring lines is employed in this embodiment as an electrode of three-layer structure in which a Ti film 100 nm thick, a Ti-containing Al film 300 nm thick and a Ti film 150 nm thick are successively formed by sputtering (FIG. 7D).

Further, a passivation film 628 is formed of a silicon nitroxide film manufactured from $SiH_4$, $N_2O$ and $NH_3$ by plasma CVD, or a silicon nitride film manufactured from $SiH_4$, $N_2$ and $NH_3$. On this occasion, when a plasma hydrogenation treatment is performed by introducing $N_2O$, $N_2$, $NH_3$ etc. in advance of the formation of the film, hydrogen generated in the vapor phase by the creation of a plasma is supplied into the second interlayer insulating film 624. Moreover, when the substrate structure is kept heated at 200° C.–500° C., hydrogen can be diffused into the first interlayer insulating film 623 and further into the lower layer side. Such a treatment can be performed as the step of second hydrogenation. Although the manufactural conditions of the passivation film are not especially restricted, a dense film should desirably be formed. Lastly, the step of third hydrogenation is carried out in such a way that a heat treatment at 300° C.–550° C. is performed for 1–12 hours in an atmosphere containing hydrogen or nitrogen. On this occasion, hydrogen is diffused from the passivation film 628 into the second interlayer insulating film 624, from the second interlayer insulating film 624 into the first interlayer insulating film 623, and from the first interlayer insulating film 623 into the crystalline semiconductor layer 605, whereby the hydrogenation of the crystalline semiconductor layer 605 can be effectively done. Although hydrogen is also emitted from within the films into the vapor phase, the emission is preventable to some extent when the passivation film is formed of the dense film beforehand. Also, the emission can be compensated when hydrogen is kept fed into the atmosphere.

Owing to the above steps, the p-channel TFT and the n-channel TFT can be formed as the structure of inverse stagger type on the identical substrate. Even in the inverse stagger type TFT, the shift of the threshold voltage $V_{th}$ can be relieved by applying the silicon oxynitride film of the present invention to the gate insulating film 603b. By way of example, in the n-channel TFT, the S value (sub-threshold constant) can be brought into a range of 0.10 V/dec–0.30 V/dec, and the voltage $V_{th}$ into a range of 0.5 V–2.5 V. Besides, in the p-channel TFT, the S value can be brought into a range of 0.10 V/dec–0.30 V/dec, and the voltage $V_{th}$ into a range of –0.5 V—–2.5 V.

Such characteristics can be regarded as based on the synergy between the gate insulating film of the present invention, in which the silicon oxynitride films (A) and (B) are stacked or whose composition is continuously changed, and the steps of hydrogenation indicated in this embodiment. They can be attained by combining the silicon oxynitride films (A) and (B) which are thermally stable when stacked on the semiconductor layer as studied in Embodiment 1.

[Embodiment 3]

In this embodiment, a method of simultaneously fabricating the pixel TFT and storage capacitor of a pixel unit and the TFTs of a driver circuit disposed outside the periphery of the pixel unit will be described in detail in accordance with the processing steps of the method.

Referring to FIG. 8A, a substrate 801 may be a glass substrate of barium borosilicate glass, alumino-borosilicate glass or the like, typified by Glass #7059 or Glass #1737 of Corning Incorporated, or a plastics substrate of plastics having no optical anisotropy, such as polyethylene terephthalate (PET), polyethylene naphthalate (PEN) or polyether sulfone (PES). In the case of employing the glass substrate, it may well be previously heat-treated at a temperature which is about 10° C.–20° C. lower than the strain point of the glass. On that surface of the substrate 801 over which the TFTs are to be formed, a base film 802 which includes an insulating film, such as silicon oxide film, silicon nitride film or silicon oxynitride film, is formed in order to prevent any impurity from diffusing from the substrate 801. By way of example, the base film 802 is formed by stacking a silicon oxynitride film (C) 802a manufactured from $SiH_4$, $NH_3$ and $N_2O$ to a thickness of 10 nm–200 nm (preferably, 50 nm–100 nm) by plasma CVD, and a silicon oxynitride film (A) 802b similarly manufactured from $SiH_4$ and $N_2O$ to a thickness of 50 nm–200 nm (preferably, 100 nm–150 nm). Although the base film 802 has been indicated as the two-layer structure here, it may well be formed of the single layer of the above insulating film or by stacking three or more of such insulating films.

Subsequently, a semiconductor layer 803a having an amorphous structure is formed to a thickness of 25 nm–80 nm (preferably, 30 nm–60 nm) by a known method such as plasma CVD or sputtering. By way of example, an amorphous silicon film is formed to a thickness of 55 nm by plasma CVD. A semiconductor film having the amorphous structure includes an amorphous semiconductor layer and a microcrystal semiconductor film, and a compound semiconductor film having the amorphous structure, such as amorphous silicon germanium film, may well be applied. Also, both the base film 802 and the amorphous semiconductor layer 803a can be successively formed in an identical reaction chamber by employing the equipment as shown in FIG. 2A or 2B. By way of example, they can be successively formed without exposing the substrate structure to the atmosphere once, by changing-over the reaction gases from $SiH_4$, $N_2O$ and $H_2$ to $SiH_4$ and $H_2$ or to only $SiH_4$ after the silicon oxynitride film (C) 802a and the silicon oxynitride film (A) 802b have been successively formed by the plasma CVD as stated before. As a result, it is possible to prevent the surface of the hydrogenated silicon oxynitride film 802b from being contaminated, and to relieve the discrepancy of the characteristics and the fluctuations of the threshold voltages of the TFTs to-be-fabricated.

Besides, the step of crystallization is performed to manufacture a crystalline semiconductor layer 803b from the amorphous semiconductor layer 803a. Laser annealing, thermal annealing (solid-phase growth) or rapid thermal annealing (RTA) is applicable as a method for the crystallization. In the case of employing the glass substrate or the plastics substrate of inferior refractoriness as stated before, the application of the laser annealing is especially favorable. In the RTA, an infrared lamp, a halogen lamp, a metal halide lamp, a xenon lamp or the like is employed as a light source. Alternatively, the crystalline semiconductor layer 803b can be formed by a crystallizing method employing a catalyst element, in conformity with technique disclosed in the official gazette of Japanese Patent Application Laid-open No. 7-130652. At the crystallizing step, hydrogen contained in the amorphous semiconductor layer 803a should preferably be emitted beforehand. More specifically, the surface of the crystalline semiconductor layer 803b can be favorably prevented from roughening, when the amorphous semiconductor layer 803a is crystallized after a heat treatment at 400° C.–500° C. for about 1 hour is performed to bring its hydrogen content to 5 atomic % or less.

Further, when the step of forming the amorphous silicon film by plasma CVD is such that $SiH_4$ and argon (Ar) are employed as reaction gases and that a substrate temperature during the film formation is held at 400° C.–450° C., the hydrogen content of the amorphous silicon film can be made 5 atomic % or less. In such a case, the heat treatment for emitting hydrogen is dispensed with.

In the case of performing the crystallization based on laser annealing, an excimer laser or an argon laser of pulsed lasing type or continuous emission type is employed as a light source. In the case of employing the pulsed lasing type excimer laser, emergent light is defined into a rectilinear beam. Although a person in charge properly selects the conditions of the laser annealing, a pulsed lasing frequency of 30 Hz and a laser energy density of 100 $mJ/cm^2$–500 $mJ/cm^2$ (typically, 300 $mJ/cm^2$–400 $mJ/cm^2$) may be set by way of example. The whole surface of the substrate structure is irradiated with the rectilinear beam, and a scanning-beam overlap proportion at this time is set at 80%–98%. Thus, the crystalline semiconductor layer 803b can be obtained as shown in FIG. 8B.

Thereafter, the crystalline semiconductor layer 803b is overlaid with a resist pattern by employing a first photo-mask (PM1) and in conformity with photolithographic techniques, and it is divided into insular shapes by dry etching, thereby to form insular semiconductor layers 804–808 as shown in FIG. 8C. A mixed gas consisting of $CF_4$ and $O_2$ is employed for the dry etching of the crystalline silicon layer.

The whole surfaces of the insular semiconductor layers 804–808 may well be doped with an impurity element for bestowing the p-conductivity type, at a concentration of about $1 \times 10^{16}$–$5 \times 10^{17}$ atoms/$cm^3$ in order to control the threshold voltages $V_{th}$ of the TFTs. The elements of Group-13 of the periodic table, such as boron (B), aluminum (Al) and gallium (Ga), are known as the impurity elements which bestow the p-conductivity type on semiconductors. Although ion implantation or ion doping (or ion shower doping) can be employed as a method for the doping, the ion doping is suitable for processing a substrate of large area. In the ion doping, diborane ($B_2H_6$) is employed as a source gas, and the insular semiconductor layers 804–808 are doped with boron (B). Such introduction of the impurity element is not always necessary, but it may well be omitted. However, it is a technique well suited especially for the purpose of confining the threshold voltage of the n-channel TFT within a predetermined range. Also in this case, the plasma cleaning treatment which is performed before the formation of a gate insulating film is effective, and it may be performed in conformity with the conditions mentioned in Table 1.

Subsequently, the gate insulating film 809 is formed as shown in FIG. 8C. In order to prevent the threshold voltages $V_{th}$ of the TFTs from shifting and to enhance stabilities against a bias stress and heat, the gate insulating film 809 is formed on the basis of the manufactural conditions listed in Table 1 and by controlling the flow rates of the gases $SiH_4$, $N_2O$ and $H_2$ with mass flow controllers in order that the composition of the film 809 may be continuously changed from the composition of the silicon oxynitride film (B) to the composition of the silicon oxynitride film (A) as viewed from the sides of the insular semiconductor layers 804–808. In FIG. 8C, a level at which the composition exhibits just the middle value thereof is indicated by a broken line. The level may be the central position of the thickness of the film 809, or may well be nearer to the semiconductor layer sides or gate electrode sides. The manufactural conditions of the gate insulating film 809 are the same as in Embodiment 1.

Further, as shown in FIG. 8D, the gate insulating film 809 is overlaid with a refractory electrically-conductive layer for forming gate electrodes. The refractory conductive layer may be formed of a single layer, but it may well be formed as a multilayer structure consisting of a plurality of layers, such as two layers or three layers, at need. In this embodiment, an electrically conductive layer (A) 810 is formed of a W film, and an electrically conductive layer (B) 811 is formed of a WN film and is stacked on the layer (A) 810. The conductive layer (B) 811 may alternatively be formed of tungsten silicide. Since the W film is high in refractoriness, it is well suited for the gate electrode. However, when the surface of the W film has oxidized to become high in resistance, the contact resistance thereof with a wiring line which is to be formed thereon heightens. This drawback is prevented by overlaying the conductive layer (A) 810 with the conductive layer (B) 811 which is formed of the WN film or tungsten silicide layer being comparatively stable.

The conductive layer (A) 810 is set at a thickness of 200 nm–400 nm (preferably, 250 nm–350 nm), and the conductive layer (B) 811 at a thickness of 10 nm–50 nm (preferably, 20 nm–30 nm). In the case of forming the gate electrodes of W, the conductive layer (A) 810 is formed of the W film to a thickness of, for example, 250 nm by sputtering with W as a target and by introducing Ar. The WN film is formed to a thickness of 50 nm by introducing Ar and nitrogen. As another method, the W film can be formed by employing tungsten hexafluoride ($WF_6$) and in accordance with thermal CVD. Anyway, a low resistance needs to be attained, and the resistivity of the W film should desirably be 20 [$\mu\Omega cm$] or less. Although the W film can have its resistivity lowered by enlarging crystal grains, the crystallization of this film is hampered to heighten the resistance thereof in a case where impurity elements such as oxygen are contained much in the W film. With the sputtering, therefore, the W film is formed by employing a W target which has a purity of 99.9999%, and by taking religious care that impurities do not mix from within the vapor phase during the film formation. Thus, a resistivity of 9–20 [$\mu\Omega cm$] can be realized.

Subsequently, resist masks 812–817 are formed by employing a second photo-mask (PM2) and in conformity with photolithographic techniques, and the conductive layer (A) 810 and conductive layer (B) 811 are collectively etched, thereby to form the gate electrodes 818–822 and capacitor wiring line 823. The gate electrodes 818–822 and capacitor wiring line 823 are such that parts 818a–823a made from the conductive layer (A) and parts 818b–823b made from the conductive layer (B) are unitarily formed (FIG. 9A).

On this occasion, the etching is performed so that tapered portions may be formed at the end parts of, at least, the gate electrodes 818–822. The etching process is implemented by an ICP etching equipment. Regarding concrete etching conditions, a mixed gas consisting of $CF_4$ and $Cl_2$ is employed as an etching gas, and the flow rates of the $CF_4$ and $Cl_2$ gases are respectively set at 30 SCCM. Further, a discharge power density is set at 3.2 W/$cm^2$ (at 13.56 MHz), a bias power density at 224 mW/$cm^2$ (at 13.56 MHz), and a pressure at 1.0 Pa. Owing to such etching conditions, the end parts of the gate electrodes 818–822 are respectively formed with the tapered portions in each of which a thickness gradually increases inwards from the corresponding end part, and the angles of which are set at 5°–35°, preferably 10°–25°. The angle of each tapered portion is that of a portion indicated by θ in FIG. 11. This angle greatly affects the concentration gradient of a low-concentration n-type impurity region which forms an LDD region later. Incidentally, the angle θ of the tapered portion is expressed as Tan(θ)=HG/WG in terms of the length (WG) of the tapered portion and the thickness (HG) thereof.

Besides, overetching in which an etching time is increased at a rate of about 10%–20% is carried out in order to etch the conductive layers (A) and (B) without leaving any residue behind. On this occasion, however, attention needs to be paid to the selection ratio of etching relative to the underlying layer. By way of example, the selection ratio of the silicon oxynitride film (the gate insulating film 809) relative to the W film is 2–4 (typically, 3). Therefore, the denuded surface of the silicon oxynitride film is etched about 20 nm–50 nm by such an overetching process, and this film is, in effect, thinned to form a gate insulating film 830 of new shape.

Besides, in order to form the LDD regions of the pixel TFT and the n-channel TFTs of the driver circuit, the insular semiconductor layers 804–808 are doped with an impurity element bestowing the n-conductivity type. The resist masks 812–817 used for forming the gate electrodes 818–822 are left intact, and the impurity element bestowing the n-conductivity type is introduced in self-alignment manner by ion doping in which the gate electrodes 818–822 having the tapered portions at their end parts are used as masks. Here, the impurity element bestowing the n-conductivity type is introduced through the gate insulating film 830 as well as the end sides of the tapered portions at the end parts of the gate electrodes 818–822, so as to reach the semiconductor layers 804–808 underlying the film 830, etc. Therefore, a dose is set at $1\times10^{13}$–$5\times10^{14}$ atoms/cm$^2$, and an acceleration voltage is set at 80 keV–160 keV. An element belonging to Group-15 of the periodic table, typically phosphorus (P) or arsenic (As), is employed as the impurity element which bestows the n-conductivity type. In an example here, the element phosphorus (P) was employed. Owing to such ion doping, the semiconductor layers 804–808 are doped with the element phosphorus (P) in a concentration range of $1\times10^{16}$–$1\times10^{19}$ atoms/cm$^3$. In this way, the low-concentration n-type impurity regions 824–829 are formed in the insular semiconductor layers 804–808 as shown in FIG. 9B.

The concentration gradients of phosphorus (P) contained in, at least, those parts of the low-concentration n-type impurity regions 824–828 which are overlapped by the gate electrodes 818–822, reflect the thickness changes of the tapered portions of these gate electrodes 818–822. That is, the concentration of the element phosphorus (P) introduced in each of the low-concentration n-type impurity regions 824–828 gradually heightens toward the end part of the corresponding gate electrode in the region overlapped by this gate electrode. The reason therefor is that the concentration of the element phosphorus (P) reaching the semiconductor layer changes, depending upon the difference of the thickness of the tapered portion. By the way, in FIG. 9B, the end parts of the low-concentration n-type impurity regions 824–829 are depicted to be oblique. The depiction does not directly indicate the regions doped with the element phosphorus (P), but it expresses the fact that the phosphorus concentrations change along the shapes of the tapered portions of the gate electrodes 818–822, etc.

Subsequently, high-concentration n-type impurity regions which function as source regions or drain regions in the n-channel TFTs are formed. The resist masks 812–817 are left behind, and phosphorus (P) is introduced under the condition of a low acceleration voltage of 10 keV–30 keV by ion doping in which the gate electrodes 818–822, etc. serve as masks for blocking the element phosphorus (P), this time. At this time, resist masks 855 to 857 are formed by using a third photo-mask (PM3). In this way, the high-concentration n-type impurity regions 831–836 are formed. The parts of the gate insulating film 830 corresponding to these regions 831–836 have been thinned from the initial thickness of 120 nm and have become 70 nm–100 nm, because of the overetching at the formation of the gate electrodes as explained before. Therefore, the element phosphorus (P) can be favorably introduced even under the condition of such a low acceleration voltage. Besides, the concentrations of the element phosphorus (P) in these regions are brought into a concentration range of $1\times10^{20}$–$1\times10^{21}$ atoms/cm$^3$ (FIG. 9C).

Further, high-concentration p-type impurity regions 840 and 841 to serve as source regions or drain regions are formed in the insular semiconductor layers 804 and 806 for forming the p-channel TFTs. Here, the high-concentration p-type impurity regions are formed in self-alignment manner by employing the gate electrodes 818, 820 as masks and introducing an impurity element which bestows the p-conductivity type. On this occasion, the insular semiconductor layers 805, 807, 808 for forming the n-channel TFTs are entirely covered with resist masks 837–839 which are formed using a fourth photo-mask (PM4). The impurity regions 840 and 841 here are formed by ion doping with diborane ($B_2H_6$). Besides, the boron (B) concentrations of the high-concentration p-type impurity regions 840$a$ and 841$a$ which are not overlapped by the gate electrodes are set at $3\times10^{20}$–$3\times10^{21}$ atoms/cm$^3$. On the other hand, the impurity regions 840$b$, 841$b$ which are overlapped by the gate electrodes are doped with the impurity element through the gate insulating film and the tapered portions of the gate electrodes. Therefore, they are, in effect, formed as low-concentration p-type impurity regions, which are set at concentrations of, at least, $1.5\times10^{19}$ atoms/cm$^3$. The high-concentration p-type impurity regions 840$a$, 841$a$ and the low-concentration p-type impurity regions 840$b$ and 841$b$ have been doped with phosphorus (P) at the preceding step, so that the high-concentration p-type impurity regions 840$a$, 841$a$ contain the element phosphorus (P) at the concentrations of $1\times10^{20}$–$1\times10^{21}$ atoms/cm$^3$, while the low-concentration p-type impurity regions 840$b$, 841$b$ contain the element phosphorus (P) at the concentrations of $1\times10^{16}$–$1\times10^{19}$ atoms/cm$^3$. However, quite no problem is incurred for the functions of the p-type impurity regions as the source regions and drain regions of the p-channel TFTs, for the reason that the concentration of the element boron (B) to be introduced at the step here is 1.5–3 times as high as the phosphorus (P) concentrations (FIG. 9D).

Figure 10A:
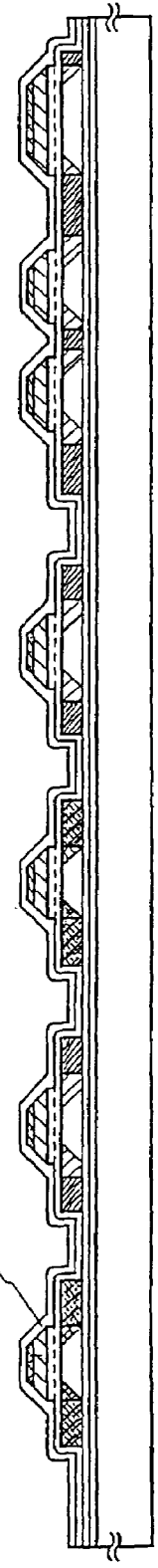
FIGS. 10A to 10C are sectional views showing the still subsequent steps of the process for fabricating the pixel TFT and the TFTs of the driver circuit.

Thereafter, as shown in FIG. 10A, a first interlayer insulating film 842 is formed covering the gate electrodes and the gate insulating film. The first interlayer insulating film 842 may be formed of a silicon oxide film, a silicon oxynitride film or a silicon nitride film, or a multilayer film in which such films are combined. Anyway, the first interlayer insulating film 842 is made of an inorganic insulator material. The thickness of the first interlayer insulating film 842 is set at 100 nm–200 nm. In the case of employing the silicon oxide film here, it can be formed by plasma CVD in which TEOS and $O_2$ are mixed, a reaction pressure is set at 40 Pa, a substrate temperature is set at 300° C.–400° C., and an electric discharge is generated at a high-frequency (13.56 MHz) power density of 0.5 W/cm$^2$–0.8 W/cm$^2$. Besides, in the case of employing the silicon oxynitride film, it may be a silicon oxynitride film manufactured from SiH$_4$, N$_2$O and NH$_3$ by plasma CVD, or a silicon oxynitride film manufactured from SiH$_4$ and N$_2$O. Manufactural conditions in this case are a reaction pressure of 20 Pa–200 Pa, a substrate temperature of 300° C.–400° C., and a high-frequency (60 MHz) power density of 0.1 W/cm$^2$–1.0 W/cm$^2$. Alternatively, a hydrogenated silicon oxynitride film manufactured from SiH$_4$, N$_2$O and H$_2$ may well be applied. The silicon nitride film can be similarly manufactured from SiH$_4$ and NH$_3$ by plasma CVD.

Figure 10B:
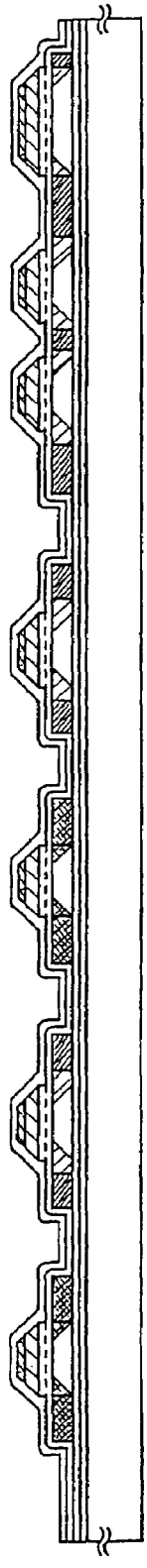

Thereafter, the step of activating the impurity elements bestowing the n-type and the p-type as introduced at the respective concentrations is carried out. This step is performed by thermal annealing which employs an annealing furnace. Alternatively, laser annealing or rapid thermal annealing (RTA) is applicable. The thermal annealing is implemented at a temperature of 400° C.–700° C., typically 500° C.–600° C., in a nitrogen atmosphere whose oxygen content is 1 ppm or less, preferably 0.1 ppm or less. In the example, a heat treatment was performed at 550° C. for 4 hours. Besides, in the case where the plastics substrate of low heat resistance is employed as the substrate 801, the laser annealing should preferably be applied (FIG. 10B).

Subsequently to the activating step, the atmosphere gas is changed to an atmosphere containing 3%–100% of hydrogen, in which a heat treatment is performed at 300° C.–450° C. for 1–12 hours, thereby to implement the step of hydrogenating the insular semiconductor layers. At this step, dangling bonds existing at a density of $10^{16}$/cm$^3$–$10^{18}$/cm$^3$ in the insular semiconductor layers are terminated with hydrogen atoms excited thermally. Plasma hydrogenation (which employs hydrogen excited by a plasma) may well be performed as another expedient for the hydrogenation. Anyway, defect densities in the insular semiconductor layers 804–808 should desirably be set at $10^{16}$/cm$^3$, and hydrogen may be afforded about 0.01–0.1 atomic % for that purpose.

After the activating and hydrogenating steps have ended, a second interlayer insulating film 843 made of an organic insulator material is formed having an average thickness of 1.0 μm–2.0 μm. Usable as the organic resin is polyimide, an acrylic resin, polyamide, polyimide amide, BCB (benzocyclobutene), or the like. By way of example, in the case of employing polyimide of the type which is applied onto the resulting substrate structure and is thereafter thermally polymerized, the film 843 is formed by baking at 300° C. in a clean oven. Besides, in the case of employing an acrylic resin, the film 843 can be formed in such a way that the acrylic resin of two-fluid type is employed, that a base material and a hardener are mixed, that the mixed solution is applied onto the whole surface of the substrate structure by a spinner, that the coating is preliminarily heated at 80° C. for 60 seconds by a hot plate, and that the coating is baked at 250° C. for 60 minutes by a clean oven.

In this manner, the second interlayer insulating film is formed of the organic insulator material, whereby the surface of the resulting substrate structure can be flattened favorably. Moreover, the organic resin material is usually low in permittivity and can lower a parasitic capacitance. Since, however, the organic resin material is hygroscopic, it is not suitable for a protective film. As in this embodiment, therefore, it may be used in combination with the silicon oxide film, the silicon oxynitride film, the silicon nitride film, or the like formed as the first interlayer insulating film 842.

Thereafter, resist masks in a predetermined pattern are formed by employing a fifth photo-mask (PM5), and contact holes reaching the source regions and drain regions formed in the respective insular semiconductor layers are provided. The contact holes are formed by dry etching. In this case, the second interlayer insulating film 843 made of the organic resin material is first etched by employing a mixed gas consisting of CF$_4$, O$_2$ and He, as an etching gas, and the first interlayer insulating film 842 is thereafter etched by employing a mixed gas consisting of CF$_4$ and O$_2$, as an etching gas. Further, the etching gas is changed-over to CHF$_3$ in order to heighten a selection ratio relative to the insular semiconductor layers, and the gate insulating film 830 is etched. Thus, the contact holes can be formed favorably.

Besides, a metal film being electrically conductive is formed by sputtering or vacuum evaporation, a resist mask pattern is formed using a sixth photo-mask (PM6), and source lines 844–848 and drain lines 849–852 are formed by etching. Here, a part 853 functions as a pixel electrode. Numeral 854 designates a pixel electrode which belongs to an adjacent pixel. Although no illustration is made, the wiring lines are formed in this embodiment as stated below. A Ti film is formed to a thickness of 50 nm–150 nm, contacts are established with those semiconductor films of the insular semiconductor layers which form the source and drain regions, aluminum (Al) is deposited on the Ti film to a thickness of 300 nm–400 nm (indicated at 844a–854a in FIG. 10C), and a transparent electrically-conductive film is further stacked on the Al layer to a thickness of 80 nm–120 nm (indicated at 844b–854b in FIG. 10C). An indium oxide—zinc oxide alloy (In$_2$O$_3$- ZnO) alloy and zinc oxide (ZnO) are suitable materials for the transparent conductive film. Further, a material (ZnO:Ga) in which zinc oxide is doped with gallium (Ga), etc. can be suitably employed in order to attain a higher transmittance for visible light and a higher electric conductivity.

In this way, the structure in which the TFTs of the driver circuit and the pixel TFT of the pixel unit are formed on the identical substrate can be completed using the six photo-masks. The driver circuit is formed with the first p-channel TFT (A) 200a, the first n-channel TFT (A) 201a, the second p-channel TFT (A) 202a and the second n-channel TFT (A) 203a, while the pixel unit is formed with the pixel TFT 204 and the storage capacitance 205. Here in this specification, such a substrate shall be called "active matrix substrate" for the sake of convenience.

The first p-channel TFT (A) 200a of the driver circuit has such a structure that the channel forming region 206, the LDD regions 207 overlapped by the gate electrode 818, and the source region 208 and drain region 209 formed of the high-concentration p-type impurity regions are included in the insular semiconductor layer 804. The first n-channel TFT (A) 201a is such that the channel forming region 210, the LDD regions 211 formed of the low-concentration n-type impurity region and overlapped by the gate electrode 819, and the source region 212 and drain region 213 formed of the high-concentration n-type impurity regions are included in the insular semiconductor layer 805. For a channel length of 3 μm–7 μm, the LDD region (denoted by "$L_{ov}$") overlapped by the gate electrode 819 has a length of 0.1 μm–1.5 μm, preferably 0.3 μm–0.8 μm, in the direction of the channel length. The length of the region $L_{ov}$ is controlled on the basis of the thickness of the gate electrode 819 and the angle θ of the tapered portion (the angle defined in FIG. 11).

Figure 10C:
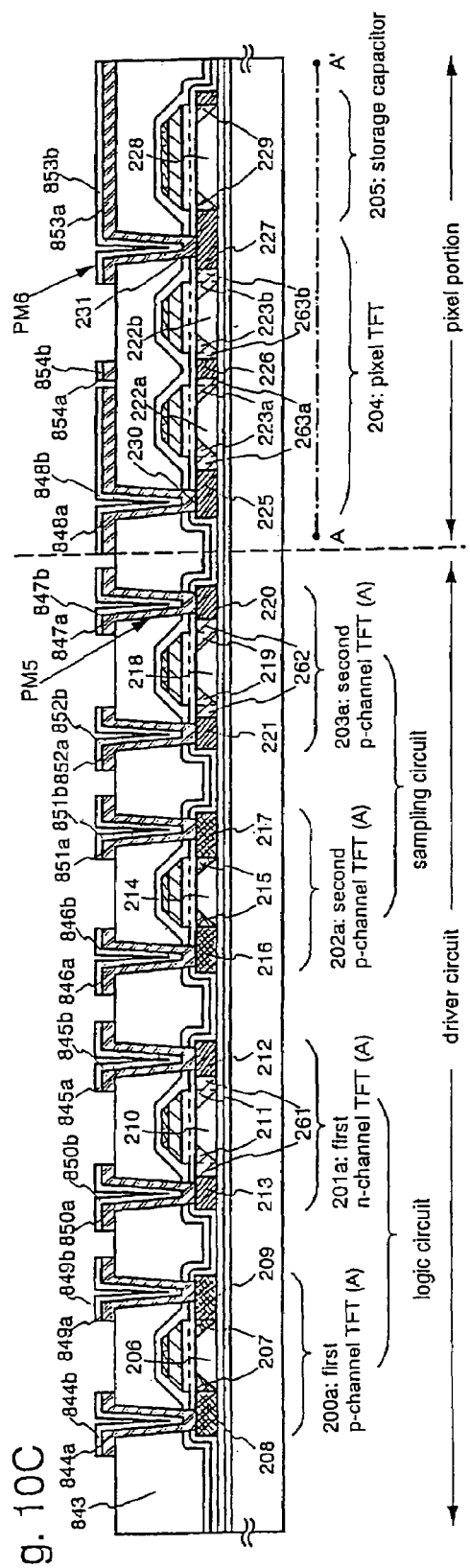
Figure 11:
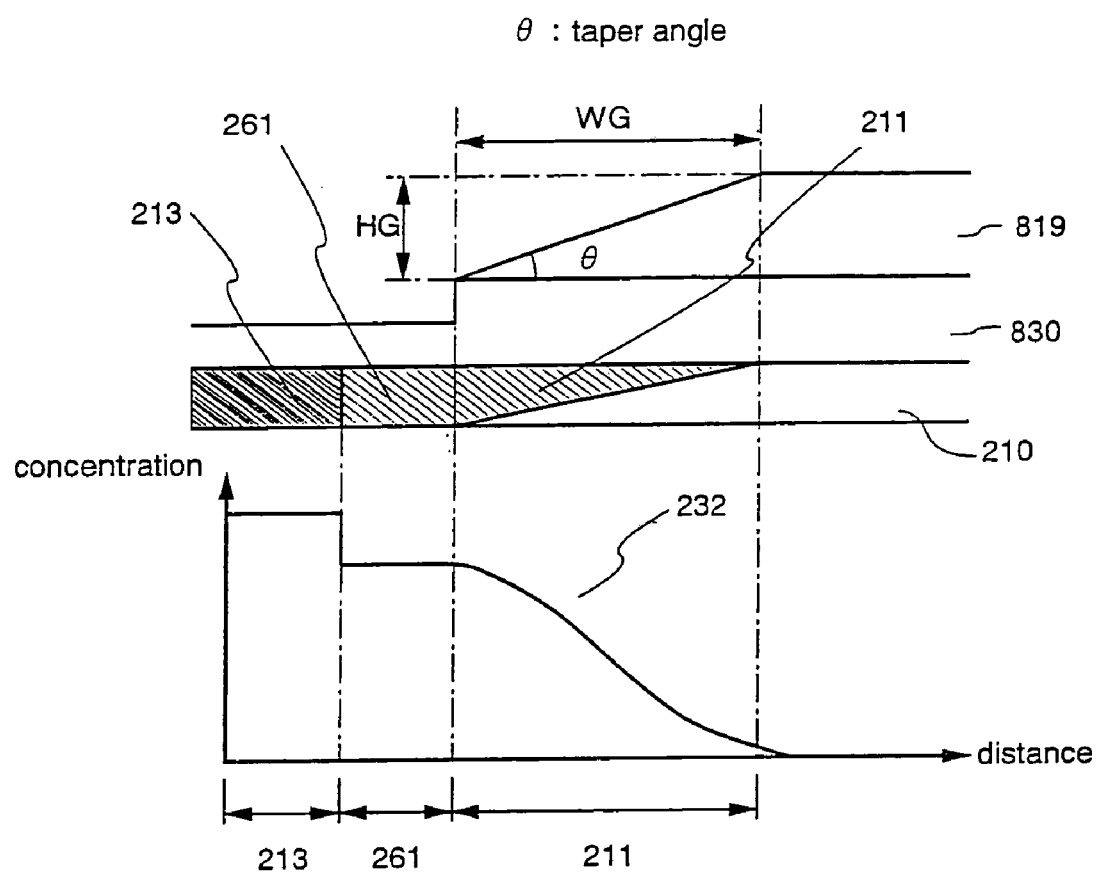
FIG. 11 is a diagram for explaining the structure of the LDD region of an n-channel TFT.

This LDD region will be explained with reference to FIG. 11. Shown in FIG. 11 is a partial enlarged view of the first n-channel TFT (A) 201a in FIG. 10C. Each LDD region 211 is formed under the tapered portion 261. On this occasion, the concentration distribution of phosphorus (P) in the LDD region 211 increases at a position remoter from the channel forming region 210, as indicated by a curve 232. The rate of the increase differs depending upon the conditions of the acceleration voltage, the dose etc. in the ion doping, the angle θ of the tapered portion 261, and the thickness of the gate electrode 819. In this manner, the end part of the gate electrode is formed into the taper shape, and the impurity element is introduced through the tapered portion, whereby the impurity region in which the concentration of the impurity element changes gradually can be formed in the semiconductor layer underlying the tapered portion. The present invention positively utilizes such an impurity region. In the case where such an LDD region is formed in the n-channel TFT, a high electric field appearing in the vicinity of the drain region is relieved to prevent the creation of hot carriers, so that the deterioration of the TFT can be prevented.

Likewise, the second p-channel TFT (A) 202a of the driver circuit has such a structure that the channel forming region 214, the LDD regions 215 overlapped by the gate electrode 820, and the source region 216 and drain region 217 formed of the high-concentration p-type impurity regions are included in the insular semiconductor layer 806. The second n-channel TFT (A) 203a is such that the channel forming region 218, the LDD regions 219 overlapped by the gate electrode 821, the LDD regions 262 not overlapped by the gate electrode 821, and the source region 220 and drain region 221 formed of the high-concentration n-type impurity regions are included in the insular semiconductor layer 807. The LDD region 219 has the same construction as that of the LDD region 211. The pixel TFT 204 is such that the channel forming regions 222a, 222b, the LDD regions 223a, 223b, 263a, and 263b formed of the low-concentration n-type impurity regions, and the source or drain regions 225–227 formed of the high-concentration n-type impurity regions are included in the insular semiconductor layer 808. Each of the LDD regions 223a, 223b has the same construction as that of the LDD region 211. Further, the storage capacitor 205 is formed of the capacitor wiring line 823, the gate insulating film, and the semiconductor layers 228 and 229 connected to the drain region 227 of the pixel TFT 204. In FIG. 10C, each of the n-channel TFTs and p-channel TFTs of the driver circuit is endowed with a single-gate structure in which one gate electrode is provided between the pair of source and drain regions, and the pixel TFT is endowed with a double-gate structure. However, any of the TFTs may have either the single-gate structure or a multi-gate structure in which a plurality of gate electrodes are disposed between the pair of source and drain regions.

Figure 12:
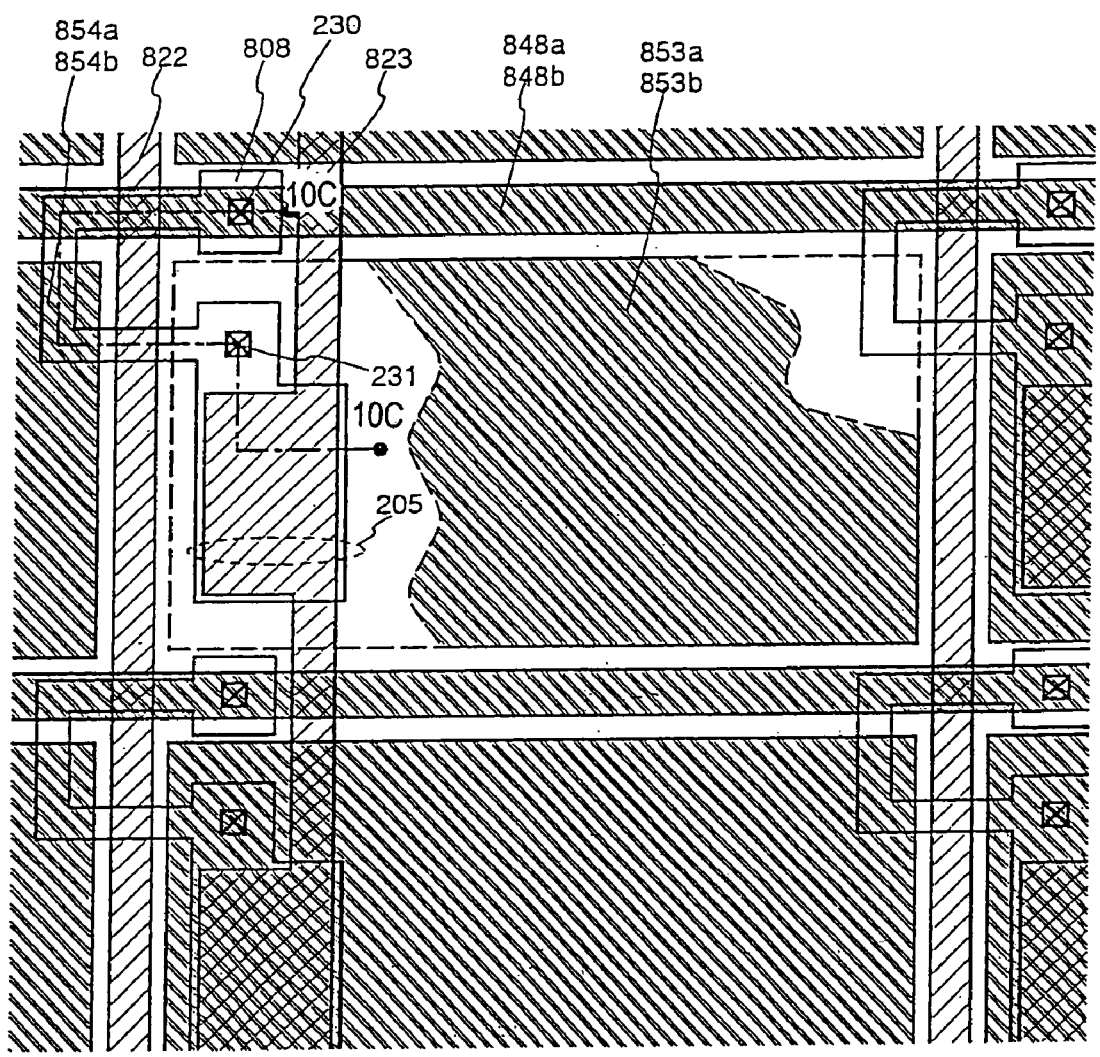
FIG. 12 is a sectional view for explaining the construction of a pixel TFT.

FIG. 12 is a top plan view showing substantially one pixel in the pixel unit. A section A–A' indicated in the figure corresponds to the sectional view of the pixel unit as shown in FIG. 10C. The pixel TFT 204 intersects with the insular semiconductor layer 808 through the gate insulating film for which the gate electrode 822 is not shown, and it further extends over the plurality of insular semiconductor layers, thereby to serve also as the gate wiring line. Although not shown, the source region, drain region and LDD regions explained with reference to FIG. 10C are formed in the insular semiconductor layer. Besides, numeral 230 designates the contact portion between the source wiring line 848 and the source region 225, while numeral 231 designates the contact portion between the drain wiring line 853 and the drain region 227. The storage capacitor 205 is formed in a domain where the semiconductor layers 228, 229 extending from the drain region 227 of the pixel TFT 204 are overlapped by the capacitor wiring line 823 through the gate insulating film. In this construction, the semiconductor layer 228 is not doped with any impurity element intended to control valence electrons.

The construction as described above makes it possible to optimize the structures of the constituent TFTs of the circuits in accordance with specifications required for the pixel TFT and the driver circuit, and to enhance the operating performance and reliability of the semiconductor device. Further, the gate electrodes are formed of the electrically conductive material being refractory, thereby to facilitate activating the LDD regions and the source and drain regions.

Moreover, in forming the LDD regions which are overlapped by the gate electrodes through the gate insulating film, the LDD regions are formed by bestowing the concentration gradient on the impurity element introduced for the purpose of controlling the conductivity type, whereby especially the effect of relieving the electric field in the vicinities of the drain regions can be expected to rise.

In case of a liquid-crystal display device of active matrix type, the first p-channel TFT (A) 200a and the first n-channel TFT (A) 201a are used for forming any of a shift register circuit, a buffer circuit, a level shifter circuit, etc. in which importance is attached to high-speed operations. In FIG. 10C, these circuits are expressed as a logic circuit portion. The LDD region 211 of the first n-channel TFT (A) 201a has the structure in which importance is attached to a measure against hot carriers. Further, the TFT (A) 201a may well be endowed with the double-gate structure in which two gate electrodes are disposed between the pair of source and drain regions in order to enhance a withstand voltage and to stabilize an operation. The channel length of each of the TFTs 200b, 201b is 3 μm–7 μm, and the LDD region (denoted by "Lov") overlapped by the gate electrode has a length of 0.1 μm–1.5 μm, preferably 0.3 μm–0.8 μm, in the direction of the channel length.

Besides, the second p-channel TFT (A) 202a and the second n-channel TFT (A) 203a having similar constructions are applicable to a sampling circuit which includes an analog switch. In the sampling circuit, importance is attached to a measure against hot carriers and a low OFF-current operation. It is therefore recommended to construct a triple-gate structure in which three gate electrodes are disposed between the pair of source and drain regions, so as to lower an OFF current.

In this manner, whether the TFT is constructed with the single-gate structure or with the multi-gate structure in which the plurality of gate electrodes are disposed between the pair of source and drain regions, may be properly selected in accordance with the characteristics of the circuit by a person in charge. Besides, a liquid-crystal display device of reflection type can be fabricated by employing the active matrix substrate finished up in this embodiment.

[Embodiment 4]

In this embodiment, an example in which an active matrix substrate is fabricated by a process different from that of Embodiment 3 will be described with reference to FIG. 28A through FIG. 29B. First, the processing steps up to the step of FIG. 8D are performed in the same way as in Embodiment 3. The electrically conductive layer for forming the gate electrodes may well be formed of one layer made of a refractory electrically-conductive material, and the conductive layer (A) 810 is formed of a W film to a thickness of 300 nm by way of example.

Subsequently, as shown in FIG. 28A, resist masks 860a–860f are formed, and the conductive layer (A) 810 is subjected to a first etching process. The etching process is implemented by an ICP etching equipment. Regarding concrete etching conditions, a mixed gas consisting of $CF_4$ and $Cl_2$ is employed as an etching gas, and the flow rates of the $CF_4$ and $Cl_2$ gases are respectively set at 30 SCCM. Further, a discharge power density is set at 3.2 W/cm$^2$ (at 13.56 MHz), a bias power density at 224 mW/cm$^2$ (at 13.56 MHz), and a pressure at 1.0 Pa. The end parts of the gate electrodes 861–865 and a capacitor wiring line 866 thus formed are respectively formed with tapered portions. In each of tapered portions, a thickness gradually increases inwards from the corresponding end part. The angle of each tapered portion is set at 5°–35°, preferably 15°–30°. This angle greatly affects the concentration gradient of a low-concentration n-type impurity region which forms an LDD region later.

Thereafter, high-concentration n-type impurity regions which function as source regions or drain regions in the n-channel TFTs are formed. The resist masks are left behind, and the high-concentration n-type impurity regions 867, 869, 871, 873, 875 are formed by ion doping. The impurity concentrations of these regions are set at $1\times10^{19}$–$1\times10^{21}$ atoms/cm$^3$. On this occasion, impurity regions 868, 870, 872, 874, 876 are also formed in regions overlapped by the end parts of the gate electrodes formed with the tapered portions, at concentrations lower than those of the high-concentration n-type impurity regions. The phosphorus concentrations of the impurity regions 868, 870, 872, 874, 876 depend upon the thicknesses and taper angles of the gate electrodes.

Subsequently, a second etching process is carried out. This etching process is similarly performed by the ICP etching equipment, under the conditions that a mixed gas consisting of $CF_4$ and $Cl_2$ is employed as an etching gas, that the flow rates of the $CF_4$ and $Cl_2$ gases are respectively set at 30 SCCM, and that a discharge power density, a bias power density and a pressure are respectively set at 3.2 W/cm$^2$ (at 13.56 MHz), 45 mW/cm$^2$ (at 13.56 MHz) and 1.0 Pa. The end parts of the gate electrodes 877–881 and a capacitor wiring line 882 formed under these conditions are respectively formed with tapered portions. In each of tapered portions, a thickness gradually increases inwards from the corresponding end part. The angle of each tapered portion is set at 40°–75°, preferably 45°–60°.

Besides, the step of doping with an impurity element which bestows the n-conductivity type is performed under the conditions of a lower dose and a higher acceleration voltage than at the preceding step. By way of example, the acceleration voltage is set at 70 keV–120 keV, and the dose at $1\times10^{13}$ atoms/cm$^3$, whereby the impurity concentrations of the regions overlapped by the gate electrodes 877–881 are made $1\times10^{16}$–$1\times10^{18}$ atoms/cm$^3$. Thus, impurity regions 883–887 are formed into individual insular semiconductor layers (FIG. 28B).

Further, resist masks 887–889 which cover the respective insular semiconductor layers for forming the n-channel TFTs are formed, whereupon high-concentration p-type impurity regions 890, 891 to serve as source regions and drain regions are formed in the insular semiconductor layers for forming the p-channel TFTs. The impurity regions 890 and 891 here are formed by ion doping with diborane ($B_2H_6$). The boron (B) concentrations of the p-type impurity regions which are not overlapped by the gate electrodes are set at $3\times10^{20}$–$3\times10^{21}$ atoms/cm$^3$. On the other hand, the impurity regions which are overlapped by the gate electrodes are doped with the impurity element through the gate insulating film and the tapered portions of the gate electrodes, and they are set at concentrations of, at least, $1.5\times10^{19}$ atoms/cm$^3$ (FIG. 28C).

Figure 29A:
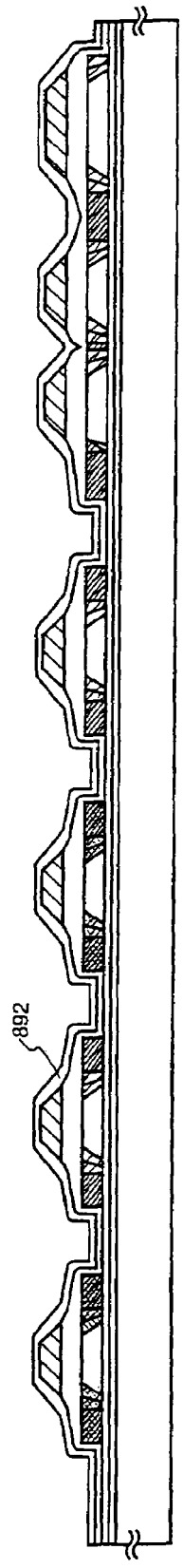
FIGS. 29A and 29B are sectional views showing the subsequent steps of the process for fabricating the pixel TFT and the TFTs of the driver circuit.
Figure 29B:
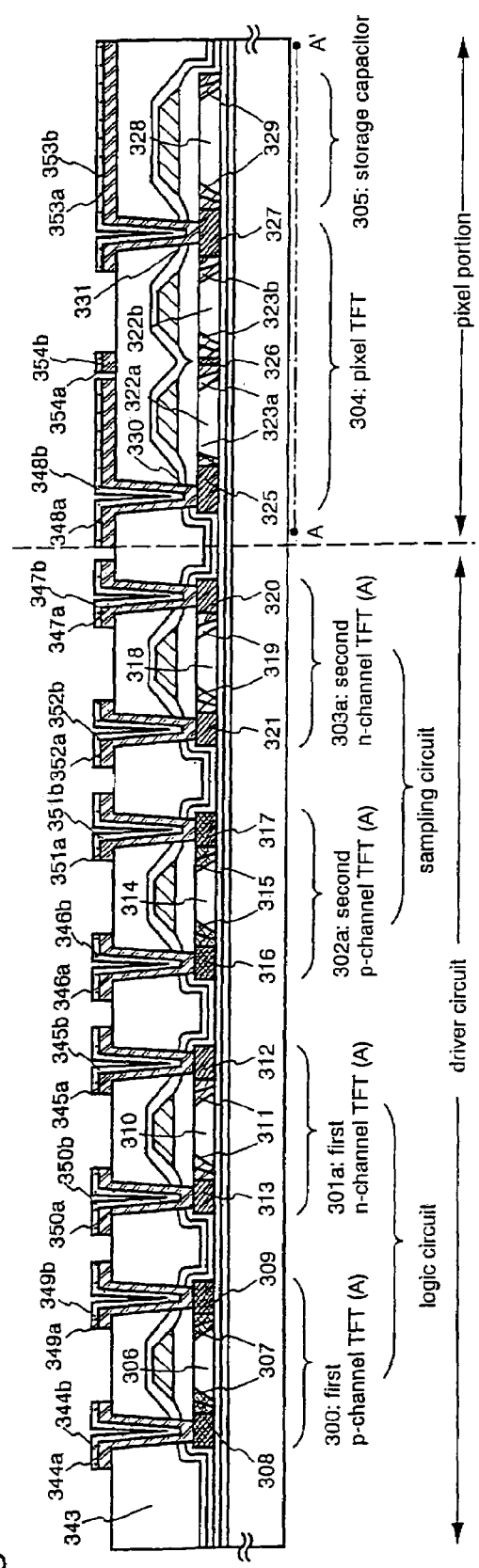

Thereafter, as shown in FIG. 29A, a first interlayer insulating film 892 is formed covering the gate electrodes and the gate insulating film, in the same way as in Embodiment 3. Next, the step of activating the impurity elements bestowing the n-type and the p-type as introduced at the respective concentrations is carried out. Subsequently to the activating step, the step of hydrogenation should preferably performed by changing the atmosphere gas, so as to terminate dangling bonds existing at a density of $10^{16}$/cm$^3$–$10^{18}$/cm$^3$ in the insular semiconductor layers.

After the activating and hydrogenating steps have ended, a second interlayer insulating film 343 made of an organic insulator material is formed having an average thickness of 1.0 μm–2.0 μm. By way of example, in case of employing polyimide of the type which is applied onto the resulting substrate structure and is thereafter thermally polymerized, the film 343 is formed by baking at 300° C. in a clean oven. Thereafter, resist masks in a predetermined pattern are formed, contact holes reaching the source regions and drain regions formed in the respective insular semiconductor layers are provided, and source lines 344a–348a and drain lines 349a–352a are formed by etching. Here, a part 353b functions as a pixel electrode. Numeral 354b designates a pixel electrode which belongs to an adjacent pixel. Although no illustration is made, the wiring lines are formed in this embodiment as stated below. A Ti film is formed to a thickness of 50 nm–150 nm, contacts are established with those semiconductor films of the insular semiconductor layers which form the source and drain regions, aluminum (Al) is deposited on the Ti film to a thickness of 300 nm–400 nm, and a transparent electrically-conductive film is further stacked on the Al layer to a thickness of 80 nm–120 nm.

In this way, the structure in which the TFTs of the driver circuit and the pixel TFT of the pixel unit are formed on the identical substrate can be completed as in Embodiment 3. The driver circuit is formed with the first p-channel TFT (A) 300, the first n-channel TFT (A) 301, the second p-channel TFT (A) 302 and the second n-channel TFT (A) 303, while the pixel unit is formed with the pixel TFT 304 and the storage capacitance 305.

The first p-channel TFT (A) 300 of the driver circuit has such a structure that the channel forming region 306, the LDD regions 307 overlapped by the gate electrode 318, and the source region 308 and drain region 309 formed of the high-concentration p-type impurity regions are included in the insular semiconductor layer. The first n-channel TFT (A) 301 is such that the channel forming region 310, the LDD regions 311 formed of the low-concentration n-type impurity region and overlapped by the gate electrode, and the source region 312 and drain region 313 formed of the high-concentration n-type impurity regions are included in the insular semiconductor layer. For a channel length of 3 μm–7 μm, the LDD region (denoted by "$L_{ov}$") overlapped by the gate electrode has a length of 0.1 μm–1.5 μm, preferably 0.3 μm–0.8 μm, in the direction of the channel length. The length of the region Lov is controlled on the basis of the thickness of the gate electrode and the angle θ of the tapered portion.

Likewise, the second p-channel TFT (A) 302 of the driver circuit has such a structure that the channel forming region 314, the LDD regions 315 overlapped by the gate electrode, and the source region 316 and drain region 317 formed of the high-concentration p-type impurity regions are included in the insular semiconductor layer. The second n-channel TFT (A) 303a is such that the channel forming region 318, the LDD regions 319 overlapped by the gate electrode, and the source region 320 and drain region 321 formed of the high-concentration n-type impurity regions are included in the insular semiconductor layer. The LDD region 319 has the same construction as that of the LDD region 311. The pixel TFT 304 is such that the channel forming regions 322a and 322b, the LDD regions 323a, 323b formed of the low-concentration n-type impurity regions, and the source or drain regions 325–327 formed of the high-concentration n-type impurity regions are included in the insular semiconductor layer. Each of the LDD regions 323a, 323b has the same construction as that of the LDD region 311. Further, the storage capacitor 305 is formed of the capacitor wiring line 882, the gate insulating film, and the semiconductor layers 328 and 329 connected to the drain region 327 of the pixel TFT 304.

In the LDD region of the n-channel TFT thus fabricated, the concentration of the impurity bestowing the n-type heightens gradually from the channel forming region toward the source or drain region. Owing to the LDD region, a high electric field appearing in the vicinity of the drain region is effectively relieved to prevent the deterioration of the TFT attributed to hot carriers.

[Embodiment 5]

The active matrix substrate manufactured in Embodiment 3 is applicable for a reflection type liquid crystal display device as is. On the other hand, in the case of applying it to a transmission type liquid crystal display device, then it is appropriate to form the pixel electrodes provided in each pixel of the pixel portion with transparent electrodes. A method of manufacturing an active matrix substrate corresponding to the transmission type liquid crystal display device is explained in Embodiment 5 with references to FIGS. 13A to 13D.

Figure 13A:
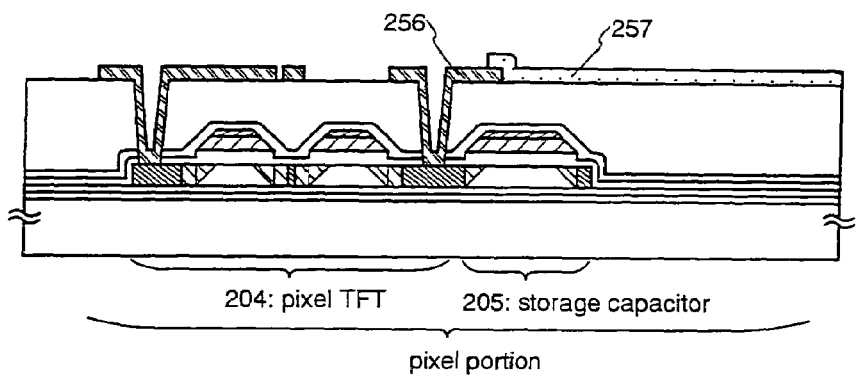
FIGS. 13A to 13D are sectional views for explaining the structures of pixel units.
Figure 13B:
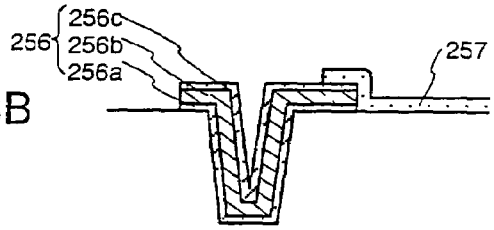

The active matrix substrate is manufactured in the same way as Embodiment 1. In FIG. 13A, a conductive metallic film is formed by sputtering or vacuum evaporation to form a source wiring and a drain wiring. This structure will be explained in detail with reference to FIG. 13B using the drain wiring 256 as an example. A Ti film 256a is formed at a thickness of between 50 and 150 nm, and then a contact is formed with a semiconductor film that forms the source or the drain region in an island semiconductor layer. Next an aluminum (Al) film 256b is formed at a thickness of between 300 and 400 nm overlapping on the Ti film 256a. Further, a Ti film 256c or a titanium nitride (TiN) film is formed at a thickness of between 100 and 200 nm to thereby form a three-layer structure. Then a transparent conductive film is formed on the entire surface. Pixel electrodes 257 are formed by a patterning process and an etching process, using a photomask. The pixel electrode 257 is formed on a second interlayer insulating film made of an organic resin material and sets aside a portion for overlapping with the drain wiring 256 of the pixel TFT 204 in order to form an electrical connection.

Figure 13C:
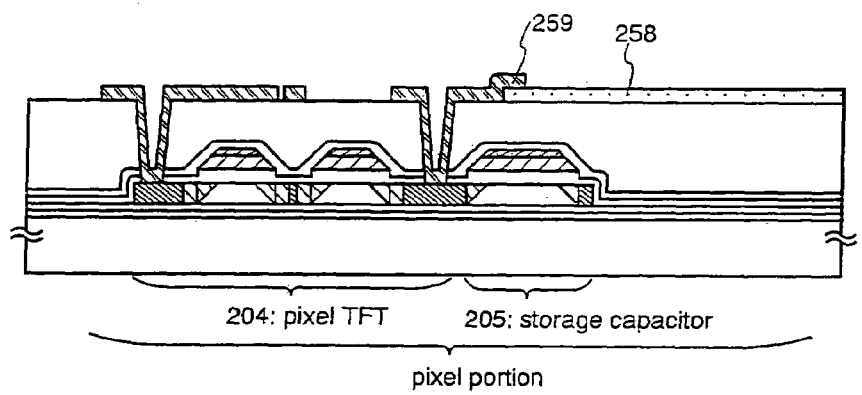
Figure 13D:
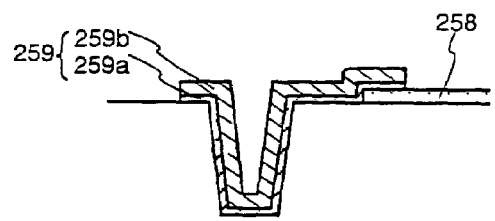

FIG. 13C is an example of first forming a transparent conductive film on the second interlayer insulating film 143, performing a patterning process and an etching process to form a pixel electrode 258, and then forming a drain wiring 259 by a portion that overlaps with the pixel electrode 258. As shown in FIG. 13D, the drain wiring 259 is provided by forming a Ti film 259a at a thickness of between 50 and 150 nm, forming a contact hole with a semiconductor film that forms the source or the drain region in an island semiconductor layer, and then forming an aluminum film 259b at a thickness between 300 and 400 nm overlapping on the Ti film 259a. With this structure, the pixel electrode 258 is in contact only with the Ti film 259a that forms the drain wiring 259. Consequently, the transparent conductive film material and Al reacting from direct contact can definitely be prevented.

Materials such as indium oxide ($In_2O_3$), or an indium oxide/tin oxide alloy ($In_2O_3$—$SnO_2$:ITO) formed by sputtering or vacuum evaporation may be used as materials for the transparent conductive film. The etching treatment of this type of material is performed with hydrochloric acid solutions. However, in particular, the etching of ITO readily generates residues. Therefore, an indium oxide/zinc oxide alloy ($In_2O_3$—$ZnO$) may be used in order to improve the etching workability. The indium oxide/zinc oxide alloy has excellent flat and smooth surface properties, and also has excellent thermal stability in regards to ITO. Accordingly, in the structure of FIGS. 9A and 9B, at an edge surface of a drain wiring 256 where the Al film 256b comes into contact with the pixel electrode 257, corrosion reaction with Al can be prevented. Similarly, zinc oxide (ZnO) is also a suitable material. In order to further improve the transmissivity of visible light and conductivity, zinc oxide doped with gallium (Ga) (ZnO:G), etc. may be used.

In Embodiment 3, an active matrix substrate that can be used for manufacturing the reflection type liquid crystal display device was fabricated by using 6 photomasks. The addition of one more photomask (a total of 7 photomasks) can thus complete an active matrix substrate corresponding to the transmission type liquid crystal display device. Though the steps of described in this embodiment are similar to those in Embodiment 1, this kind of structure can be applied to the active matrix substrate shown in Embodiment 2.

[Embodiment 6]

Another method of manufacturing a crystalline semiconductor layer that forms an active layer of a TFT of the active matrix substrate indicated in Embodiment 1 is shown in Embodiment 6. A crystalline semiconductor layer is formed by. crystallizing an amorphous semiconductor layer by thermal annealing, laser annealing, or rapid thermal annealing (RTA) or the like. Another crystallization method disclosed in Japanese Patent Application Laid-open No. Hei 7-130652 in which a catalytic element is used can also be applied. An example of this case is explained with references to FIGS. 14A to 14C.

Figure 14A:
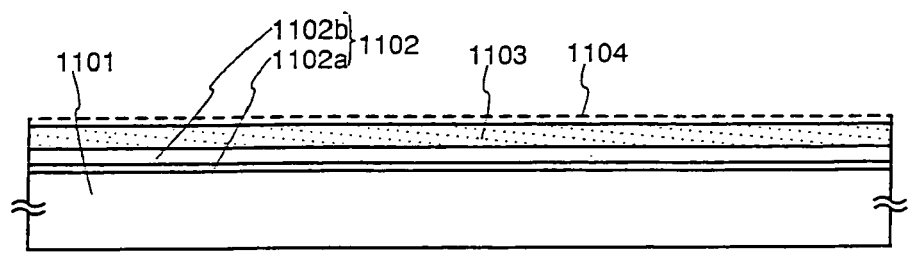
FIGS. 14A to 14C are sectional views showing a process for manufacturing a crystalline semiconductor layer.

As shown in FIG. 14A, base films 1102a and 1102b and a semiconductor layer 1103 having an amorphous structure formed at a thickness of between 25 to 80 nm are formed over a glass substrate 1101, similar to Embodiment 1. An amorphous silicon (a-Si) film, an amorphous silicon germanium (a-SiGe) film, an amorphous silicon carbide (a-SiC) film, an amorphous silicon tin (a-SiSn) film, etc. are applicable for the amorphous semiconductor layer. It is appropriate to form these amorphous semiconductor layers to contain hydrogen at about 0.1 to 40 atomic %. For example, a 55 nm thick amorphous silicon film is formed. An aqueous solution containing 10 ppm by weight conversion of a catalytic element is then applied by spin coating in which application is performed by rotating the substrate with a spinner, forming a layer 1104 containing the catalytic element. Catalytic elements include nickel (Ni), germanium (Ge), iron (Fe), palladium (Pd), tin (Sn), lead (Pb), cobalt (Co), platinum (Pt), copper (Cu), gold (Au), and the like. Other than spin coating, the catalytic element containing layer 1104 may also be made by forming a 1 to 5 nm thick layer of the above catalytic elements by printing, a spraying method, and the bar coater method, or sputtering or vacuum evaporation.

Figure 14B:
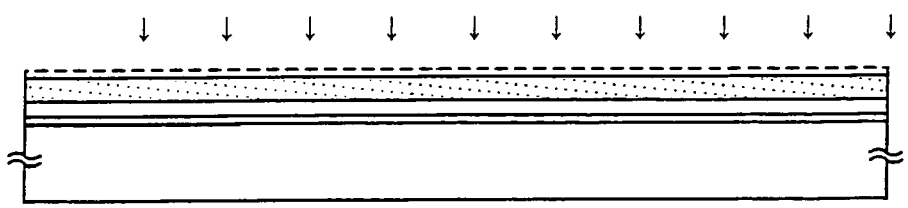
Figure 14C:
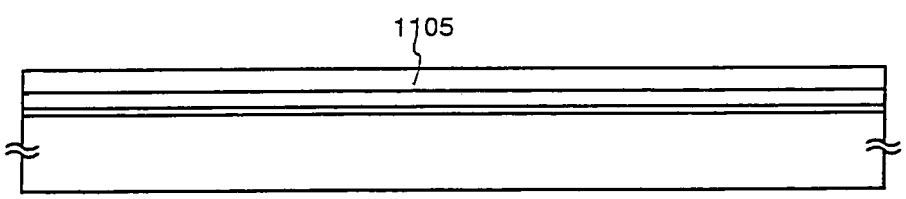

In the crystallization step shown in FIG. 14B, heat treatment is first performed for approximately 1 hour at between 400° C. and 500° C., making the amount of hydrogen contained in the amorphous silicon film 5 atomic % or less. If the initial amount of hydrogen contained in the amorphous silicon film after film deposition is this value, then in this case, heat treatment need not be performed. Thermal annealing is then performed in a nitrogen atmosphere at 550° C. to 600° C. for between 1 and 8 hours using an annealing furnace. A crystalline semiconductor layer 1105 made from the crystalline silicon film can thus be obtained through the above steps (See FIG. 14C). However, if the crystalline semiconductor layer 1105, manufactured by this thermal annealing, is observed macroscopically using an optical microscope, it is discerned that amorphous region remains locally. In this case, from observation of spectrum using a Raman spectroscopy, an amorphous constituent observed at 480 cm$^{-1}$ has a broad peak. Therefore, after thermal annealing, treating the crystalline semiconductor layer 1105 with the laser annealing method explained in Embodiment 1 is an effective means applicable for enhancing the crystallinity of the crystalline semiconductor film.

By forming the island semiconductor layers from the crystalline semiconductor layers 1105 manufactured in FIGS. 11A to 11C, an active matrix substrate can be completed, similarly to Embodiment 3. Further, the CMOS structure can also be formed shown in Embodiment 1. However, in crystallization process, if a catalytic element for promoting the crystallization of silicon is used, a small amount (about $1 \times 10^{17}$ to $1 \times 10^{19}$ atoms/cm$^3$) of the catalytic element remains within the island semiconductor layers. It is, of course, possible to complete the TFT in such a state, but it is preferred to remove the remaining catalytic element from at least the channel forming region. One of the means of removing this catalytic element is a means using gettering action of phosphorous (P).

Figure 15:
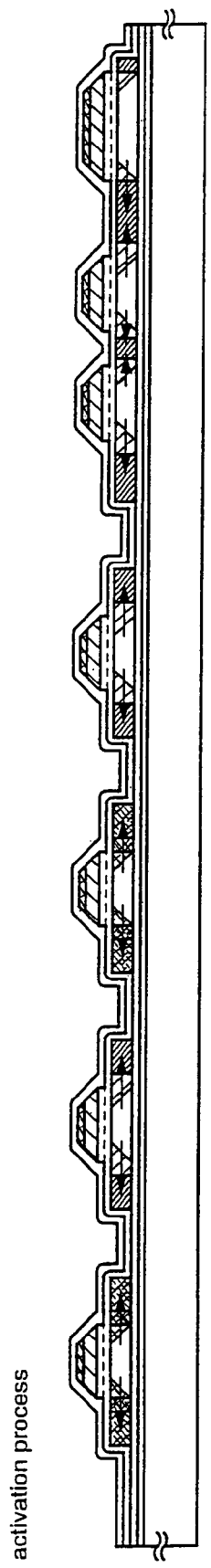
FIG. 15 is a sectional view showing the activating step of a process for fabricating a pixel TFT and the TFTs of a driver circuit.

The gettering treatment with phosphorous used in this purpose may be performed together with the activation step explained in FIG. 10B. This state is explained with reference to FIG. 15. The concentration of phosphorous (P) necessary for gettering may be on a similar order as the impurity concentration of the high concentration of n-type impurity region, and the catalytic element can be segregated at this concentration from the channel forming regions of the n-channel TFT and the p-channel TFT, into the phosphorous (P) contained impurity regions, by the thermal annealing at the activation step. (direction of an arrow in FIG. 15) As a result, the catalytic element is segregated into the impurity regions at a concentration of about $1 \times 10^{17}$ to $1 \times 10^{19}$ atoms/cm$^3$. A TFT with good characteristics can be attained because the off current value of a TFT manufactured in this way is reduced, and high electric field mobility is attained due to good crystallinity.

[Embodiment 7]

A method of manufacturing an active matrix liquid crystal display device from the active matrix substrate fabricated in Embodiment 3 will be explained here in this Embodiment. As shown in FIG. 16A, first a spacer made from a column-shape spacer is formed on the active matrix substrate in the state of FIG. 10C. The spacer may be provided by a method of spraying several μm of grains. A method of forming the spacer by patterning after forming a resin film on the entire surface of the substrate is adopted here in this embodiment. The material for such kind of spacer is not limited. For example, using the JSR product NN700, after application to the substrate by a spinner, a predetermined pattern is formed by exposure and development treatment. Furthermore, it is cured by being heated in a clean oven at 150° C. to 200° C. The shape of the spacer formed in this way may be made different depending on the conditions of the exposure and development treatment. As shown in FIG. 16, the spacer is formed so that its shape becomes a column-shape with a flat top, which is a preferred shape because when an opposing substrate is bonded to this substrate, its mechanical strength as a liquid crystal display panel can be ensured. The shape of the spacer such as a conical shape or a pyramid shape is not specially limited thereto. For example, when the spacer is a conical shape, its specific measurements are as follows: the height H is set between 1.2 and 5 μm, the average radius L1 is set between 5 and 7 μm, and the ratio of the average radius L1 and the radius of the bottom portion L2 is set to 1 to 1.5. The taper angle of the side surface at this point is ±15° or less.

The arrangement of the column-shape spacers may be arbitrarily determined, but preferably it is appropriate to form a column-shape spacer 406 overlapping the contact area 231 of the drain wiring 853 (pixel electrode) in the pixel portion so as to cover that overlapped portion as shown in FIG. 16A. Liquid crystal cannot be smoothly oriented in a portion where the levelness of the contact area 231 has been ruined. Hence, the column-shape spacer 406 is formed as in the form of filling the contact area 231 with resin used for the spacer, whereby disclination or the like can be prevented. In addition, spacers 405a to 405e are formed on the TFT of the driver circuit. These spacers may be formed extending over the entire surface of the driver circuit portion, and may also be formed so as to cover the source wiring and the drain wiring as shown in FIGS. 16A and 16B.

Thereafter, an alignment film 407 is formed. A polyimide resin is often used for the alignment film of a liquid crystal display device. After forming the alignment films, a rubbing process is performed so that the liquid crystal molecules are oriented with a certain fixed pre-tilt angle. The rubbing process is performed such so that an area of 2 μm or less from the edge portion of the column-shape spacer 406 provided in the pixel portion to the rubbing direction, is not rubbed. Further, since the generation of static electricity from the rubbing process is often a problem, an effect of protecting the TFT from the static electricity can be attained by forming the spacers 405a to 405e formed on the TFT of the driver circuit. Although not described in the figures, the substrate may have a structure in which the alignment film 407 is formed before forming the spacers 406 and 405a to 405e.

A light shielding film 402, a transparent conductive film 403, and an alignment film 404 are formed on an opposing substrate 401, which is opposed to the active matrix substrate. The light shielding film 402 is formed of films such as a Ti film, a Cr film, and an Al film at a thickness of between 150 and 300 nm. The active matrix substrate, on which the pixel portion and the driver circuit are formed, and the opposing substrate are then joined together by a sealing agent 408. A filler (not shown in the figures) is mixed into the sealing agent 408, and the two substrates are joined together with a uniform spacing by the filler and the spacers 406 and 405a to 405e. Next, a liquid crystal material 409 is injected between both substrates. A known liquid crystal material may be used as the liquid crystal material. For example, besides the TN liquid crystal, a thresholdless antiferroelectric mixed liquid crystal that indicates electro-optical response characteristics of continuously changing transmittance with respect to an electric field may also be used. Among such thresholdless antiferroelectric mixture liquid crystal, there is a type that indicates a V-shaped electro-optical response characteristic. In this way the active matrix type liquid crystal display device shown in FIG. 16B is completed.

Figure 17:
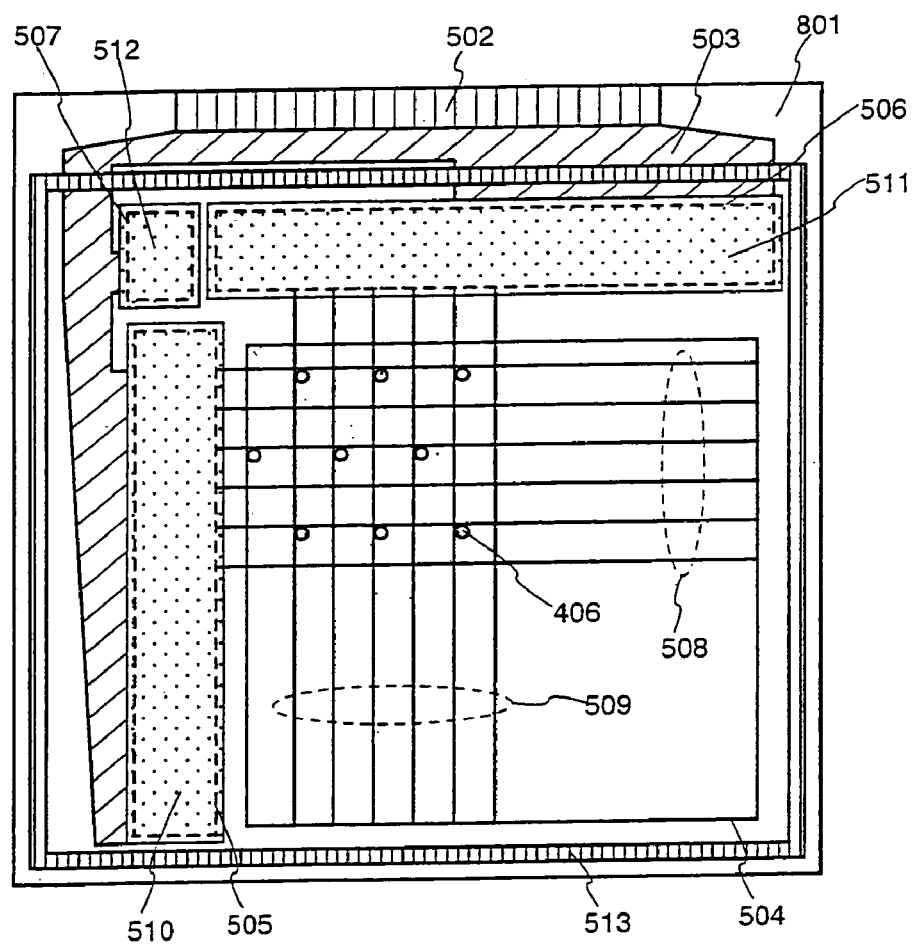
FIG. 17 is a top plan view for explaining the layout of input/output terminals, wiring lines, circuit arrangements, spacers and a sealant in the liquid-crystal display device.

FIG. 17 is a top view showing this type of active matrix substrate and the positional relation of the pixel portion and the driver circuit portion versus the spacers and the sealing agent. A scanning signal driver circuit 505 and an image signal driver circuit 506 as driver circuits are provided in the periphery of a pixel portion 504 on the glass substrate 801 described in Embodiment 3. In addition, a signal processing circuit 507 such as a CPU or a memory circuit may also be added. Then these driver circuits are connected to an external input/output terminal 502 by a connecting wiring 503. In the pixel portion 504, a set of gate wirings 508 extending from the scanning signal driver circuit 505 and a set of source wirings 509 extending from the image signal driver circuit 506 intersect in matrix to form pixels. Each pixel is provided with the pixel TFT 204 and the storage capacitor 205.

In FIG. 16 the column-shape spacer 406 provided in the pixel portion may be provided not only to each pixel, but also to every several pixels or several tens of the pixels arranged in a matrix manner as shown in FIG. 17. In other words, it is possible to set the ratio of the total number of pixels composing the pixel portion to the number of spacers between 20% and 100%. In addition, the spacers 405a to 405e provided in the driver circuits portion may be formed so as to cover the entire surface of the circuits, or may be provided in accordance with the position of the source wiring and the drain wiring of each TFT. In FIG. 17, reference numerals 510 to 512 denote the arrangement of the spacers provided in the driver circuits portion. In FIG. 17, the sealing agent 513 is formed on the exterior of the pixel portion 504, the scanning signal driver circuit 505, the image signal driver circuit 506, and the signal processing circuit 507 of the other circuits, and on the interior of an external input/output terminal 502, that are formed over the substrate 801.

Figure 18:
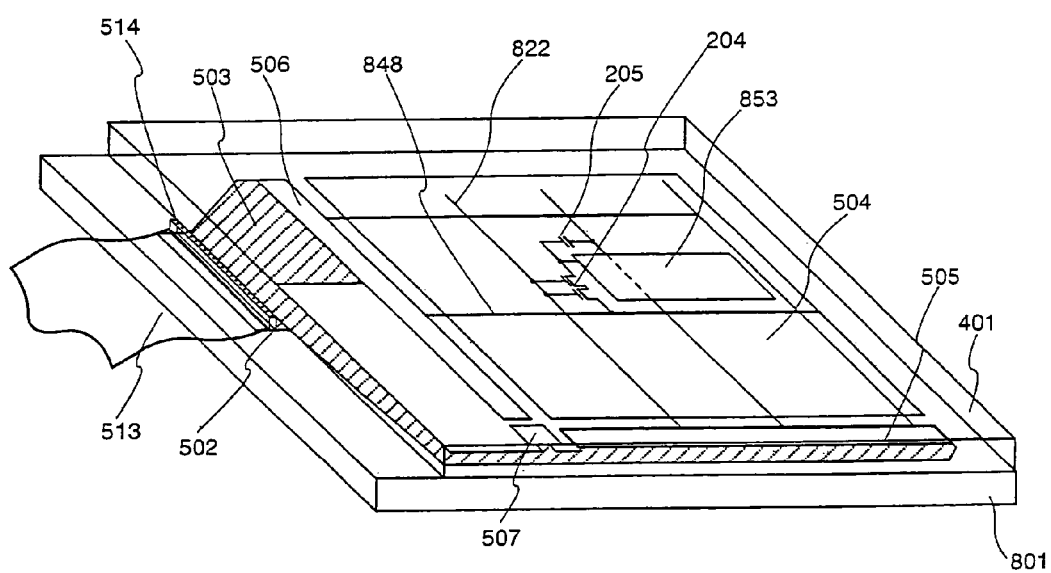
FIG. 18 is a perspective view showing the structure of the liquid-crystal display device.

Next, the structure of this kind of active matrix liquid crystal display device is explained using the perspective view of FIG. 18. In FIG. 18; the active matrix substrate comprises the pixel portion 504, the scanning signal driver circuit 505, the image signal driver circuit 506, and the signal processing circuit 507 of the other circuits formed over the glass substrate 801. The pixel TFT 204 and the storage capacitor 205 are provided in the pixel portion 504, and the driver circuit formed in the periphery thereof is structured based on a CMOS circuit. The scanning signal driver circuit 505 and the image signal driver circuit 506 are connected to the pixel TFT 204 by the gate wiring 822 and the source wiring 848, respectively, extending to the pixel portion 504. Further, an FPC (flexible print circuit) 513 is connected to the external input/output terminal 502 to be utilized for inputting signals such as image signals. The FPC 513 is firmly adhered in this area by a strengthening resin 514. The connecting wiring 503 is connected to the respective driver circuits. Further, though not shown in the figure, a light shielding film and a transparent conductive film are provided on the opposing substrate 401.

A liquid display device with this kind of structure can be formed by using the active matrix substrate described in Embodiments 3 to 5. The reflection type liquid crystal display device can be attained with employment of the active matrix substrate shown in Embodiment 3 or Embodiment 4 whereas the transmission type liquid crystal display device can be attained with employment of the active matrix substrate shown in Embodiment 5.

[Embodiment 8]

Figure 19A:
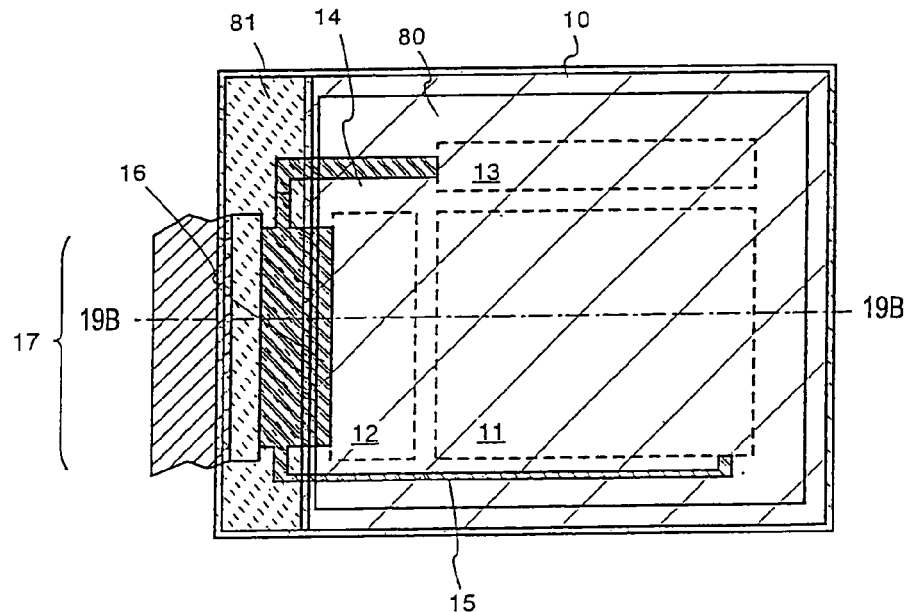
FIGS. 19A and 19B are a top plan view and a sectional view showing the structure of an EL display device, respectively.

In this embodiment, the case will be described where an EL (Electro Luminescence) display panel (hereinafter described as EL display device) is formed using an active matrix substrate according to the Embodiment 3 or Embodiment4. FIG. 19A is a top view of an EL display panel using the present invention. In FIG. 19A, reference numeral 10 denotes a substrate, 11 denotes a pixel portion, 12 denotes a source-side driver circuit, and 13 denotes a gate-side driver circuit. Each driver circuit is connected to an FPC 17 through wirings 14 to 16 so as to be connected to external equipment.

Figure 19B:
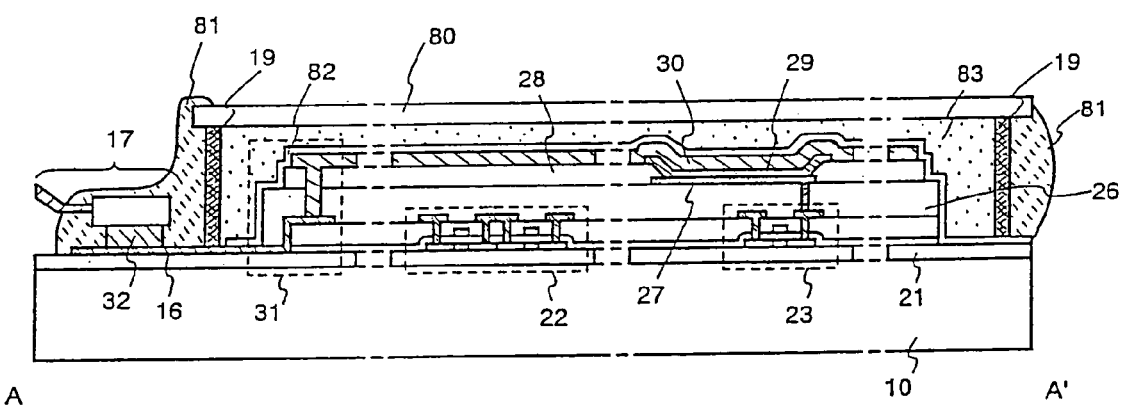

The FIG. 19B shows a sectional structure of A–A' of FIG. 19A. The counter material 80 is provided so as to cover at least surface of the pixel portion, preferably the driver circuits and the surface of the pixel portion. The counter substrate 80 is attached to the active matrix substrate, on which TFTs and EL layer are formed, with a sealant 19. The sealant 19 is mixed with filler (not shown in the figure), two substrate are attached together with a filler at equal spaces. Further, the outside of the sealant 19 and the top of FPC 17, the periphery portion thereof has a structure of being filled up by the sealant 81. As materials of sealant 81, silicone resin, epoxy resin, phenol resin and butyl rubber are used.

As it is, the active matrix substrate 10 and the counter substrate 80 are attached together with sealant 19, a space is generated therebetween. The filler 83 is filled with the space. The filler 83 has an effect of attachment of the counter substrate 80. The PVC (polyvinyl chloride), epoxy resin, silicone resin, PVB (polyvinyl butyral), and EVA (ethylene vinyl acetate) can be used as the filler 83. An EL element is weak to moisture such as water and is likely to be degraded, so that is effective to mix a drying agent such as barium oxide in the filler 83 so as to enhance resistance to moisture.

Further, a passivation film 82 is formed by the silicon nitride film and silicon oxynitride film to protect from erosion by alkali element which contains in filler 83.

A glass plate, an aluminum plate, a stainless steel plate, an FRP (fiberglass-reinforced plastic) plate, a PVF (polyvinyl fluoride) film, a Mylar film (a product of Dupon Corp.), a polyester film, and an acrylic film can be used as the counter substrate 80. A sheet which structure is put several ten μm thick aluminum alloy between PVF film and Mylar film. In this manner, the EL element is completely sealed and is not exposed to the outside of air.

Figures 20A, 20B:
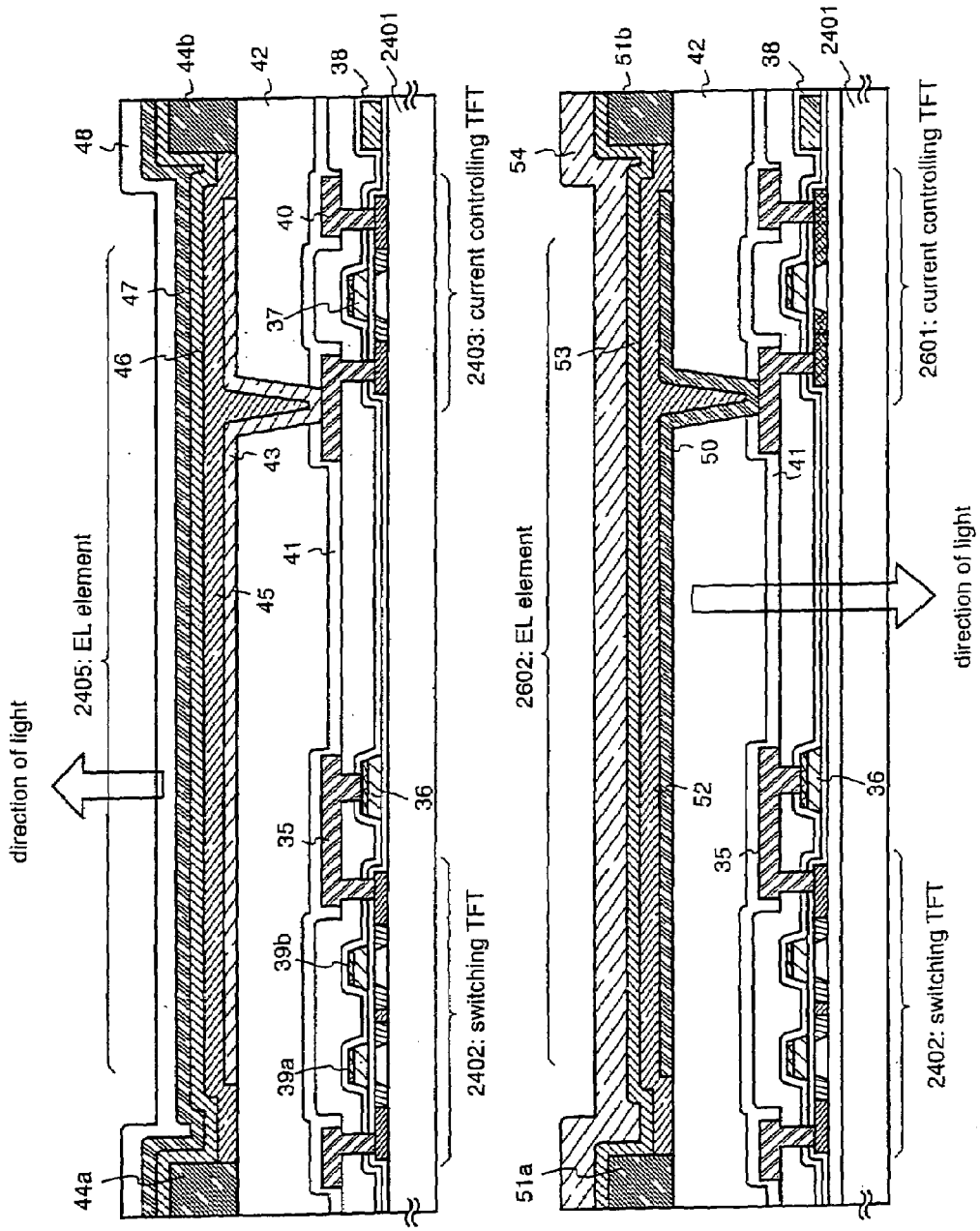
FIGS. 20A and 20B are sectional views each showing the pixel unit of the EL display device.

In FIG. 20B, the driving TFT 22 (CMOS circuit which is composed of n-channel type TFT and p-channel type TFT is shown here), and the pixel TFT 23 (only TFT controlling current to an EL element is shown here) are formed on a base film 21 over a substrate 10. These TFT prevents the shift of voltage of TFT and to prevent the fluctuation of the voltage Vth attributed to a bias stress. To stabilize the characteristics of the TFT, same TFT which is shown in Embodiment 3 is used. Therefore, the structure is silicon oxynitride film (A) and (B) using a gate electrode. Further, TFT is applied to the TFT shown in Embodiment 1, or reverse staggered TFT shown in Embodiment 2.

For example, as the TFT 22 for a driver circuit, the p-channel TFT 200a, 202a or the n-channel TFT 201a, 203a shown in FIG. 10C can be used. Furthermore, as the TFT 23 for a pixel portion, n-channel TFT 204 shown in FIG. 10C or a p-channel TFT having a similar structure can be used.

To manufacture the EL display device from an active matrix substrate state of FIG. 10C, an interlayer insulating film (a leveling film) 26 made of resin material, is formed on the source line and the drain line, and a pixel electrode 27 made of trance parent film, which is connected electrically to drain of pixel portion TFT 23, is formed thereon. As a transparent conductive film, a compound of indium oxide and tin oxide, and a compound of indium oxide and zinc oxide can be used. Then after forming the pixel electrode 27, an insulating film 28 is formed, and an opening is formed on the pixel electrode 27.

Next, an EL layer 29 is formed. The EL layer 29 can have a layered structure including an appropriate combination of layers made of known EL materials (hole injection layer, hole transporting layer, light-emitting layer, electron transportation layer, or electron injection layer) or a single structure. Such a structure can be obtained by a known technique. Furthermore, examples of the EL material include a low molecular-weight material and polymer material. In the case of using a low molecular-weight material, vapor deposition is used. In the case of using a polymer material, a simple method such as spin coating printing, and an ink jet method can be used.

In this embodiment, the EL layer is formed by vapor deposition, ink jet method or dispenser method using a shadow mask. By forming light-emitting layers (red light-emitting layer, green-light emitting layer, and blue light-emitting layer) capable of emitting light with different wavelengths on the pixel basis, a color display can be performed. In addition, a combination of a color conversion layer (CCM) and a color filter, or a combination of a white light-emitting layer and a color filter may be used. Needless to say, an EL display device emitting single color light can also be used.

When the EL layer 29 is formed, a cathode 30 is formed thereon. It is desirable to remove moisture and oxygen present at an interface between the cathode 30 and the EL layer 29 as much as possible. Thus, it is required to continuously form the EL layer 29 and the cathode 30 in a vacuum, or to form the EL layer 29 in an inactive atmosphere, and form the cathode 30 without exposing the EL layer 29 to the outside air. In this embodiment, for this purpose, a film formation device of a multi-chamber system (cluster tool system) is used.

In this embodiment, as the cathode 30, a layered structure of a LiF (lithium fluoride) film and an Al (aluminum) film is used. More specifically, the LiF film is formed to a thickness of 1 nm on the EL layer 29 by vapor deposition, and an Al film is formed to a thickness of 300 nm thereon. It is appreciated that a MgAg electrode that is a known negative electrode material may be used. The cathode 30 is connected to the wiring 16 in a region denoted by reference numeral 31. The wiring 16 is a power supply line for supplying a predetermined voltage to the cathode 30, and is connected to the FPC 17 via a conductive paste material 32. A resin layer 80 is further formed on the FPC 17 so as to enhance adhesiveness in this portion.

In order to electrically connect the cathode 30 to the wiring 16 in the region 31, it is required to form contact holes in the interlayer insulating film 26 and the insulating film 28. The contact holes may be formed during etching of the interlayer insulating film 26 (during formation of a contact hole for a pixel electrode) or during etching of the insulating film 28 (during formation of an opening before forming the EL layer). Furthermore, when the insulating film 28 is etched, the interlayer insulating film 26 may also be etched together. In this case, if the interlayer insulating film 26 and the insulating film 28 are made of the same resin material, the shape of the contact holes can be made satisfactory.

Furthermore, the wiring 16 is electrically connected to the FPC 17 through a gap between the sealant 19 and the substrate 10 (the gap is filled with an sealant 81). Herein, although description is made with respect to the wiring 16, the other wirings 14 and 15 are also electrically connected to the FPC 17 through a gap between the sealant 81 and the substrate 10.

Figure 21A:
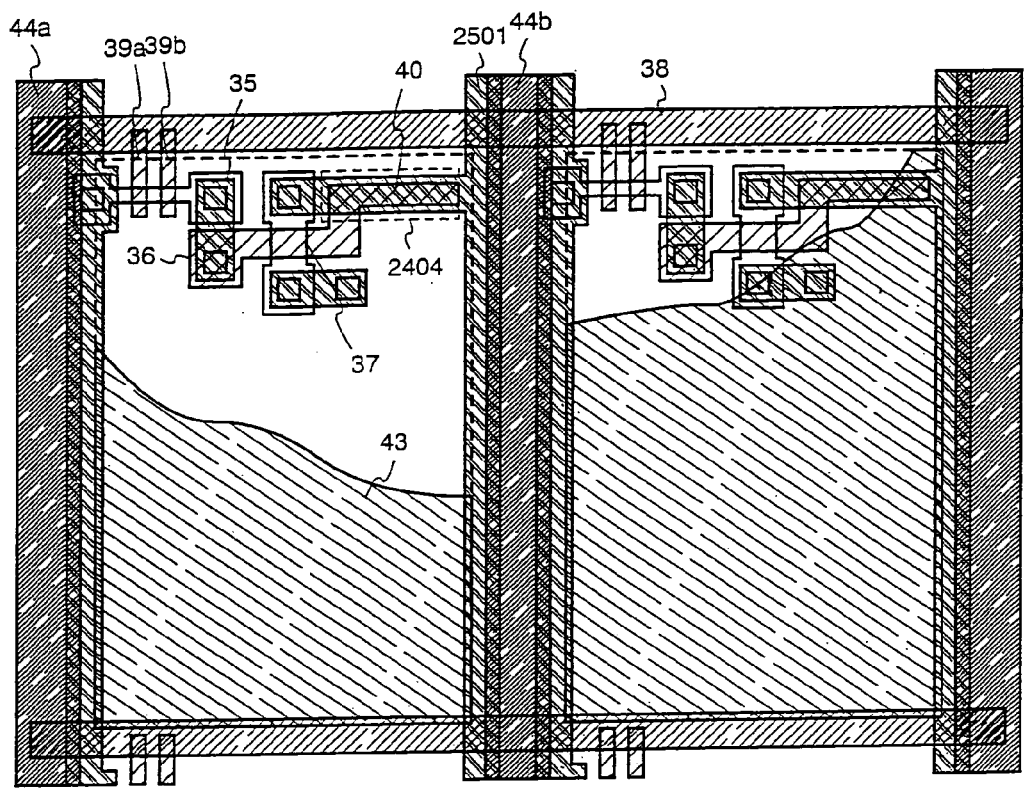
FIGS. 21A and 21B are a top plan view and a circuit diagram showing the pixel unit of the EL display device, respectively.
Figure 21B:
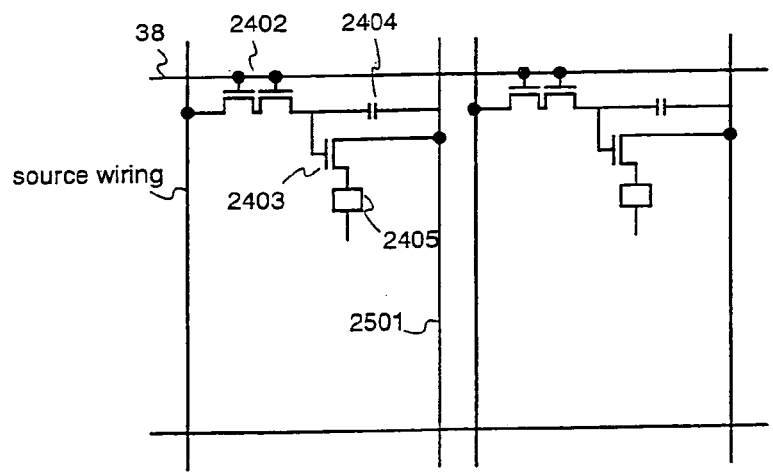

FIG. 20 shows a more detailed cross-sectional structure of the pixel portion. FIG. 21A shows a top view thereof, and FIG. 21B shows a circuit diagram thereof. In FIGS. 20 and 21A, the same components are denoted with the same reference numerals.

In FIG. 20A, a switching TFT 2402 provided on a substrate 2401 is formed according to the same structure of the pixel TFT 204 of the present invention (for example, the TFT shown in FIG. 10 of Embodiment 1). In this embodiment, the TFT 2402 has a double-gate structure. Due to the double-gate structure, there is an advantage in that substantially two TFTs are connected in series to reduce an OFF current value. In this embodiment, the TFT 2402 has a double-gate structure; however, it may have a single gate structure, a triple gate structure, or a multi-gate structure having more gates.

A current controlling TFT 2403 is formed by using the n-channel TFT 201a shown in FIG. 10C. A drain wiring 35 of the switching TFT 2402 is electrically connected to a gate electrode 37 of the current controlling TFT. Furthermore, a line 38 is a gate wiring electrically connected to gate electrodes 39a and 39b of the switching TFT 2402.

At this time, it is very important that the current controlling TFT 2403 has a structure of the present invention. The current controlling TFT functions for controlling the amount of a current flowing through an EL element, so that the current controlling TFT 2403 is likely to be degraded by heat and hot carriers due to a large amount of current flown therethrough. Therefore, the structure of the present invention is very effective, in which an LDD region is provided on the drain side of the current controlling TFT 2403 so as to overlap the gate electrode (strictly speaking, a side wall functioning as a gate electrode) via the gate insulating film.

Furthermore, in this embodiment, the current controlling TFT 2403 has a single gate structure. However, it may have a multi-gate structure in which a plurality of TFTs are connected in series. Furthermore, it may also be possible that a plurality of TFTs are connected in parallel to substantially divide a channel formation region into a plurality of parts, so as to conduct highly efficient heat release. Such a structure is effective for preventing degradation due to heat.

As shown in FIG. 21A, a line to be the gate electrode 37 of the current controlling TFT 2403 overlaps a drain wiring 40 of the current controlling TFT 2403 via an insulating film in a region 2404. In the region 2404, a capacitor is formed. The capacitor 2404 functions for holding a voltage applied to a gate of the current controlling TFT 2403. The drain wiring 40 is connected to a current supply line (power source line) 2501 so as to be always supplied with a constant voltage.

A first passivation film 41 is provided on the switching TFT 2402 and the current controlling TFT 2403, and a leveling film 42 that is made of a resin insulating film is formed thereon. It is very important to flatten the step difference due to TFTs by using the leveling film 42. The step difference may cause a light-emitting defect because the EL layer to be formed later is very thin. Thus, it is desirable to flatten the step difference so that the EL layer is formed on a flat surface before forming a pixel electrode.

Reference numeral 43 denotes a pixel electrode (cathode of an EL element) that is made of a conductive film with high reflectivity and is electrically connected to the drain of the current controlling TFT 2403. As the pixel electrode 43, a low resistant conductive film such as an aluminum alloy film, a copper alloy film, and a silver alloy film, or a layered structure thereof can be preferably used. Needless to say, a layered structure with other conductive films may also be used.

A light-emitting layer 44 is formed in a groove (corresponding to a pixel) formed by banks 44a and 44b made of an insulating film (preferably resin). Herein, only one pixel is shown; however, light-emitting layers corresponding to each color R (red), G (green), and B (blue) may be formed. As an organic EL material for the light-emitting layer, a π-conjugate polymer material is used. Examples of the polymer material include polyparaphenylene vinylene (PPV), polyvinyl carbazole (PVK), and polyfluorene. There are various types of PPV organic EL materials. For example, materials as described in "H. Shenk, Becker, O. Gelsen, E. Kluge, W. Kreuder and H. Spreitzer, "Polymers for Light Emitting Diodes", Euro Display, Proceedings, 1999, pp. 33–37" and Japanese Laid-Open Publication No. 10-92576 can be used.

More specifically, as a light-emitting layer emitting red light, cyanopolyphenylene vinylene may be used. As a light-emitting layer emitting green light, polyphenylene vinylene may be used. As a light-emitting layer emitting blue light, polyphenylene vinylene or polyalkyl phenylene may be used. The film thickness may be prescribed to be 30 to 150 nm (preferably 40 to 100 nm).

The above-mentioned organic EL materials are merely examples for use as a light-emitting layer. The present invention is not limited thereto. A light-emitting layer, a electric charge transporting layer, or a electric charge injection layer may be appropriately combined to form an EL layer (for light emitting and moving carriers therefore). For example, in this embodiment, the case where a polymer material is used for the light-emitting layer has been described. However, a low molecular-weight organic EL material may be used. Furthermore, an inorganic material such as silicon carbide can also be used for a electric charge transporting layer and a electric charge injection layer. As these organic EL materials and inorganic materials, known materials can be used.

In this embodiment, an EL layer with a layered structure is used, in which a hole injection layer 46 made of PEDOT (polythiophene) or PAni (polyaniline) is provided on the light-emitting layer 45. An anode 47 made of a transparent conductive film is provided on the hole injection layer 46. In this embodiment, light generated by the light-emitting layer 45 is irradiated to the upper surface (toward TFTs), so that the anode 47 must be transparent to light. As a transparent conductive film, a compound of indium oxide and tin oxide, and a compound of indium oxide and zinc oxide can be used. The conductive film is formed after forming the light-emitting layer 45 and the hole injection layer 46 with low heat resistance, so that the conductive film that can be formed at a possibly low temperature is preferably used.

When the anode 47 is formed, the EL element 2405 is completed. The EL element 2405 refers to a capacitor composed of the pixel electrode (cathode) 43, the light-emitting layer 45, the hole injection layer 46, and the anode 47. As show in FIG. 22A, the pixel electrode 43 substantially corresponds to the entire area of a pixel. Therefore, the entire pixel functions as an EL element. Thus, a light image display with very high light use efficiency can be performed.

In this embodiment, a second passivation film 48 is further formed on the anode 47. As the second passivation film 48, a silicon nitride film or a silicon nitride oxide film is preferably used. The purpose of the passivation film 48 is to prevent the EL element from being exposed to the outside. That is, the passivation film 48 protects an organic EL material from degradation due to oxidation, and suppresses the release of gas from the organic EL material. Because of this, the reliability of the EL display device is enhanced.

As described above, the EL display panel of the present invention has a pixel portion made of a pixel with a structure as shown in FIG. 21, and includes a switching TFT having a sufficiently low OFF current value and a current controlling TFT that is strong to the injection of hot carriers. Thus, an EL display panel is obtained, which has high reliability and is capable of displaying a satisfactory image.

In this embodiment, referring to FIG. 20B, the case will be described where the structure of the EL layer is reversed. The current control TFT 2601 is formed using a p-channel type TFT 200a of FIG. 10C. The manufacturing process is referred to Embodiment 3. In this embodiment, a transparent conductive film is used as a pixel electrode (anode) 50. Specifically, a conductive film is used which is compounded of indium oxide and zinc oxide. More specifically, a conductive film made of a compound of indium oxide and zinc oxide is used. Needless to say, a conductive film made of a compound of indium oxide and tin oxide may be used.

After banks 51a and 51b made of an insulating film are formed, a light-emitting layer 52 made of polyvinyl carbazole is formed by coating of a solution. On the light-emitting layer 52, an electron injection layer 53 made of potassium acetyl acetonate (acacK), and a cathode 54 made of an aluminum alloy are formed. In this case, the cathode 54 functions as a passivation film. Thus, an EL element 2602 is formed. In this embodiment, light generated by the light-emitting layer 53 is irradiated toward the substrate on which a TFT is formed as represented by an arrow. In the case of the structure of this embodiment, it is preferable that the current controlling TFT 2601 is formed of a p-channel TFT.

This embodiment can be realized by being appropriately combined with the structures of TFT in Embodiments 1 to 4. Furthermore, it is effective to use the EL display panel of this embodiment as a display portion of electronic equipment of Embodiment 11.

[Embodiment 9]

In this embodiment, referring to FIG. 22, the case will be described where a pixel having a structure different from that of the circuit diagram shown in FIG. 21B is used. Reference numeral 2701 denotes a source wiring of a switching TFT 2702, 2703 denotes a gate wiring of the switching TFT 2702, 2704 denotes a current controlling TFT, 2705 denotes a capacitor, 2706 and 2708 denote current supply lines, and 2707 denotes an EL element.

Figure 22A:
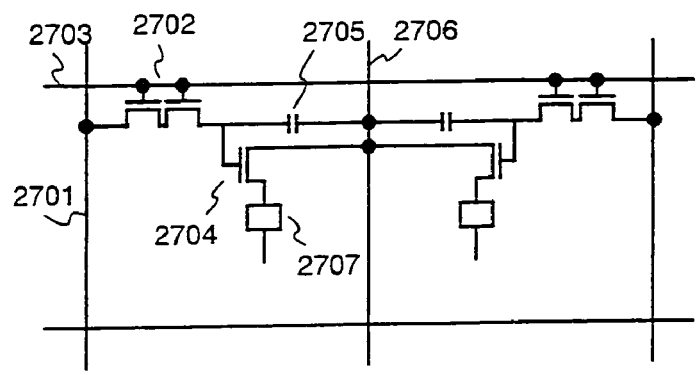
FIGS. 22A to 22C are circuit diagrams each showing an example of the pixel unit of the EL display device.

FIG. 22A shows the case where two pixels share the current supply line 2706. More specifically, two pixels are formed so as to be axisymmetric with respect to the current supply line 2706. In this case, the number of power supply lines can be reduced, so that the pixel portion is allowed to have a higher definition.

Figure 22B:
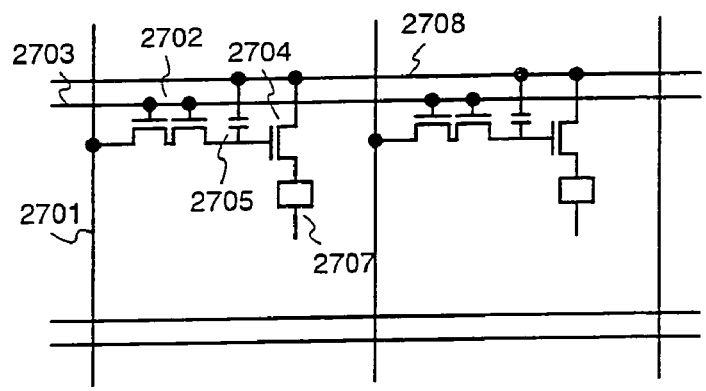

Furthermore, FIG. 22B shows the case where the current supply line 2708 and the gate wiring 2703 are provided in parallel. In FIG. 22B, although the current supply line 2708 does not overlap the gate wiring 2703, if both lines are formed on different layers, they can be provided so as to overlap each other via an insulating film. In this case, the current supply line 2708 and the gate wiring 2703 can share an occupied area, so that a pixel portion is allowed to have higher definition.

Figure 22C:
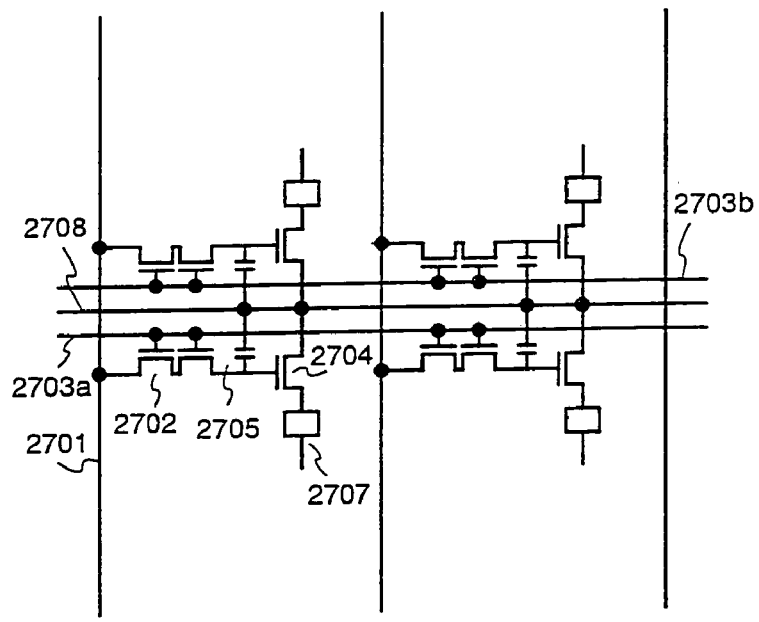

Furthermore, FIG. 22C shows the case where the current supply line 2708 and gate wiring 2703 are provided in parallel in the same way as in FIG. 22B, and two pixels are formed so as to be axisymmetric with respect to the current supply line 2708. It is also effective to provide the current supply line 2708 so as to overlap one of the gate wiring 2703. In this case, the number of the power supply lines can be reduced, so that a pixel portion is allowed to have higher definition. In FIGS. 22A and 22B, the capacitor 2404 is provided so as to hold a voltage applied to a gate of the current controlling TFT 2403. However, the capacitor 2404 can be omitted.

Since the n-channel TFT according to the present invention as shown in FIG. 20A is used as the current controlling TFT 2403, the current controlling TFT 2403 has an LDD region provided so as to overlap a gate electrode via a gate insulating film. In this region, a parasitic capacitor called a gate capacitor is generally formed. This embodiment is characterized in that the parasitic capacitor is used in place of the capacitor 2404. The capacitance of the parasitic capacitor is varied depending upon the area in which the above-mentioned gate electrode overlaps the LDD region. Therefore, the capacitance is determined by the length of the LDD region included in the region. Similarly, in FIGS. 22A, 22B, and 22C, the capacitor 2705 can also be omitted.

This embodiment can be realized by being appropriately combined with the structures of TFT in Embodiments 1 to 4. Furthermore, it is effective to use an EL display panel having a pixel structure of this embodiment as a display portion of electronic equipment of Embodiment 11.

[Embodiment 10]

In addition to a nematic liquid crystal, it is also possible to use various other liquid crystals in a liquid crystal display device shown in embodiment 7. For example, it is possible to use the liquid crystal materials disclosed in: Furue, H, et al., "Characteristics and Driving Scheme of Polymer-stabilized Monostable FLCD Exhibiting Fast Response Time and High Contrast Ratio with Gray-scale Capability," SID, 1998; Yoshida, T., et al., "A Full-color Thresholdless Antiferroelectric LCD Exhibiting Wide Viewing Angle with Fast Response Time," SID Digest, 841, 1997; J. Mater. Chem., 6(4), pp. 671–3, 1996; Inui, S., et al., "Thresholdless antiferroelectricity in liquid crystals and its application to displays," and U.S. Pat. No. 5,594,569.

The electro-optical characteristics of a monostable ferroelectric liquid crystal (FLC), in which an FLC showing a phase transition system of an isotropic phase—cholesteric phase—chiralsmectic phase is used, and in which a phase transition is caused from the cholesteric phase to the chiralsmectic phase, a cone edge being made to nearly conform with a rubbing direction while applying a DC voltage, are shown in FIG. 25. The display mode of a ferroelectric liquid crystal like that shown in FIG. 25 is referred to as a "Half-V switching node." The vertical axis of the graph shown in FIG. 25 is the transmittance (in arbitrary units), and the horizontal axis is the applied voltage. Details regarding the "Half-V switching mode" may be found in: Terada, et al, "Half-V Switching Mode FLCD", Proceedings of the 46th Japan Society of Applied Physics Lectures, Mar. 1999, p. 1316; and in Yoshihara, et al, "Time-Division Full Color. LCD by Ferroelectric Liquid Crystal", Liquid Crystals, vol. 3, no. 3, p. 190.

Figure 23:
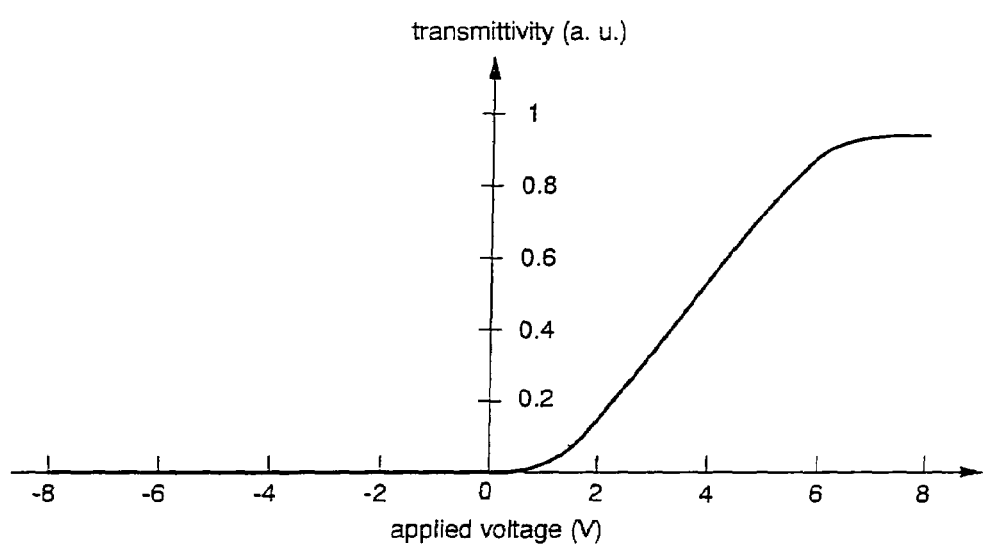
FIG. 23 is a graph showing an example of the light transmittance characteristics of a mixed ferroelectric liquid crystal.

As shown in FIG. 23, it is apparent that if this type of ferroelectric mixed liquid crystal is used, it becomes possible to have a low voltage drive and a gray scale display. A ferroelectric liquid crystal that shows these electro-optical characteristics can be used in the display device of the present invention.

In addition, a liquid crystal that exhibits an anti-ferroelectric phase in a certain temperature range is referred to as an anti-ferroelectric liquid crystal (AFLC). There are mixed liquid crystals, which have an anti-ferroelectric liquid crystal, that show electro-optical response characteristics in which the transmittance continuously changes in response to the electric field, and are referred to as thresholdless antiferroelectric mixed liquid crystals. There are thresholdless antiferroelectric mixed liquid crystals that show so-called V-type electro-optical response characteristics, and some have been found to have a drive voltage of approximately ±2.5 V (when the cell thickness is between 1 and 2 µm).

Further, in general the spontaneous polarization of a thresholdless antiferroelectric mixed liquid crystal is large, and the dielectric constant of the liquid crystal itself is high. It is thus necessary to pixels for a relatively large storage capacitor when a thresholdless antiferroelectric mixed liquid crystal is used for a liquid crystal display device. Therefore it is preferable to use a thresholdless antiferroelectric mixed liquid crystal that has a small spontaneous polarization.

Note that a low drive voltage can be realized by using this type of thresholdless antiferroelectric mixed liquid crystal in the liquid crystal display devices of the present invention, and therefore low power consumption can also be realized.

[Embodiment 11]

In this embodiment, an active matrix type crystal display device incorporated a semiconductor device by TFT circuits of this present invention is explained in FIG. 24, FIG. 25 and FIG. 26.

Mentioned as such semiconductor device, a portable information terminal (such as electronic book, mobile computer or mobile telephone), and so forth. Examples of the electronic equipment are illustrated in FIGS. 24 and 25.

Figure 24A:
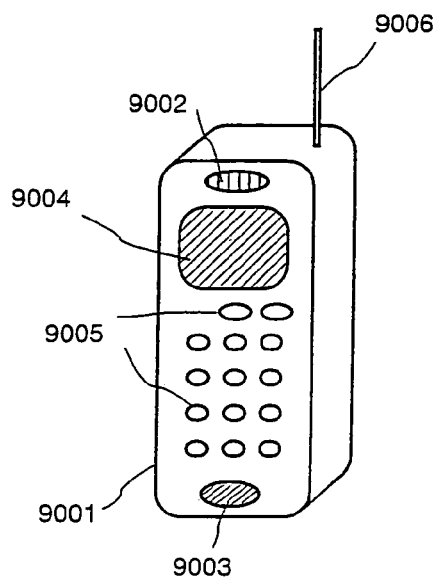
FIGS. 24A to 24F are schematic views each showing an example of a semiconductor device.

FIG. 24A shows a mobile phone, which includes the body 9001, a sound output unit 9002, a sound input unit 9003, display device 9004, an operating switch 9005, an antenna 9006. The present invention can be applied to the sound output unit 9002, a sound input unit 9003 and a display device 9004 equipped an active matrix substrate.

Figure 24B:
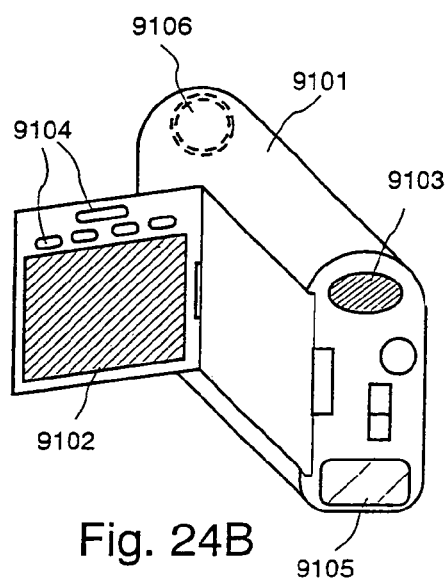

FIG. 24B shows a video camera, which includes the body 9101, a display unit 9102, a sound input unit 9103, operating switches 9104, a battery 9105, and an image receiving unit 9106. The present invention can be applied to the sound input unit 9103, a display device 9102 equipped an active matrix substrate and a an image receiving unit 9106.

Figure 24C:
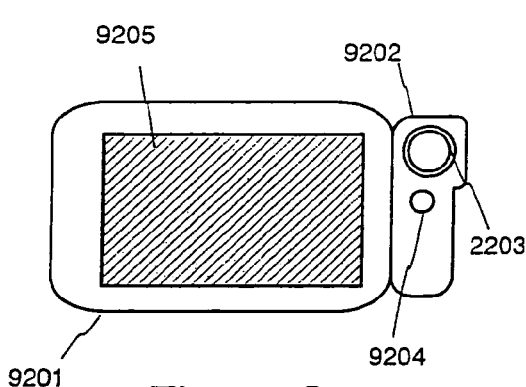

FIG. 24C shows a mobile computer, or a portable information terminal which includes the body 9201, camera unit 9202, an image receiving unit 9203, an operating switch 9204, a display unit 9205. The present invention can be applied to the image receiving unit 9203 and a display device 9205 equipped an active matrix substrate.

Figure 24D:
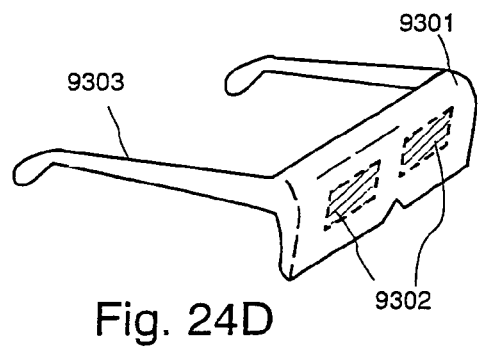

FIG. 24D shows a head mounted display, which includes the body 9301, a display device 9302, arm portion 9303. The present invention can be applied to the display device 9302, and used other signal control circuit although it is not shown in figures.

Figure 24E:
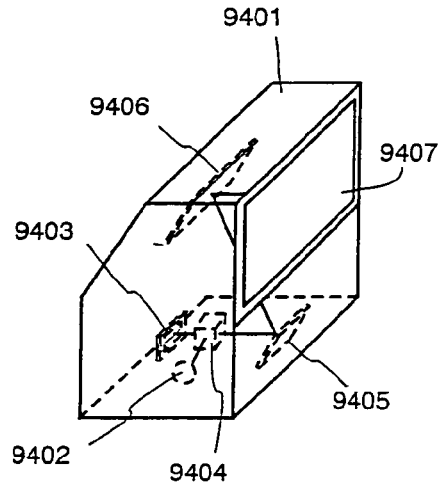

FIG. 24E shows a rear type projector, which includes the body 9401, an optical light source 9402, display unit 9403, a deflection beam splitter 9404, reflectors 9405, 9406, and a screen 9407. The present invention can be applied to the display unit 9403.

Figure 24F:
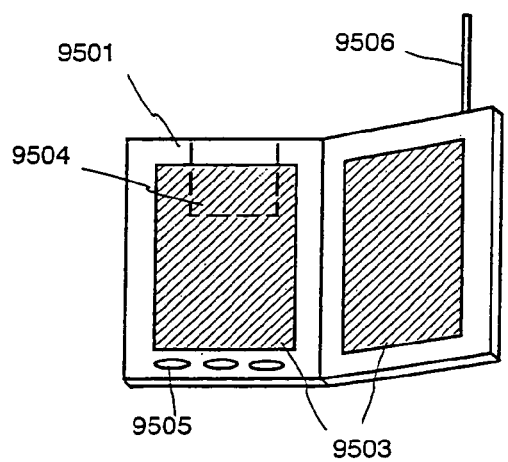

FIG. 24F shows a portable book, which includes the body 9501, display units 9502, 9503, the record medium 9504, an operating switch 9505 and an antenna 9506. This book displays a data recorded in mini disc (MD) and DVD, and a data received by an antenna. The display device 9502 and 9503 are direct view type, and the present invention can be applied these display devices.

Figure 25A:
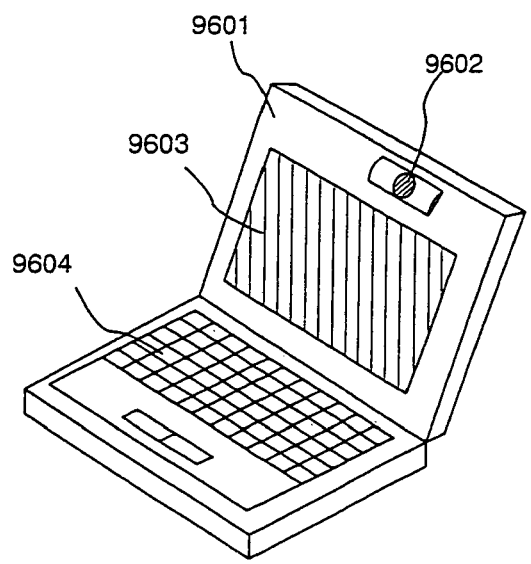
FIG. 25A to 25C are schematic views each showing an example of a semiconductor device.

FIG. 25A shows a personal computer, which includes the body 9601, an image receiving unit 9602, a display device 9603 and a keyboard 9604. The display device 9603 are direct view type, and the present invention can be applied this display devices.

Figure 25B:
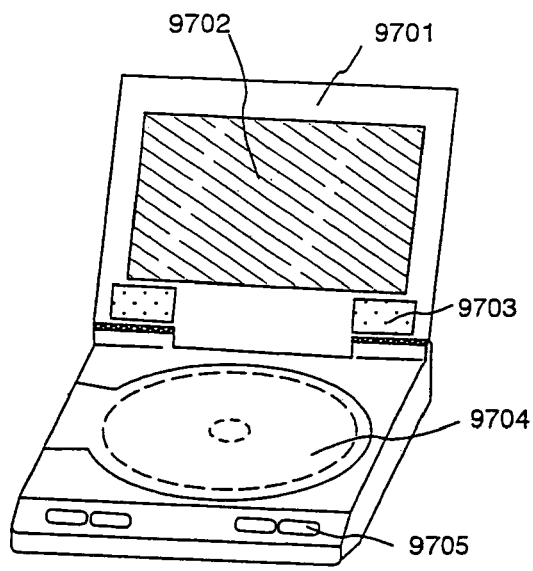

FIG. 25B shows a player using recording medium (herein after described as a recording medium) recorded a program, which includes the body 9701, the display unit 9702, the speaker unit 9703, the record medium 9704, the operating switches 9705. This equipment can be realized music appreciation, movie appreciation, playing game and Internet by using the DVD, CD etc. as a recording medium.

Figure 25C:
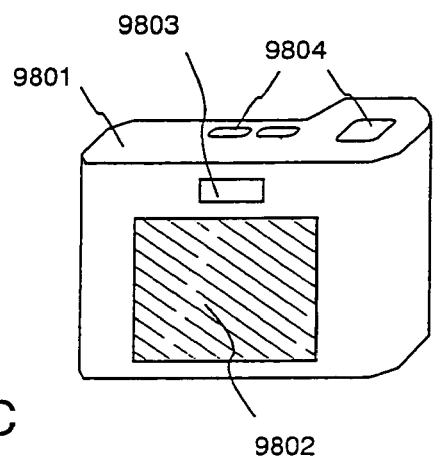

FIG. 25C shows a digital camera, which includes the body 9801, display unit 9802, a view finder 9803, the display device 9802, an operating switch 9804 and an image receiving unit (not shown).

FIG. 26A shows a front type projector, which includes the display unit 3601, and a screen 3602. The present invention can be applied to the display unit and other signal controlling circuit.

FIG. 26B shows a rear type projector, which includes the body 3701, the display unit 3702, a mirror 3703 and a screen 3704. The present invention can be applied to the display unit and other signal controlling circuit.

Illustrated in FIG. 26C is an example of the structure of the projection units 3601 and 3702 that ate shown in FIGS. 26A and 26B, respectively. Each of the projection units 3601 and 3702 is comprised of a light source optical system 3801, mirrors 3802 and 3804 to 3806, dichroic mirrors 3803, a prism 3807, liquid crystal display devices 3808, phase difference plates 3809, and a projection optical system 3810. The projection optical system 3810 is constructed of an optical system including projection lenses. An example of a three plate system is shown in embodiment 8, but there are no special limitations. For instance, an optical system of single plate system is acceptable. Further, the operator may suitably set optical systems such as optical lenses, polarizing film, film to regulate the phase difference, IR film, within the optical path shown by the arrows in FIG. 26C.

In addition, FIG. 26D shows an example of the structure of the light source optical system 3801 of FIG. 26C. In this embodiment, the light source optical system 3801 is composed of a reflector 3811, a light source 3812, lens arrays 3813 and 3814, a polarizing conversion element 3815, and a condenser lens 3816. Note that the light source optical system shown in FIG. 26D is an example, and it is not limited to the illustrated structure. For examples the operator may suitably set optical systems such as optical lenses, polarizing film, film to regulate the phase difference, and IR film.

Further the present invention is possible to apply to an image sensor and EL type display element. As described above, the present invention has very wide applications and is applicable to electronic equipment in all fields.

The gate insulating film of a TFT is formed of an insulating film in which a silicon oxynitride film (A) and a silicon oxynitride film (B) having different manufactural conditions and different compositions are stacked, or whose composition is continuously changed from the composition of the silicon oxynitride film (A) to that of the silicon oxynitride film (B), whereby the thermal stability of the TFT can be enhanced, and the deterioration thereof ascribable to a bias stress can be prevented.

What is claimed is:

1. A semiconductor device comprising:
    a semiconductor layer formed over a substrate, the semiconductor layer including at least a channel region, and source and drain regions;
    a gate electrode located over the channel region of the semiconductor layer;
    at least first and second insulating films, each comprising silicon oxynitride interposed between the gate electrode and the channel region of the semiconductor layer; and
    a third insulating film formed over the semiconductor layer, the first and second insulating films and the gate electrode;
    wherein the second insulating film has a different composition from the first insulating film and is formed over the first insulating film,
    wherein the gate electrode comprises at least a first layer and a second layer,
    wherein the third insulating film is in contact with a part of the first insulating film, and
    wherein the gate electrode has at least a tapered portion.

2. A semiconductor device according to claim 1,
    wherein the first insulating film comprises silicon oxynitride having hydrogen concentration from 1.5 to 5 atomic %, nitrogen concentration from 2 to 15 atomic %, and oxygen concentration from 50 to 60 atomic %.

3. A semiconductor device according to claim 1,
    wherein the second insulating film comprises silicon oxynitride having hydrogen concentration from 0.1 to 2 atomic %, nitrogen concentration from 0.1 to 2 atomic %, and oxygen concentration from 60 to 65 atomic %.

4. A semiconductor device according to claim 1,
    wherein the third insulating film comprises a material selected from the group consisting of silicon oxide, silicon nitride, silicon oxynitride and a laminate thereof.

5. A semiconductor device according to claim 1,
    wherein the semiconductor layer has at least one lightly doped region formed between the channel region and the drain region.

6. A semiconductor device according to claim 1,
    wherein the gate electrode overlaps the semiconductor layer having at least one lightly doped region.

7. A semiconductor device according to claim 1,
    wherein the tapered portion overlaps at least one lightly doped region with the first and second insulating films interposed therebetween.

8. A semiconductor device according to claim 1,
    wherein the third insulating film is in contact with the gate electrode.

9. A semiconductor device according to claim 1, wherein the semiconductor device is one selected from the group consisting of a mobile phone, a video camera, an information processing terminal, a head-mount display, a projector, a personal computer, a DVD player, and a digital camera.

10. A semiconductor device according to claim 1, wherein the semiconductor device is an EL display device.

11. A semiconductor device comprising:

a semiconductor layer formed over a substrate, the semiconductor layer including at least a channel region, and source and drain regions;

a gate electrode located over the channel region of the semiconductor layer;

at least first and second insulating films, each comprising silicon oxynitride interposed between the gate electrode and the channel region of the semiconductor layer; and a third insulating film formed over the semiconductor layer, the first and second insulating films and the gate electrode;

wherein the first insulating film comprises silicon oxynitride having hydrogen concentration from 1.5 to 5 atomic %, nitrogen concentration from 2 to 15 atomic %, and oxygen concentration from 50 to 60 atomic %, wherein the second insulating film comprises silicon oxynitride having hydrogen concentration from 0.1 to 2 atomic %, nitrogen concentration from 0.1 to 2 atomic %, and oxygen concentration from 60 to 65 atomic %, and wherein the third insulating film is in contact with a part of the first insulating film wherein the gate electrode has at least a first layer and a second layer.

12. A semiconductor device according to claim 11, wherein the third insulating film comprises a material selected from the group consisting of silicon oxide, silicon nitride, silicon oxynitride and a laminate thereof.

13. A semiconductor device according to claim 11, wherein the semiconductor layer has at least one lightly doped region formed between the channel region and the drain region.

14. A semiconductor device according to claim 11, wherein the gate electrode overlaps the semiconductor layer having at least one lightly doped region.

15. A semiconductor device according to claim 11, wherein the gate electrode has at least a tapered portion, the tapered portion overlaps at least one lightly doped region with the first and second insulating films interposed therebetween.

16. A semiconductor device according to claim 11, wherein the third insulating film is in contact with the gate electrode.

17. A semiconductor device according to claim 11, wherein the semiconductor device is one selected from the group consisting of a mobile phone, a video camera, an information processing terminal, a head-mount display, a projector, a personal computer, a DVD player, and a digital camera.

18. A semiconductor device according to claim 11, wherein the semiconductor device is an EL display device.

* * * * *